(12) United States Patent
Ooishi

(10) Patent No.: US 6,272,056 B1
(45) Date of Patent: Aug. 7, 2001

(54) SEMICONDUCTOR MEMORY DEVICE CAPABLE OF IMPLEMENTING REDUNDANCY-BASED REPAIR EFFICIENTLY IN RELATION TO LAYOUT AND OPERATING SPEED AND SEMICONDUCTOR INTEGRATED CIRCUIT DEVICE HAVING SUCH SEMICONDUCTOR MEMORY DEVICE

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/401,502

(22) Filed: Sep. 22, 1999

(30) Foreign Application Priority Data

Mar. 30, 1999 (JP) ................................. 11-088836

(51) Int. Cl.$^7$ ....................................... G11C 7/00
(52) U.S. Cl. .................... 365/200; 365/233; 365/230.03; 365/230.08
(58) Field of Search .................................. 365/200, 233, 365/230.03, 230.08

(56) References Cited

U.S. PATENT DOCUMENTS

| | | | |
|---|---|---|---|
| 4,392,211 | * | 7/1983 | Nakano et al. ................. 365/200 |
| 5,278,839 | * | 1/1994 | Matsumoto et al. ............. 714/710 |
| 5,307,316 | * | 4/1994 | Takemae ....................... 365/200 |
| 6,064,609 | * | 5/2000 | Jung et al. .................... 365/200 |
| 6,064,625 | * | 5/2000 | Tomita ......................... 365/233 |
| 6,067,260 | * | 5/2000 | Ooishi et al. .................. 365/200 |
| 6,075,732 | * | 6/2000 | Ooishi et al. .................. 365/200 |

OTHER PUBLICATIONS

"Trends in Development and Art, Application, and Future Movement of Mass Storage DRAM—Logic—Embedded dRAMASIC", by Kenji Numata, Apr. 16, 1998, pp. 1–19, (with partial English translation).

* cited by examiner

Primary Examiner—David Nelms
Assistant Examiner—Gene N. Auduong
(74) Attorney, Agent, or Firm—McDermott, Will & Emery

(57) ABSTRACT

A memory cell array is divided into a plurality of banks. Each bank includes a redundant row circuit and a redundant column circuit for repairing any defective column. Data lines are separately provided to a normal memory cell array, the redundant row circuit, and the redundant column circuit. Redundancy-based column repair is performed by selectively changing connection between each data input/output line and a global data bus. Prior to the timing at which a clock signal is activated, access signals such as a command signal and an address signal are transmitted to a command decode circuit, a predecode circuit and a redundancy control circuit to perform a predecoding operation and redundancy judgement.

15 Claims, 44 Drawing Sheets

EACH BIT SIGNAL OF CSFT (16 BITS)

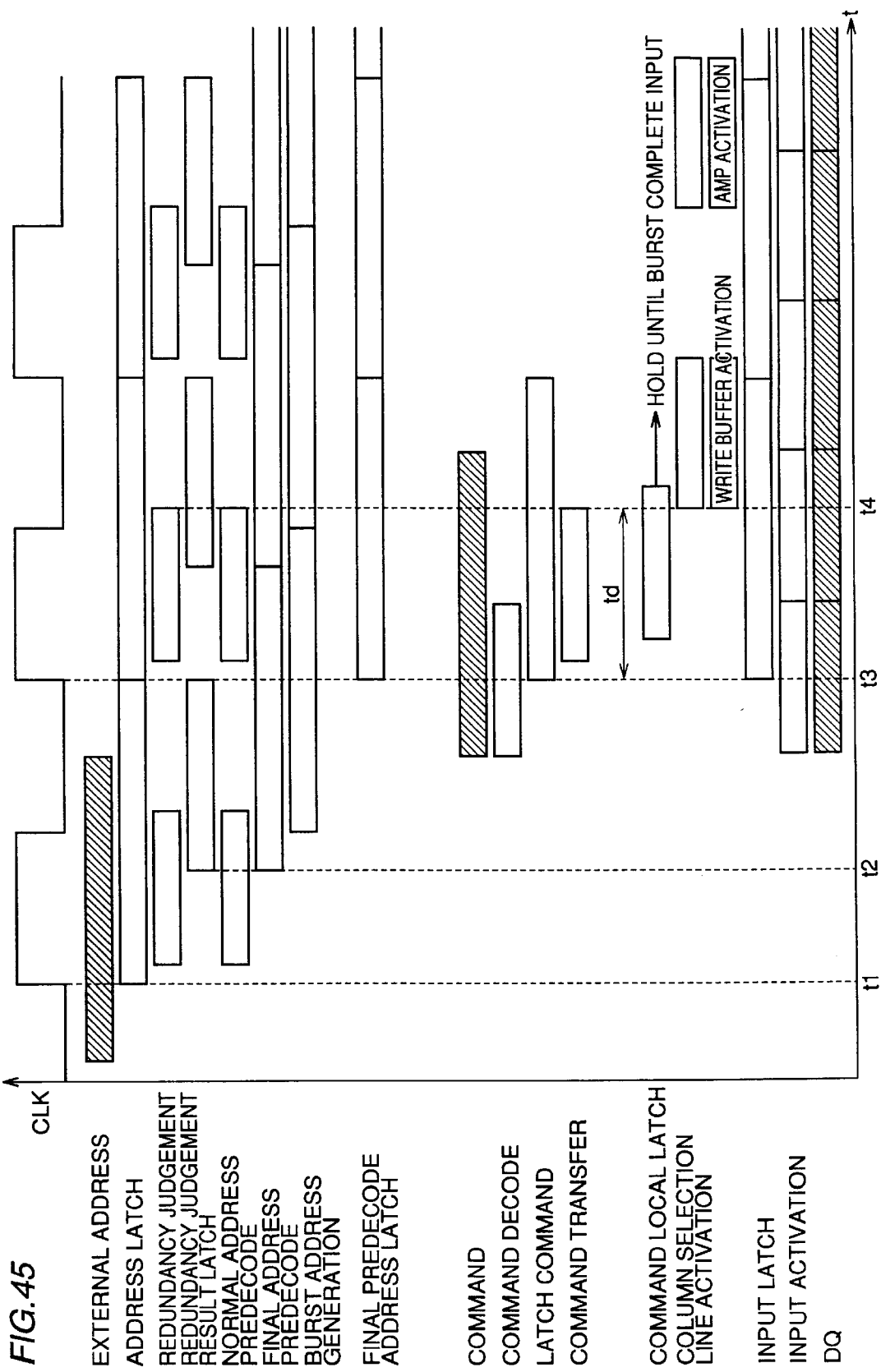

SEMICONDUCTOR MEMORY DEVICE CAPABLE OF IMPLEMENTING REDUNDANCY-BASED REPAIR EFFICIENTLY IN RELATION TO LAYOUT AND OPERATING SPEED AND SEMICONDUCTOR INTEGRATED CIRCUIT DEVICE HAVING SUCH SEMICONDUCTOR MEMORY DEVICE

BACKGROUND OF THE INVENTION

1. Field of the Invention

The present invention relates to a semiconductor memory device and a semiconductor integrated circuit device employing the semiconductor memory device. In particular, the invention relates to a semiconductor memory device capable of implementing efficient redundancy-based repair when any defect occurs in a memory cell, and to a semiconductor integrated circuit device employing such a semiconductor memory device.

2. Description of the Background Art

As a semiconductor memory device capable of processing a large amount of data at a high speed, a memory chip is now being developed having a logic circuit and a DRAM (Dynamic Random Access Memory) both mounted on one chip (hereinafter referred to as "embedded DRAM"). While data is conventionally transferred between a logic circuit represented by a processor (MPU) and a memory portion represented by the DRAM via an I/O pin and a data bus, the embedded DRAM aims to enhance data transfer rate (access speed and memory band width) between its processor and DRAM by transferring data via a memory bus mounted on the memory chip.

Concerning a semiconductor memory device having a large scale memory cell array, a redundancy-based repair scheme is important in order to enhance yield in manufacture. By the redundancy-based repair (hereinafter referred to simply as redundancy repair), a defective portion of a memory cell generated in manufacture is repaired using a spare memory cell in a redundant circuit that is preliminary mounted on the same chip.

Although the data transfer rate between the logic portion and the memory portion can be improved in the embedded DRAM, the logic circuit and the memory circuit mounted on the same chip considerably limit the layout, and thus it is an object of the embedded DRAMI to enhance the degree of integration relative to both of the circuits.

A fuse element is used for programming a defective address in the redundancy repair scheme. The fuse element occupies a relatively large area which is inappropriate for enhancement of integration, and thus significantly influences the layout design. If the same redundant circuit is shared by a plurality of banks for reducing the number of fuse elements, a large number of switching circuits are required for transferring data between data I/O lines and the redundant circuit in input and output of data, leading to limitation of layout.

In order to achieve an object of reducing the layout area, which is one of the important objects for the embedded DRAM, it is highly important to efficiently arrange a redundant circuit.

For execution of the redundancy repair, a redundancy judgement is first made by comparing an input address signal with a defective address stored in a fuse element and determining if they match with each other. An actual access operation is then carried out by determining an address to which an access is to be made. Accordingly, an additional cycle is required for the redundancy judgement each time the access operation is done. In the embedded DRAM aiming to achieve enhanced-speed data processing, it is important to make the redundancy judgement more efficiently in relation to the timing to reduce the time necessary for the judgement and thus improve the operating speed.

SUMMARY OF THE INVENTION

An object of the present invention is to provide a semiconductor memory device such as an embedded DRAM having a large scale memory cell array, in which redundancy-based repair can be implemented efficiently in relation to layout and operating speed when any defect occurs in a memory cell.

The present invention is generally related to a semiconductor integrated circuit device including a logic circuit and a memory circuit.

The logic circuit generates a clock signal, an address signal and a command signal to transmit and receive a data signal.

The memory circuit performs a reading operation and a writing operation for the data signal in response to activation of the command signal according to the address signal, and includes a memory cell array having a plurality of normal memory cells arranged in rows and columns, a redundant circuit for replacing a normal memory cell having a defect, and an address decode circuit receiving the address signal and generating an address decode signal for selectively activating one of rows and one of columns of the normal memory cells corresponding to the address signal in response to activation of the clock signal.

The memory circuit further includes a redundancy control circuit receiving the address signal in response to activation of the clock signal to make a redundancy judgement and issue an instruction for effecting a redundancy-based repair operation when the address signal is associated with an address of the defective normal memory cell, a redundant decode circuit in response to result of the redundancy judgement for performing the redundancy-based repair operation, and an address latch circuit receiving and latching the address signal transmitted from the logic circuit in response to preceding activation of the clock signal before the command signal is activated, and transmitting the address signal to the address decode circuit and the redundancy control circuit.

A semiconductor memory device according to another aspect of the invention operates in synchronization with a clock signal to transmit and receive a data signal in response to an address signal and a command signal. The semiconductor memory device includes an input terminal, a mode decode circuit, an address latch circuit, a memory cell array, a redundant circuit, a redundancy control circuit, an address decode circuit, a redundant decode circuit, and a drive circuit.

The input terminal receives the clock signal, the address signal, the command signal, and an address mode signal for designating a timing at which the address signal is entered (hereinafter referred to as "enter timing"). The mode decode circuit defines the enter timing of the address signal as either one of a first address mode and a second address mode in response to the address mode signal. The address latch circuit receives and latches the address signal from the input terminal at an activation timing of the clock signal if the first address mode is designated, and receives and latches the address signal from the input terminal at the activation timing of the clock signal while the command signal is activated if the second address mode is designated. The memory cell array includes a plurality of normal memory cells arranged in rows and columns. The redundant circuit includes a plurality of spare memory cell rows and spare memory cell columns for replacing a normal memory cell having a defect. The redundancy control circuit receives the address signal transmitted from the address latch circuit to make a redundancy judgement, and issues an instruction for effecting a redundancy repair operation if the address signal corresponds to an address of the defective normal memory cell. The address decode circuit generates an address decode signal for selectively activating one of rows of the normal memory cells and one of columns of the normal memory cells in response to the address signal transmitted from the address latch circuit. The redundant decode circuit selectively activates one of spare memory cell rows and spare memory cell columns in response to activation of the clock signal if the redundancy repair operation is carried out. The drive circuit selectively activates one of rows and one of columns of the normal memory cells corresponding to the address decode signal in response to the activation of the clock signal.

A semiconductor memory device according to still another aspect of the invention operates synchronously with a clock signal to read or write a data signal in response to a row address signal and a column address signal. The semiconductor memory device includes a memory cell array having normal memory cells arranged in rows and columns. The memory cell array is divided into a plurality of memory cell blocks arranged in a first number of rows and a second number of columns. The semiconductor memory device further includes a redundant circuit, a third number of global data buses, a plurality of data I/O lines, a redundancy control circuit, and a data line connection circuit.

The redundant circuit has spare memory cell rows and spare memory cell columns for replacing a normal memory cell having a defect. The redundant circuit includes a plurality of spare column circuits each provided in common to the second number of memory cell blocks adjacent to each other in the direction of rows. The spare column circuit has a plurality of spare memory cells arranged in rows and columns. The third number of global data buses and the plurality of data I/O lines are provided for transmitting a data signal. The plurality of data I/O lines has the third number of normal data I/O lines provided to each memory cell block group consisting of the first number of memory cell blocks adjacent to each other in the direction of columns, and each normal data input/output line is provided to a fourth number of columns of the normal memory cells. The plurality of data I/O lines further has a plurality of spare column data I/O lines provided commonly to the spare column circuits, each of the spare column data I/O lines being provided for the fourth number of columns of the spare memory cells. The redundancy control circuit receives an address signal to make a redundancy judgement, and issues an instruction for effecting a redundancy repair operation if the address signal corresponds to an address of a normal memory cell having a defect. The data line connection circuit selectively connects, if the redundancy control circuit issues the instruction for effecting the redundancy repair operation, the third number of data I/O lines selected from the plurality of data I/O lines to the third number of global data buses respectively.

An advantage of the invention is accordingly in that the operating speed of the semiconductor integrated circuit device can be enhanced since, if the command signal is activated, the address signal is entered earlier than the activation timing of the clock signal to make a judgement by the redundancy control circuit about whether or not the redundancy repair operation is necessary.

Further, the operating speed of the semiconductor memory device can be improved, since the timing at which the address signal is entered can be designated by the address mode signal, and in the first address mode, the address signal is entered at each activation timing of the clock signal regardless of activation of the command signal to make the redundancy repair judgement.

In addition, the layout of the spare column circuit in the semiconductor memory device can efficiently be designed since setting of the data line connection circuit can dynamically be changed for each defective column address, the spare column circuit is shared by a plurality of memory cell blocks, and redundancy-based column repair is performed for each data input/output line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 45 is a timing chart illustrating a column address processing in a writing operation in the address pre-entrance mode.

DESCRIPTION OF THE PREFERRED EMBODIMENTS

Figure 1:
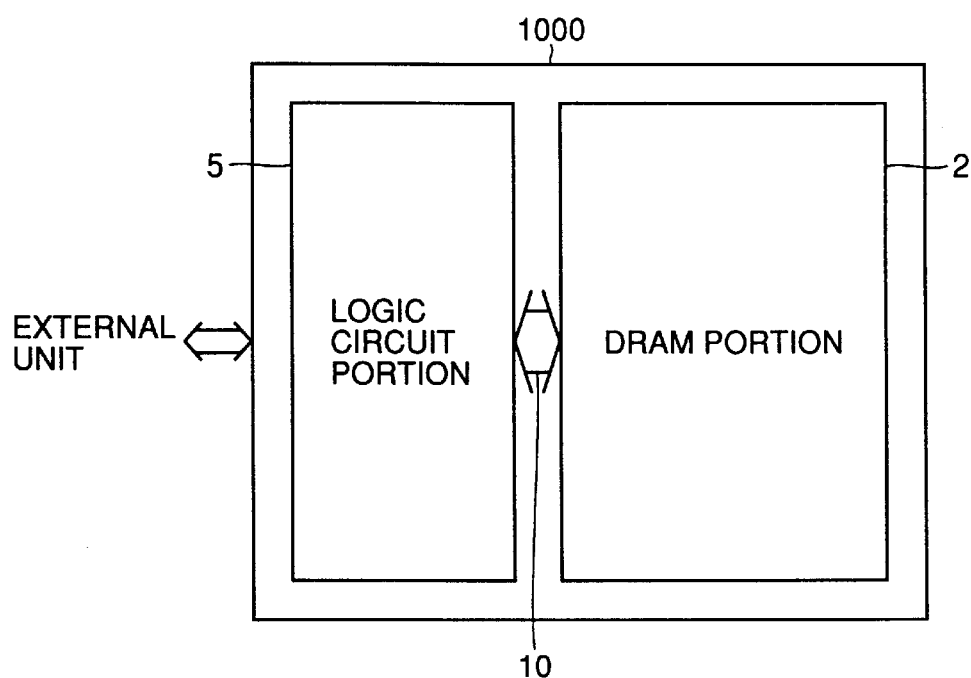
FIG. 1 is a schematic block diagram illustrating an entire structure of a semiconductor integrated circuit device 1000 in the first embodiment of the invention.

Embodiments of the present invention are now described in detail with reference to the drawings. In the drawings, like reference characters indicate like or corresponding components.

First Embodiment

FIG. 1 is a schematic block diagram illustrating an entire structure of a semiconductor integrated circuit device 1000 in the first embodiment of the invention. According to the first embodiment, efficient redundancy-based repair in an embedded DRAM is described.

Referring to FIG. 1, semiconductor integrated circuit device 1000 includes a logic circuit portion 5, a DRAM portion 2, and an input/output port 10 for communicating signals therebetween to implement an embedded DRAM configuration.

Figure 2:
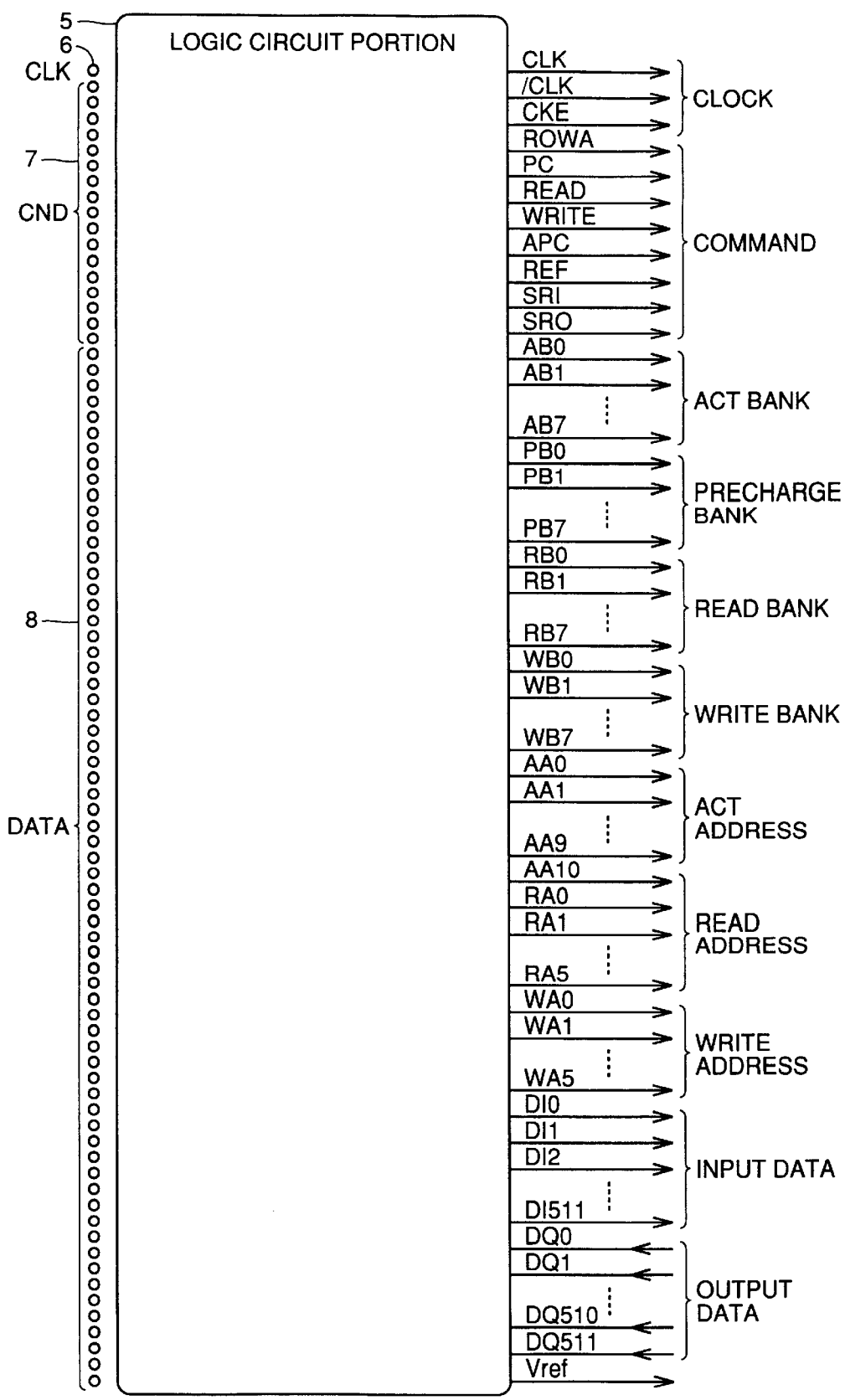
FIG. 2 is a block diagram illustrating a structure of a logic circuit portion 5 of semiconductor integrated circuit device 1000.

FIG. 2 is a block diagram illustrating a structure of logic portion 5 of semiconductor integrated circuit device 1000.

Referring to FIG. 2, logic circuit portion 5 includes an external clock input terminal 6, an external command input terminal 7, and an external data input terminal 8. A clock signal is externally supplied to external clock input terminal 6. A command signal for instructing semiconductor integrated circuit device 1000 to operate is externally supplied to external command input terminal 7. External data terminal 8 is placed for transmitting and receiving input/output data signals to and from any external unit.

Logic circuit portion 5 issues, synchronously with an externally supplied clock signal, an instruction for effecting data input/output to/from DRAM portion 2 based on an external command signal and an external data signal.

Logic circuit portion 5 outputs to input/output port 10 a control signal to cause DRAM portion 2 to perform a predetermined operation, an address signal, and a data signal. These signals are hereinafter referred to generally as access signals depending on the cases. A timing at which the access signals are entered in the DRAM is referred to as an access mode. With regard to semiconductor integrated circuit device 1000 in the first embodiment, two modes, a clock synchronous enter mode and a direct enter mode are described later in this description.

Figure 3:
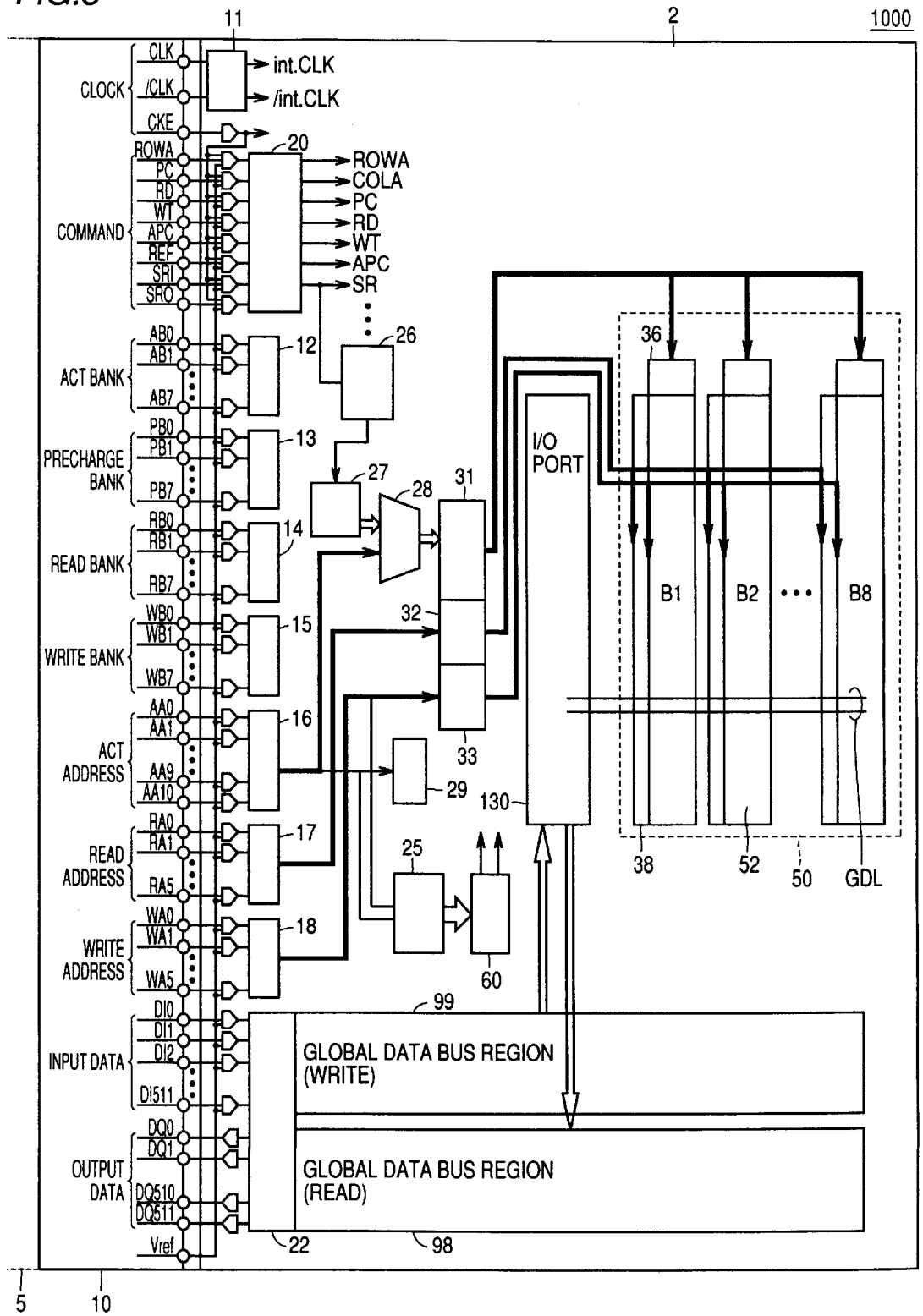
FIG. 3 is a block diagram illustrating a structure of an input/output port 10 and a DRAM portion 2 of semiconductor integrated circuit device 1000.

FIG. 3 is a block diagram illustrating a structure of input/output port 10 and DRAM portion 2 of semiconductor integrated circuit device 1000.

Referring to FIG. 3, input/output port 10 receives from logic circuit portion 5, a command signal, an ACT bank signal, a precharge bank signal, a read bank signal, a write bank signal, an ACT address signal, a read address signal, a write address signal, an input data signal, and reference potential Vref. An output data signal is supplied to input/output port 10 from DRAM portion 2.

The command signal is a control signal for allowing DRAM portion 2 to perform a predetermined operation based on the externally supplied command signal.

The command signal includes an ROWA signal for giving an instruction for activating a word line, a PC signal resetting the word line to give an instruction for effecting a precharge operation, an RD signal activating a column-related reading operation, a WT signal activating a column-related writing operation, an APC signal for instructing all banks to perform the precharge operation, and an REF signal for giving an instruction for starting a self refresh mode operation. Vref is a signal based on which whether an input signal is at a logical high (H) level or a logical low (L) level is determined.

The ACT bank signal is a signal for designating a bank where a row-related operation is to be activated, among a plurality of banks in DRAM portion 2. The precharge bank signal is given for selecting a bank where the precharge operation is performed. The read bank signal is given for selecting a bank having a memory cell where a reading operation is performed in DRAM portion 2. The write bank signal is used for selecting a bank which has a memory cell where a writing operation is performed in DRAM portion 2.

The ACT address signal is used for selectively activating a row of memory cells in data reading/writing operation and refresh operation. The read address signal is used for activating a memory cell column having a memory cell where a reading operation is performed. The write address signal is used for activating a memory cell column having a memory cell where a writing operation is performed in DRAM portion 2.

The input data signal is a write data signal to DRAM portion 2, and the output data signal is the one read from DRAM portion 2 following the instruction given by logic circuit portion 5.

DRAM portion 2 includes an internal clock signal generation circuit 11 receiving clock signals CLK and /CLK to generate internal clock signals Int.CLK and /Int.CLK, and a command decode circuit 20 receiving the command signal to generate an internal control signal.

DRAM portion 2 further includes an ACT bank signal latch circuit 12 receiving and latching the ACT bank signal, a precharge bank signal latch circuit 13 receiving and latching the precharge bank signal, a read bank signal latch circuit 14 receiving and latching the read bank signal, a write bank signal latch circuit 15 receiving and latching the write bank signal, an ACT address signal latch circuit 16 receiving and latching the ACT address signal, a read address signal latch circuit 17 receiving and latching the read address signal, and a write address signal latch circuit 18 receiving and latching the write address signal.

In addition, DRAM portion 2 includes a mode register 29 holding information on a predetermined operation mode, for example, information on the burst length according to a combination of the address signal and the command signal supplied to input/output port 10, a self refresh timer 26 starting its operation when a self refresh mode is designated by activation of signal SR to give an instruction for activating a word line when a predetermined time has passed, that is, for starting a refresh operation, and a self refresh address counter 27 generating an address for performing the refresh operation according to the instruction from self refresh timer 26.

Self refresh address counter 27 outputs to a multiplexer 28 a row address where refresh is to be performed by the self refresh operation. Multiplexer 28 receives an output from ACT address signal latch circuit 16 and receives an output from self refresh address counter 27 to transmit an appropriate address signal to a row predecoder 31 according to the command.

DRAM portion 2 further includes the row predecode circuit 31 for predecoding the supplied address signal, a read column precdecode circuit 32, a write column predecode circuit 33. An output from each predecode circuit is transmitted to a memory cell array 50.

The address signal is also used for writing data in the mode register by a combination of some bits when the operation mode information is written into the mode register. For example, a combination of predetermined bits of the address signal designates values of a burst length, a CAS latency, and the like.

DRAM portion 2 further includes memory cell array 50. In FIG. 3, memory cell array 50 is divided into eight banks 52 (B1–B8). Row selection circuits 36 and column selection circuit 38 are provided respectively to banks.

Memory cell array 50 includes a global data line GDL extending in a column direction of memory cells commonly to all banks. Although global data line GDL is actually divided into a data line for transmitting write data and a data line for transmitting read data, the data lines are generally referred to as GDL in FIG. 3. Global data line GDL is connected to global data bus regions 98 and 99 via an I/O port 130.

In global data bus region 98, a data bus for transmitting read data is arranged while in global data bus region 99, a data bus for transmitting write data is arranged. Data transmitted to the global data bus regions is input/output to and from input/output port 10 via a data buffer circuit 22.

DRAM portion 2 further includes a redundancy programming circuit 25. Redundancy programming circuit 25 includes such an element as an electric fuse and is capable of storing data relating to a supplied defective address and to redundancy-based repair in a non-volatile manner. The defective address stored in the redundancy programming circuit is transmitted to a redundancy control circuit 60 which makes a redundancy judgement.

Such a configuration allows DRAM portion 2 to transmit and receive data between a selected memory cell and input/output port 10 based on a control signal and a data signal supplied to input/output port 10. Further, even if any defect occurs in a memory cell of the memory cell array, the defective memory cell can be replaced by the redundancy repair to ensure a normal operation.

Description on Timing at which Access Signal is Entered in DRAM

Figure 4:
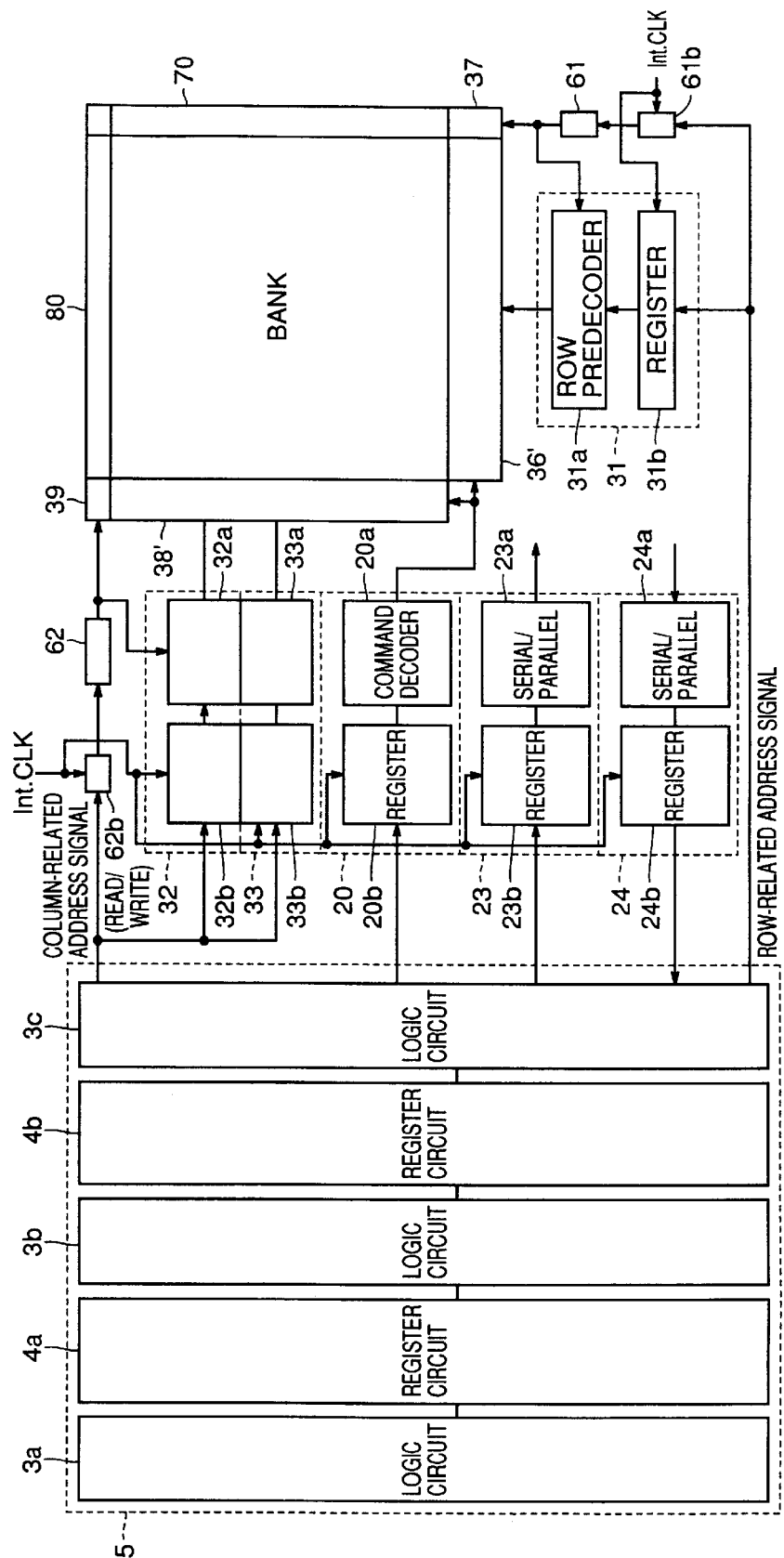
FIG. 4 is a block diagram illustrating an operation of entering an access signal in a clock synchronous enter mode of semiconductor integrated circuit device 1000.

FIG. 4 is a block diagram illustrating an operation of entering an access signal in the clock synchronous enter mode of semiconductor integrated circuit device 1000.

Referring to FIG. 4, logic circuit portion 5 includes alternately arranged logic circuits 3a, 3b and 3c, and register circuits 4a and 4b. In logic circuit portion 5, outputs of respective logic circuits 3a and 3b are transmitted to logic circuits respectively in the following stages via respective register circuits operating based on a clock signal. Therefore, in logic circuit portion 5, processes are performed successively by the logic circuits synchronously with the clock signal. An output of logic circuit 3c in the last stage is transmitted to DRAM portion 2 via input/output port 10.

A read address signal, a read bank signal, a write address signal and a write bank signal that are column-related address signals independently set for each reading/writing operation are transmitted to read column predecode circuit 32, write column predecode circuit 33 and a column redundancy control circuit 62.

Read column predecode circuit 32 has a register circuit 32b in a stage preceding a read column predecoder 32a. The address signal and the bank signal are transmitted to read column predecoder 32a via register circuit 32b operating based on internal clock signal Int.CLK.

In write column decode circuit 33 and column redundancy control circuit 62, data is transmitted via the register circuit operating based on internal clock signal Int.CLK. Similarly in command decode circuit 20 performing command decoding based on the command signal, and row predecode circuit 31 performing row predecoding by receiving the ACT address signal and the ACT bank signal that are row-related ACT address signals, each signal is transmitted after passing through the register circuit operating based on the internal clock signal.

In the configuration shown in FIG. 4, the command signal, the address signal and the data signal issued for making an access to the DRAM from the logic circuit portion are entered to the register circuit synchronously with the internal clock signal.

Such a mode in which the access signal is entered is hereinafter referred to as clock synchronous enter mode.

As described above with reference to FIG. 3, the row selection circuit and the column selection circuit are arranged for each bank. A spare row circuit 70 for repairing a row of normal memory cells containing a defective memory cell, and a spare column circuit 80 for repairing a column of normal memory cells containing a defective memory cell are arranged on the edge of a normal memory cell array. Details are given later.

The row selection circuit includes a row decoder 36' for selecting a row of normal memory cells, and a redundant row decoder 37 for activating a redundant row in spare row circuit 70. Similarly, the column selection circuit includes a column decoder 38' for selecting a column of normal memory cells and a redundant column decoder 39 for activating a redundant column in spare column circuit 80. In FIG. 4, row decoder 36' and column decoder 38' represent those associated with eight banks.

Based on an entered address signal, a predecode operation is carried out by each predecode circuit, and a row redundancy control circuit G1 and column redundancy control circuit 62 compare the input address signal with a defective address stored in a defective address programming circuit to determine whether or not they match with each other.

Row redundancy control circuit 61 compares an input row address with a defective row address to determine whether or not they match with each other. If redundancy repair is necessary, the row redundancy control circuit generates a spare row activation signal for activating a redundant row. The spare row activation signal is transmitted to redundant row decoder 37.

If the redundancy repair operation is necessary, row redundancy control circuit 61 generates a control signal for stopping an operation of row predecoder 3 1a performing a normal predecode operation at the same time as it generates the spare row activation signal. Accordingly, if there is no instruction on the redundancy repair operation for a row, row predecoder 31a transmits a normal predecode signal based on the input ACT address signal to row decoder 36'. If an instruction on the redundancy repair operation is issued, row predecoder 31a stops generation of the predecode signal.

Based on whether or not the redundancy repair operation is required, row decoder 36' or redundant row decoder 37 activates a row of normal memory cells or spare row circuit as necessary.

The operation regarding redundancy repair is also carried out for the column selecting operation. In the column selecting operation, a writing operation and a reading operation are performed independently in each bank. Therefore, the address signal and the bank signal are transmitted independently from the logic circuit block depending on the reading operation or the writing operation. Accordingly, as the predecode circuit, a read column predecode circuit 32 and a write column predecode circuit 33 are provided separately.

In semiconductor integrated circuit device 1000, column redundancy repair is implemented by shift control based on each I/O line instead of simple replacement of a column address. Therefore, regardless of necessity of redundancy repair, column decoder 38 and redundant column decoder 39 both operate. Details are given below.

Column redundancy control circuit 62 is provided to each bank since the reading operation and the writing operation are not simultaneously performed in the same bank.

Data buffer circuit 22 described referring to FIG. 3 includes an input data buffer circuit 23 processing a write data signal and an output data buffer circuit 24 processing a read data signal.

Figure 5:
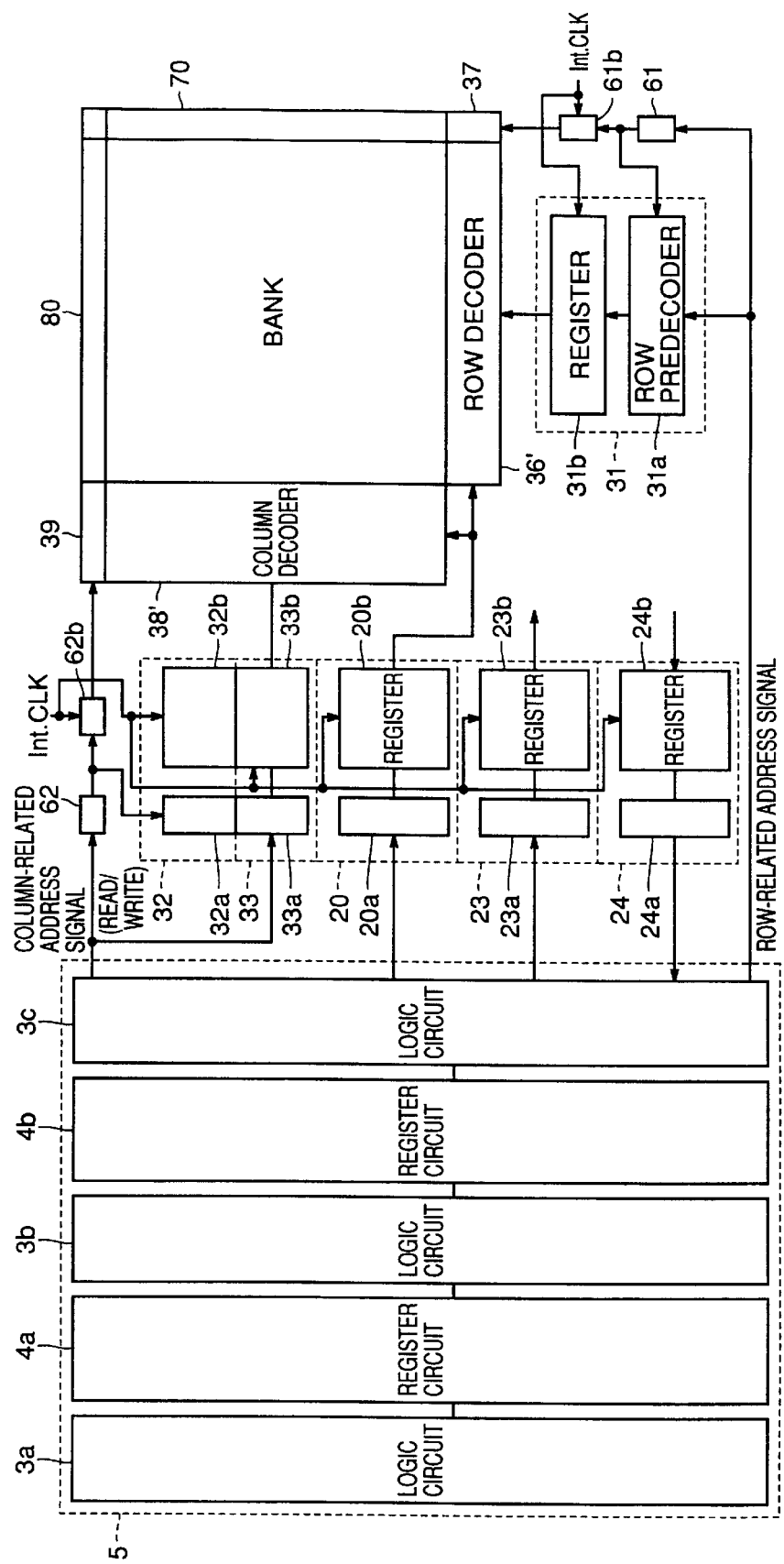
FIG. 5 is a block diagram illustrating an operation of entering an access signal in a direct enter mode of semiconductor integrated circuit device 1000.

FIG. 5 is a block diagram illustrating an operation of entering an access signal in the direct enter mode of semiconductor integrated circuit device 1000.

Referring to FIG. 5, a difference between the configuration shown in FIG. 5 and the one shown in FIG. 4 is that access signals from logic circuit 5 are directly entered respectively without passed through register circuits to command decoder 20a, address predecoders 32a and 33a, redundancy control circuits 61 and 62, input data buffer 23a, and output data buffer 24a included in DRAM portion 2 shown in FIG. 5.

In respective circuits, the entered access signals are transmitted synchronously with the internal clock signal to memory cells by register circuits respectively arranged in the rear stages, after a predecoding operation and a redundancy judgement operation carried out in the redundancy control circuit.

In the configuration of FIG. 5, an access signal supplied from the logic circuit portion is directly transmitted to the signal processing circuit of DRAM portion 2 without passed through the register circuit. Such a mode of entering the access signal is hereinafter referred to as direct enter mode.

In the direct enter mode, a logic circuit in the last stage of the logic circuit portion that generates the access signal and any circuit which processes the access signal in the DRAM can operate within the same clock.

As a result, compared with the clock synchronous enter mode in which the signal is processed after the access signal is entered synchronously with the clock, the number of clock cycles necessary for the access, that is, the operating time can be reduced. The direct enter mode thus enables the semiconductor memory device to operate at a higher speed.

It is noted that in the direct enter mode, if the output of the logic circuit in the last stage of the logic circuit portion generating the access signal is not constant between H level and L level, unnecessary current consumption arises in the decode circuit of the DRAM, leading to increase in power consumption of DRAM.

Either one of the clock synchronous enter mode and the direct enter mode may be employed in semiconductor integrated circuit device 1000 depending on the balance between the required operating speed and the current consumption.

Figure 6:
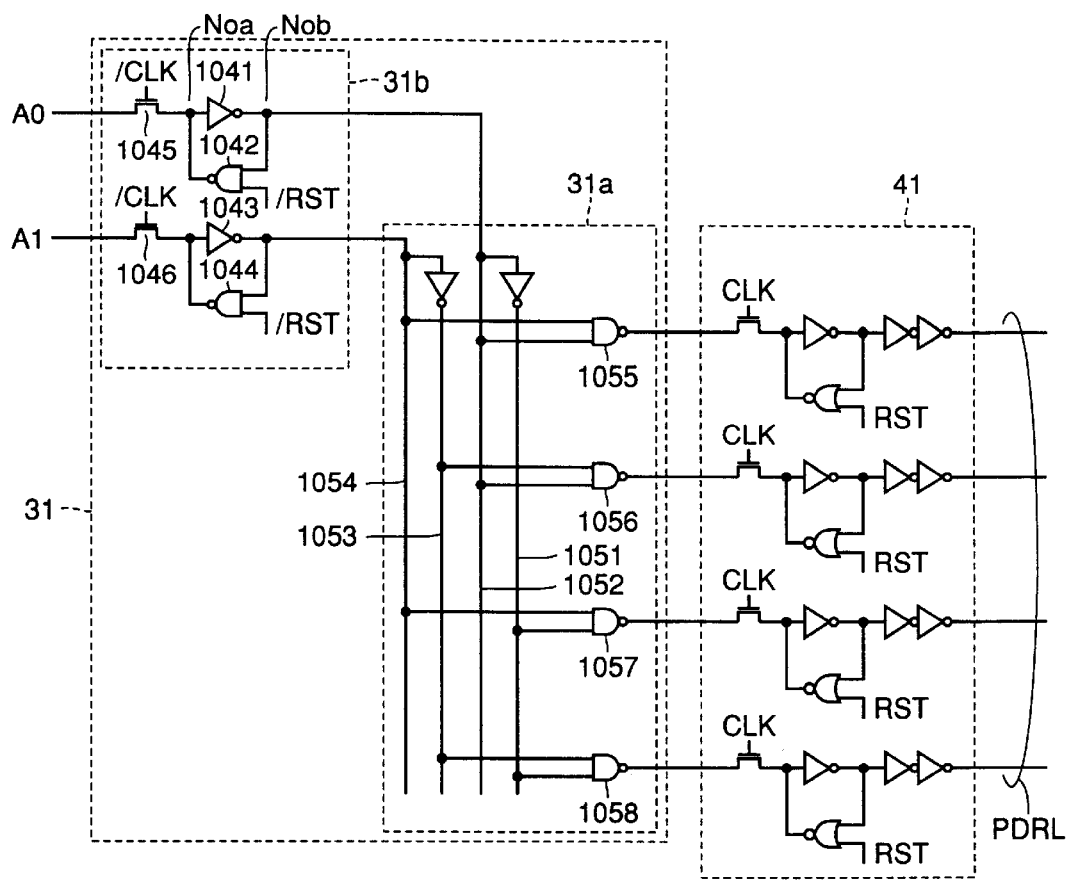
FIG. 6 is a circuit diagram specifically illustrating a structure of a row predecode circuit in the clock synchronous enter mode.

FIG. 6 is a circuit diagram showing a structure of the row predecode circuit in the clock synchronous mode.

As one example of an interface structure in the clock synchronous mode, the structure of the row address predecode circuit is illustrated in FIG. 6. FIG. 6 shows a circuit which selects activation of four row predecode lines according to two input address signals A0 and A1.

Referring to FIG. 6, row address predecode circuit 31 includes register circuit 31*b* receiving and latching address signals A0 and A1 at the timing at which inverse clock ICLK is activated, and a row predecoder 31*a* generating predecode signals based on the address signals transmitted by register circuit 31*b*.

Register circuit 31*b* includes a transistor 1045 transmitting address signal A0 to a node Noa in response to inverse clock /CLK supplied to its gate, an inverter 1041 inverting the state of node Noa and transmitting the inverted state to a node Nob, and an NAND gate 1042 receiving an output of inverter 1041 and the inverse reset signal /RST as its two inputs.

A reset signal RST is used for clearing the state of node Nob in the initial state. In response to activation (H level) of signal RST, reverse reset signal /RST falls to L level to reset the state of node Nob to H level. In the normal operation, reset signal RST is in an inactive state, so that /RST is at H level to cause NAND gate 1042 to operate as an inverter which inverts the state of node Nob and transmits the state to node Noa.

The register is thus configured by transistor 1045 to which address signal A0 is entered in response to inverse clock /CLK and two logic circuits 1041 and 1042 operating respectively as inverters. Address signal A0 is accordingly entered in response to the clock signal and latched therein to be transmitted to row address predecoder 31*a*.

Similarly, register circuit 31*b* includes a transistor 1046, an inverter 1043 and a logic gate 1044 constituting a register to which address signal A1 is entered in response to the clock signal for transmitting the address signal to row address predecoder 31*a*.

Row predecoder 31*a* includes signal interconnection lines 1051–1054 having potential levels defined according to the states of address signals A0 and A1 entered into register circuit 31*b*. Signal interconnection line 1051 transmits a potential level corresponding to the state of address signal A0, and signal interconnection line 1052 transmits a potential corresponding to the inverted state of address signal A0. Similarly, signal interconnection line 1053 transmits a potential corresponding to the state of address signal A1 and signal interconnection line 1054 transmits a potential corresponding to the inverted state of address signal A1.

Row predecoder 31*a* further includes an NAND gate 1055 having two inputs of interconnection lines 1052 and 1054, an NAND gate 1056 having two inputs of interconnection lines 1053 and 1052, an NAND gate 1057 having two inputs of interconnection lines 1051 and 1054, and an NAND gate 1058 having two inputs of interconnection lines 1051 and 1053.

According to any combination of the two address signals and signals corresponding to the inverted states of these address signals, four row predecode signals are generated from logic gates 1055–1058 respectively.

A predecode signal generated by row predecoder 31*a* is transmitted to a row predecode line PDRL by a register circuit 41 receiving and latching the predecode signal at a rising timing of clock signal CLK.

Figure 7:
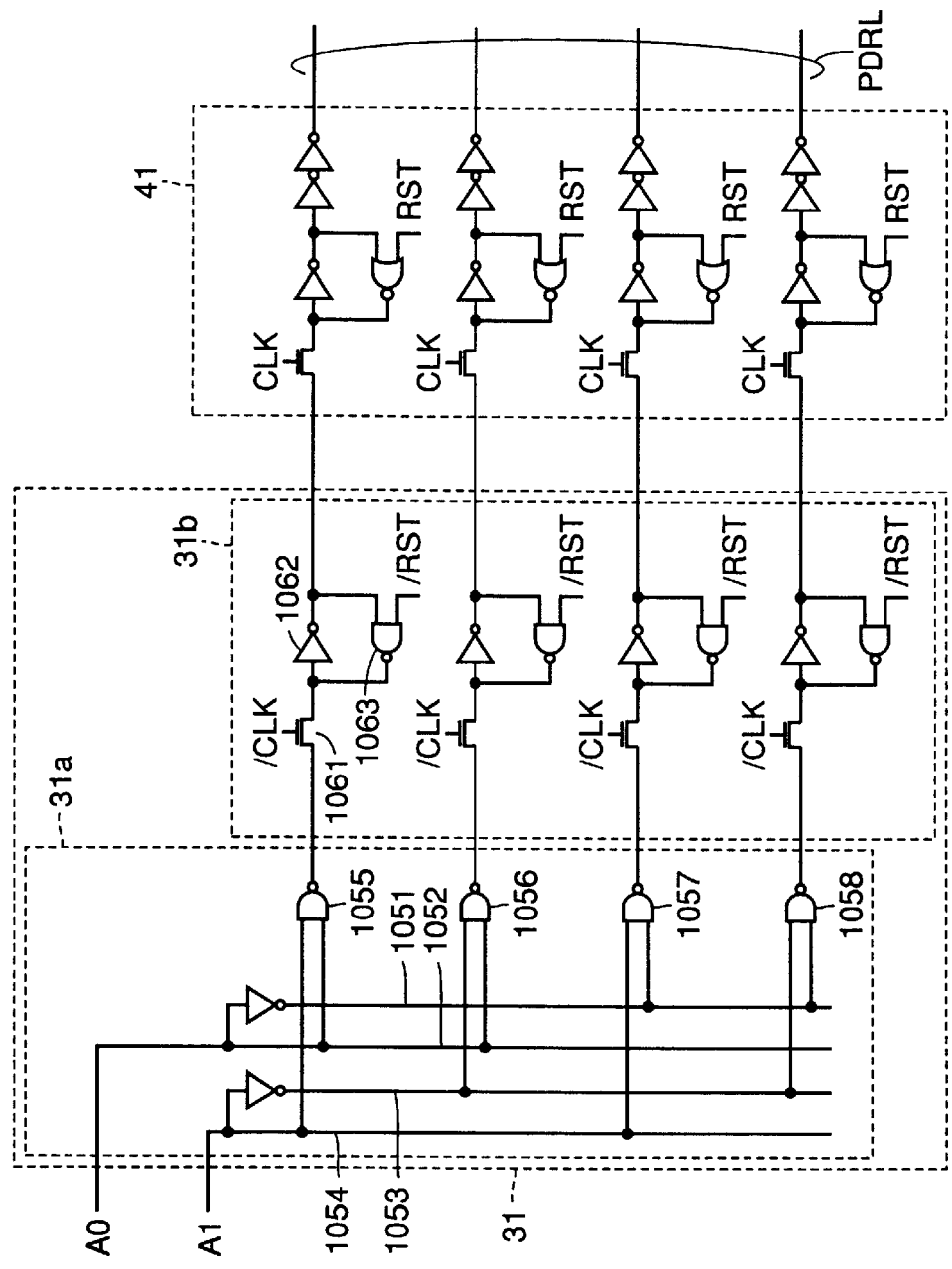
FIG. 7 is a circuit diagram illustrating one example of the structure of the row predecode circuit in the direct enter mode.

FIG. 7 is a circuit diagram illustrating one example of the structure of the row predecode circuit in the direct enter mode. FIG. 7 illustrates a circuit in which two input address signals A0 and A1 are used for selecting activation of four row predecode lines as shown in FIG. 6.

Row predecode circuit 31 in FIG. 7 includes a row predecoder 31*a* and a register circuit 31*b*. The structures of row predecoder 31*a* and register circuits 31*b* are similar to those described with reference to FIG. 6, and description thereof is not repeated here.

The difference between the structures of the row decode circuits shown respectively in FIG. 7 and FIG. 6 is that in the circuit shown in FIG. 7, address signals A0 and A1 are directly supplied to row predecoder 31*a* without passed through register circuit 31*b*.

Such a structure allows address signals A0 and A1 generated by the logic circuit in the last stage of the logic circuit portion to be transmitted to row predecoder 31*a* directly in the DRAM within the same clock, and accordingly a row predecode signal is generated. The row predecode signal is transmitted to row predecode line PDRL via register circuit 31*b* which operates in response to rising of inverse clock /CLK and a register circuit 41 which operates in synchronization with rising of clock signal CLK.

Configuration of Data Lines in Data Line Reading and Writing Operations

Figure 8:
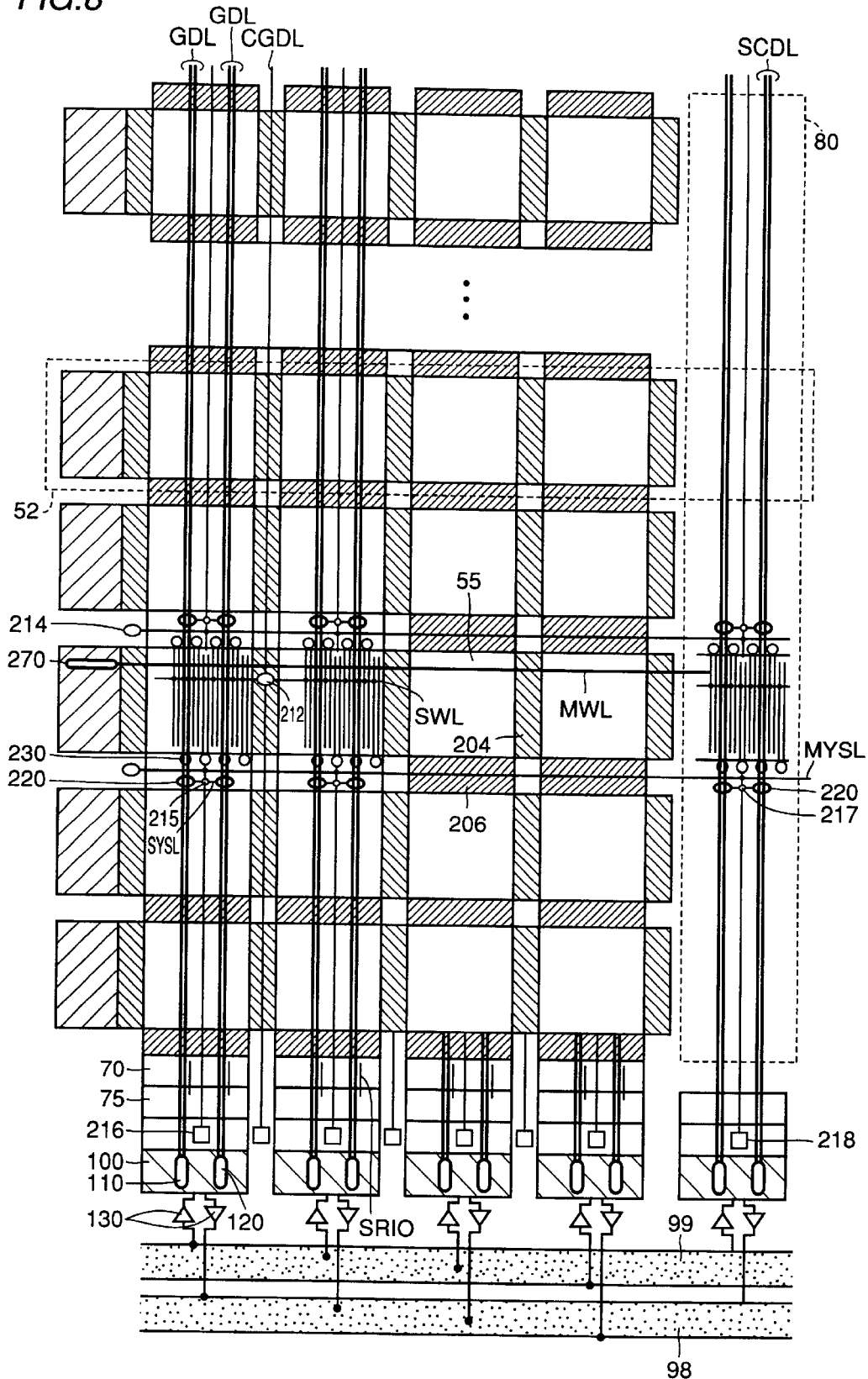
FIG. 8 is a block diagram illustrating a manner in which data lines are connected in a memory cell array 50.

FIG. 8 is a block diagram illustrating the manner in which data lines are connected in memory cell array 50 shown in FIG. 3.

Referring to FIG. 8, memory cell array 50 is divided into memory cell blocks 55 each surrounded by a sense amplifier zone 206 and a sub word driver zone 204. Memory cell array 50 can be activated such that respective memory cell blocks are separately activated.

In the first embodiment, a plurality of memory cell blocks adjacent to each other in the direction of rows constitute the same bank 52. For example, referring to FIG. 8, the memory cell array includes eight banks each having four memory cell blocks.

A main word line MWL is provided commonly to memory cell blocks belonging to the same bank group over respective memory cell blocks, and activates a sub word driver 212 which should be activated. In response to activation of sub word driver 212, a corresponding sub word line SWL is activated. A pair of bit lines BL and /BL is associated with each column of memory cells.

Data on the bit line pair is amplified by a sense amplifier circuit 230 placed in sense amplifier zone 206. Sense amplifier circuits 230 are alternately arranged with the memory cell blocks therebetween. One global data line is associated with four sense amplifier circuits. The global data line is divided into a pair of normal read data lines GRDL and /GRDL, and a pair of normal write data lines GWDL and /GWDL to allow read data and write data to be transmitted separately. However, those lines are generally referred to as a normal data line GDL in FIG. 8. Details are given below.

Spare row circuit 70 for repairing a row having any defective memory cell is arranged outside the region of the normal memory cell array. In the spare row circuit, a spare row data line SRIO for transmitting input/output data is provided associated with each global data line GDL and four sense amplifier circuits.

Spare column circuit 80 for repairing a column including any defective memory cell is also arranged outside the normal memory cell array. In the spare column circuit, a spare column data line SCDL is similarly provided associated with four sense amplifier circuits. The spare column data line is also divided into a pair of spare column read data lines SCRDL and /SCRDL and a pair of spare column write data lines SCWDL and /SCWDL to allow read data and write data to be transmitted separately. However, those lines are generally referred to as spare column data line SCDL in FIG. 8. A global data bus GDB is divided into a data bus arranged in region 98 for transmitting read data and a data bus arranged in region 99 for transmitting write data.

The normal data lines, spare column data lines and spare row data lines are connected to a data line shift circuit 75. Data line shift circuit 75 sets the manner in which respective data lines and global data bus regions 98 and 99 are connected according to the result of determination by the redundancy control circuit. According to the connection manner set by data line shift circuit 75, read/write data are communicated between each data line and global data bus regions 98 and 99 via a write driver 110 and a read amplifier 120 in peripheral circuitry 100 and I/O port 130.

Data on global data bus GDB is transmitted to the logic portion through the data buffer and the input/output port.

Specifically, memory cell array 50 has memory blocks 55 arranged in eight rows and four columns, and a group of main word drivers included in the row decoder is associated with each row. In each memory cell block, sub word driver zone 204 and sense amplifier zone 206 are provided. A segment decode line CGDL passes through the sub word driver zone along the direction of the data line. Segment decode line CGDL includes a bank selection line BSL, a selection line SL and a reset line RSL.

A row-related selecting operation is first described. In response to a row address signal, main word line MWL is selectively activated by a main word driver 270. Any corresponding sub word driver 212 is activated by main word line MWL and segment decode line SGDL, and accordingly sub word line SWL is activated to cause an access transistor connected to the selected memory cell to be conducted. Selection line SL represents four selection lines SL0–SL3. Reset line RSL similarly represents four reset lines RSL0–RSL3.

Data is accordingly output to the pair of bit lines BL and /BL associated with the selected memory cell column. At the same timing, a row redundancy control circuit compares the row address signal with a defective address signal stored in the defective address programming circuit. An instruction for activating a redundant row included in spare row circuit 70 is issued as required.

A column-related selecting operation is next described. A main YS line MYSL is first activated by a segment YS driver 214. Main YS line MYSL having four read source lines RGL0–RGL3 and four write activation lines WRL0–WRL3 is provided commonly to memory cell blocks belonging to the same bank group over respective memory cell blocks.

A sub YS line associated with main YS line is provided as a selection line which is lower in hierarchical relation. Sub YS line is activated by a sub YS driver 215, and includes sub read source lines SRGL0–SRGL3, and four sub write activation lines SWRL0–SWRL3. Sub YS line is activated by a YS segment decoder 216 for selectively activating any portion of the region corresponding to the same main YS line. In response to activation of sub YS line SYSL, a corresponding I/O gate 220 is selectively rendered active to allow one of four sense amplifier circuits to be connected to global data line GDL.

In the following discussion, read source line RGL represents read source lines RGL0–RGL3 and sub read source line SRGL represent sub read source lines SRGL0–SRGL3 in some cases as required. Similarly, write activation line WRL represents write activation lines WRL0–WRL3 and sub write activation line SWRL represents sub write activation lines SWRL0–SWRL3.

At the same timing as column selection is performed, the column address signal and the defective address are compared and judgment is made as to whether or not they match with each other in order to determine if redundancy repair is necessary or not. However, column selection in the spare column circuit is performed by spare sub YS line activated by the spare YS driver which is controlled based on spare YS decoder 218 controlled regardless of the judgement by comparison and matching and main YS line MYSL commonly provided to the normal memory cell array and the spare column circuit.

In other words, activation of spare sub YS line selectively sets a corresponding I/O gate into the active state, and accordingly one of output signals of four sense amplifiers is transmitted to the spare column data line.

The result of judgement on redundancy repair is transmitted to data line shift circuit 75 that is reflected in selection of the connecting manner for the spare column I/O line and the global data bus line. Regardless of the result of redundancy judgement concerning a programmed defective address and an input column address, the spare sub YS line is always activated, and the access speed in the reading operation can be enhanced.

Figure 9:
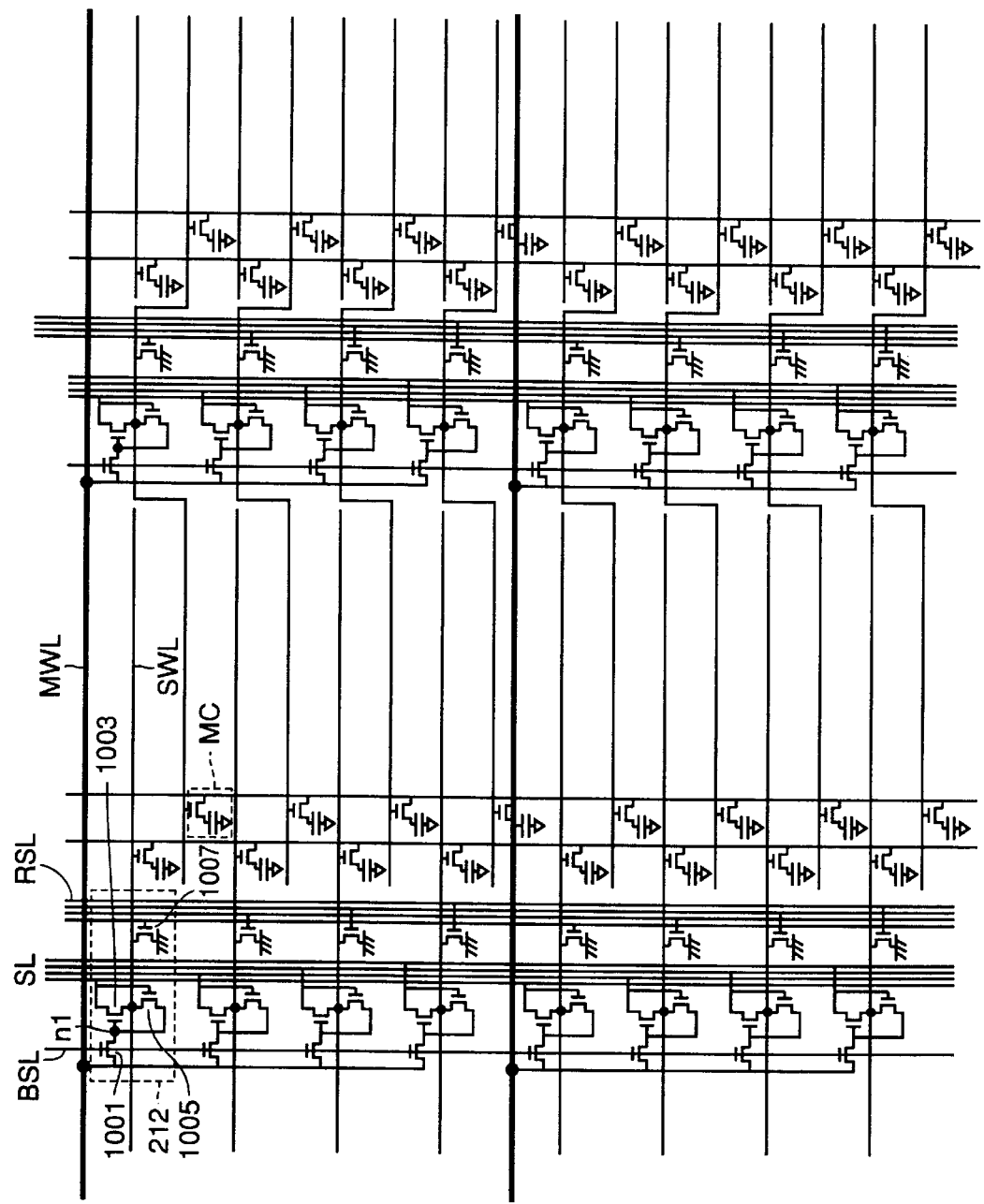
FIG. 9 is a circuit diagram illustrating a specific structure of a sub word driver zone.

FIG. 9 is a circuit diagram illustrating a detailed structure of sub word driver zone 204.

Referring to FIG. 9, sub word driver 212 includes a selection transistor 1001 having its gate controlled by bank selection line BSL and located between the main word line and an internal node n1, a transistor 1003 having its gate connected to node n1 and coupled between one selection line SL0 of selection line SL and sub word line SWL, and a transistor 1005 having its gate potential controlled by selection line SL0 as transistor 1003 and coupled between sub word line SWL and node n1. A transistor 1007 is further included having its gate potential controlled by reset line RSL0 and located between the sub word line and the ground potential.

In another sub word driver, a structure between main word line MWL and sub word line SWL is similar to that described above. In such a structure, main word line MWL is activated, bank selection line BSL is activated, and any selection line SL is activated to set any corresponding word line SWL into the active state (high potential). Reset line RSL is selectively activated to cause any corresponding sub word line SWL to be discharged to the ground potential.

In the example shown in FIG. 9, one main word line MWL controls four sub word lines SWL in each bank, and activation of any one selection line SL designates any sub word line SWL to be selected. Bank selection line BSL has the level of boosted potential Vpp when activated, and the level changes to ground potential Vss after sub word line SWL is activated. In this case, a latch circuit formed of transistors 1003 and 1005 maintains the activated state of bank selection line BSL. The potential levels of selection line SL and reset line RSL are controlled such that they are complementary to each other.

In a waiting operation, bank selection line BSL has ground potential (GND) level, selection line SL has ground potential (GND) level, and reset line RSL has supply potential (Vcc) level. In an activating operation, a corresponding reset line has ground potential (GND), and bank selection line BSL corresponding to sub word line SWL to be activated is activated, and the potential level thereof is at boosted potential Vpp.

Main word line MWL is then activated to reach supply potential Vcc level. Almost simultaneously with activation of main word line MWL, one selection line SL attains supply potential Vcc and sub word line SWL has (Vcc–Vth) level. The level of bank selection line BSL then changes to ground potential (GND), and accordingly charges are closed in the latch circuit within the sub word driver.

When the charges are closed in transistors 1003 and 1005, if a selected one of selection lines SL has the potential level reaching boosted potential Vpp level, the level of sub word line SWL changes to boosted potential Vpp.

In a reset operation, the bank selection line is raised to supply potential Vcc level, and selection line SL is caused to have ground potential GND level. The reset line is caused to have supply potential Vcc level to discharge charges stored by sub word line SWL. As a result, the number of elements constituting sub word driver 212 can be just four elements of the N channel MOS transistors, and thus the number of elements can be reduced.

The main word line is activated in the manner of the one-shot pulse signal. Specifically, once the active state of the main word line is held by transistors 1003 and 1005 in sub word driver 212 corresponding to the selected sub word line, the potential level of the main word line is accordingly reset.

In this case, even if a plurality of banks are arranged in the direction of the main word line as shown in FIG. 8, the potential level of the main word line would not influence sub word driver 210 unless bank selection line BSL is activated. Therefore, at least two memory cell blocks (banks) adjacent to each other in the row direction can be operated separately.

Figure 10:
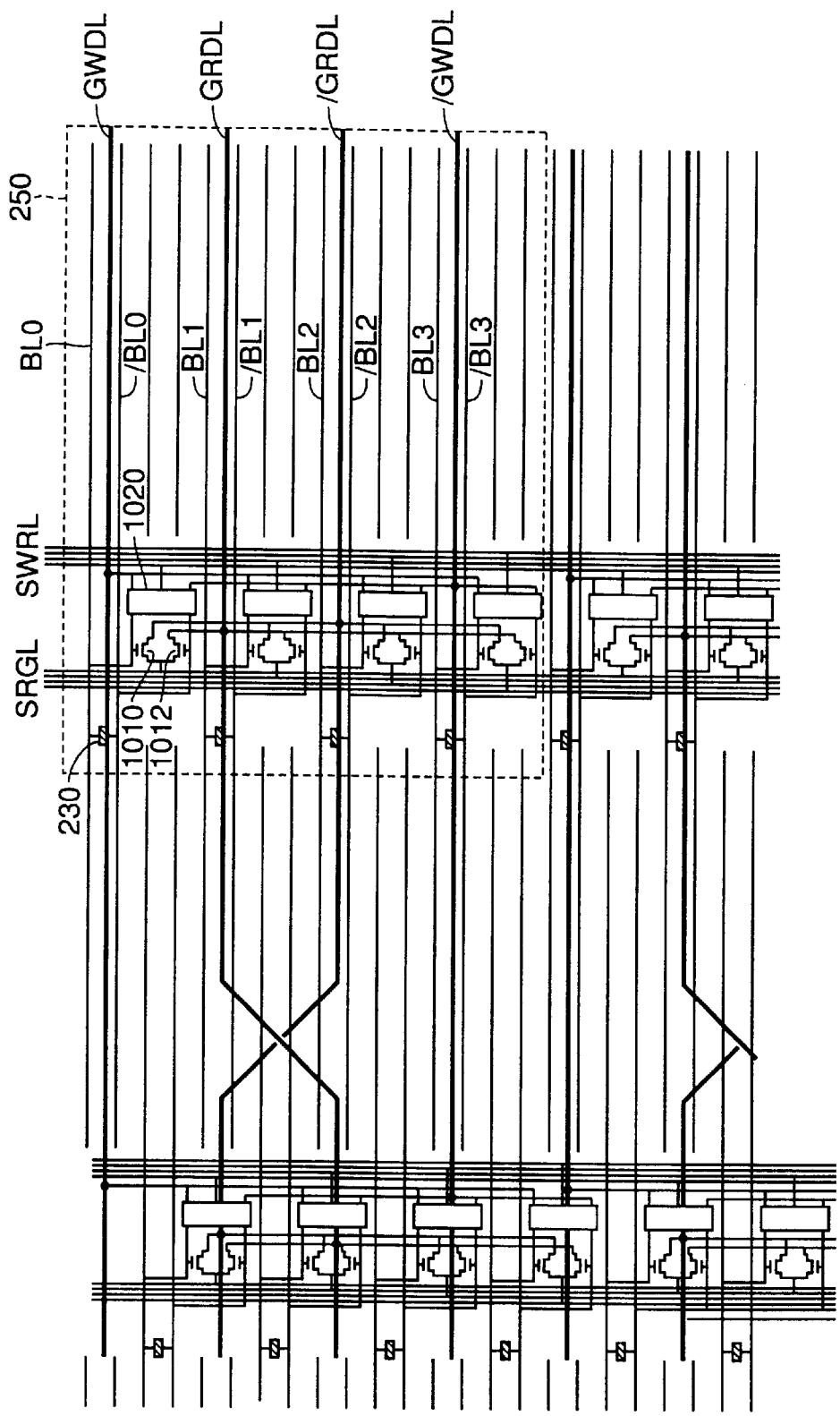
FIG. 10 is a circuit diagram illustrating connection between a sense amplifier and a data line in the memory cell array.

FIG. 10 is a circuit diagram illustrating connection of sense amplifiers and data lines in memory cell array 50.

Referring to FIG. 10, as described above, one global data line is associated with four sense amplifiers to be connected thereto selectively. In order to separately perform the reading and writing operations for data, a pair of global read data lines GRDL and /GRDL and a pair of global write data lines GWDL and /GWDL are separately provided.

There are four sense amplifiers 230 in a region 250. Detailed description of the structure of sense amplifier circuit 230 does not given here. In sense amplifier circuit 230, a sense amplifier formed by cross coupling of a P channel MOS transistor and an N channel MOS transistor and an equalize transistor for equalization of a pair of bit lines BL and /BL are provided. The sense amplifier is located at the center of the bit line. The reading time required from a memory cell to a sense amplifier node can be reduced and a higher speed equalizing operation is possible since the sense amplifier is placed at the center of the bit line to decrease the resistance between the sense amplifier node and the end of the bit line.

The sense amplifier node of sense amplifier circuit 230 and each data line pair are connected via a transistor gate. Selection in the reading operation is first described. The sense amplifier node of sense amplifier circuit 230 is connected to the pair of global read data lines GRDL and /GRDL via read gate transistors 1010 and 1012. The sources of transistors 1010 and 1012 are selectively connected to ground potential GND by a read sub source line SRGL, and the gates of transistors 1010 and 1012 are respectively connected to sense amplifier nodes of corresponding sense amplifier circuits 230, and the drains of transistors 1010 and 1012 are respectively connected to normal read data lines GRDL and /GRDL of the corresponding normal read data line pair. In other words, one read data line pair is shared by four sense amplifier circuits 230.

The writing operation is next described. Data transmitted to the pair of global write data lines GWDL and /GWDL is written onto a corresponding pair of bit lines BL and /BL by a write control circuit 1020. Sense amplifier nodes of sense amplifier circuits 230 corresponding to bit line pairs BL0 and /BL0 to BL3 and /BL3, respectively are selectively connected to the pair of global write data lines GWDL and /GWDL by write control circuit 1020 controlled by corresponding one of sub write activation lines SWRL0–SWRL3.

Accordingly, in the data reading operation, the pair of global read data lines GRDL and /GRDL is directly connected to the corresponding sense amplifier node of the sense amplifier circuit and the gates of transistors 1010 and 1012 are driven by the potential level of the sense amplifier node of the sense amplifier circuit, so that the potential level of the pair of global read data lines GRDL and /GRDL is changed. Even if selection of a memory cell column by a column address signal, that is, selection of any of sub read source lines RGL0–RGL3 overlaps with, or precedes the amplify operation of the sense amplifier, the reading operation is possible without destruction of data.

The high speed reading operation is thus achieved. Further, the peak of the operating current can be limited, and reduction of power consumption, noise and the like can be achieved since only a limited region of the sense amplifier is activated. The pair of global read data lines GRDL and /GRDL having a twisted structure enables noises to be dispersed. The pair of global write data lines GWDL and /GWDL also has the twisted structure in the region which is not shown so as to transmit a write data signal driven with a small amplitude.

Figure 11:
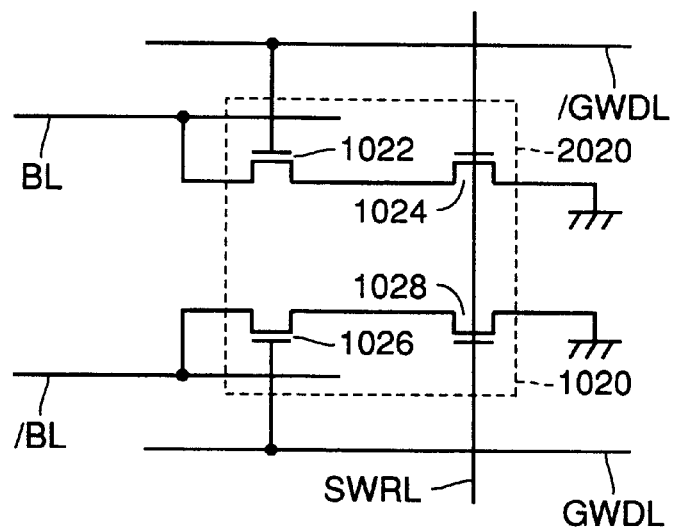
FIG. 11 is a circuit diagram illustrating a structure of a write control circuit.

FIG. 11 is a circuit diagram illustrating a structure of write control circuit 1020.

Referring to FIG. 11, write control circuit 1020 includes transistors 1022 and 1024 connected in series between one of bit lines BL and a ground interconnection line, and transistors 1026 and 1028 connected in series between the other bit line /BL and the ground interconnection line.

The gate of transistor 1022 is connected to global write data line /GWDL. The gate of transistor 1026 is connected to global write data line GWDL. The gates of transistors 1024 and 1028 are connected to a corresponding sub write activation line SWRL.

Write control circuit 1020 rewrites the potential level of the pair of bit lines BL and /BL in response to activation of sub write activation line SWRL according to the difference in impedance of transistors 1022 and 1026 having the gates connected to the write data lines without direct connection between the bit line pair and the global write data line pair.

Specifically, when write data is at H level, the potential of GWDL is at H level and the potential of /GWDL is at L level. Accordingly, if transistors 1024 and 1028 are turned on in response to activation of sub write activation line SWRL, transistor 1026 having its gates connected to GWDL at the H level is turned on. On the other hand, transistor 1022 having its gate connected to /GWDL is in an off state. As a result, L level (ground potential) is written onto one bit line /BL. After the potential difference between the one bit line /BL and the other bit line BL having the precharge level is amplified by the sense amplifier circuit, the potential difference is stored in a memory cell selected by an address signal.

Figure 12:
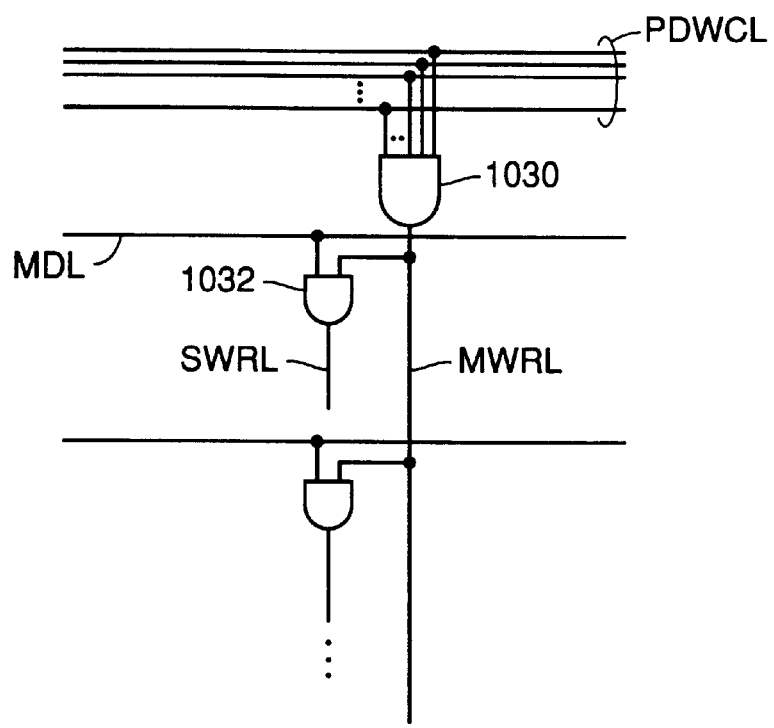
FIG. 12 is a circuit diagram illustrating a structure of a circuit which drives a sub write activation line.

FIG. 12 is a circuit diagram illustrating a structure of a circuit which drives sub write activation line SWRL.

Referring to FIG. 12, sub write activation line SWRL is activated by an AND gate 1032 having two inputs connected to a mask data line MDL and a main write activation line MWRL. Main write activation line MWRL is connected to an output node of a logic gate 1030 which predecodes a write column predecode signal transmitted by a write column predecode signal line PDWCL. Main write activation line MWRL is thus selectively activated in response to a write address signal supplied from the logic circuit portion.

In such a structure as described above, a partial masking operation can be applied to a column selected by the write address signal according to the potential level of the mask data line to cancel the writing operation.

Further, the precharge level of the pair of global write data lines GWDL and /GWDL is set at L level, so that the rewriting operation of the pair of bit lines BL and /BL can be prevented from being executed when the masking operation inactivates the sub write activation line SWRL.

Figure 13:
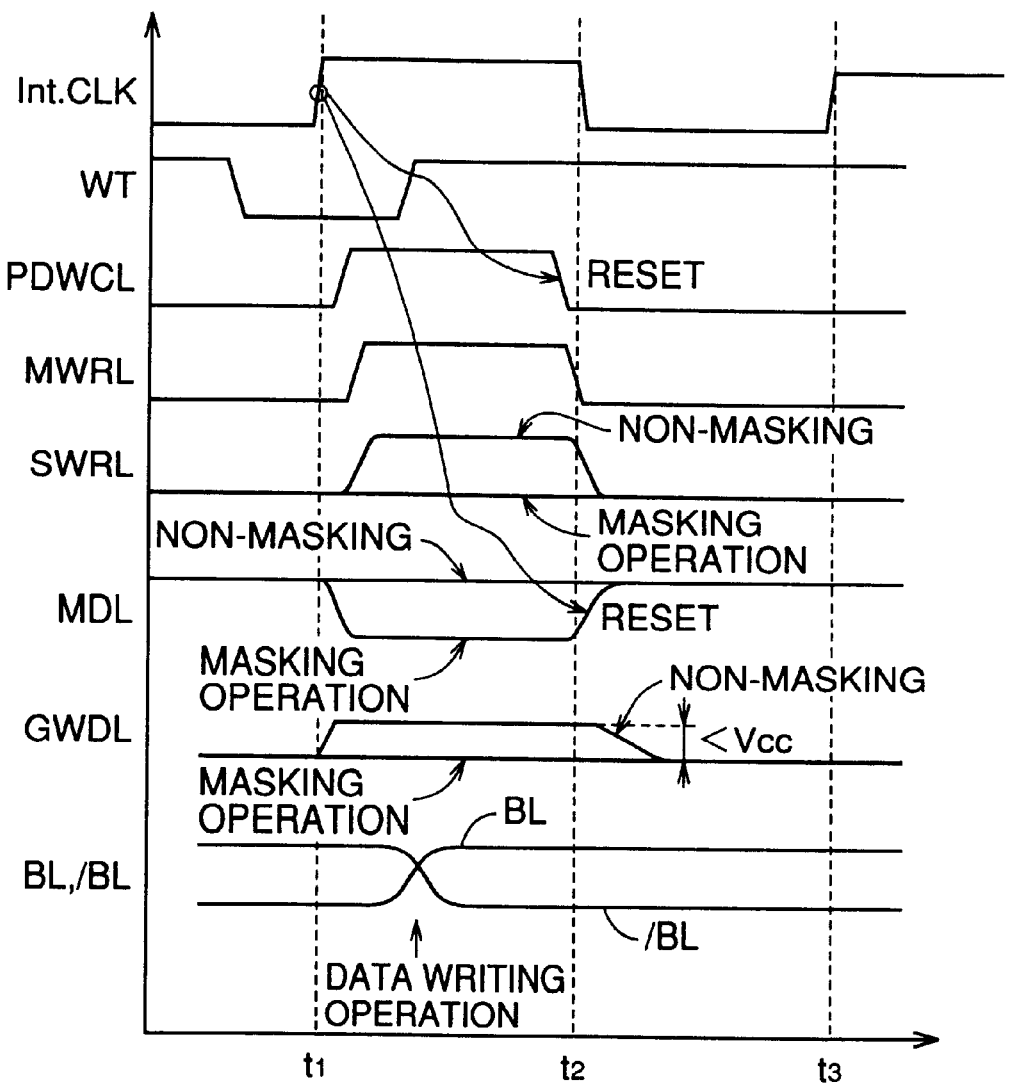
FIG. 13 is a waveform chart illustrating operations of respective components in a writing operation.

FIG. 13 is a waveform chart illustrating operations of respective components of the memory cell array in the writing operation.

Referring to FIG. 13, at the timing which allows a set up time to be ensured prior to activation of clock signal Int.CLK, write control signal WT is activated.

At time t1, Int.CLK is activated and accordingly the write address signal is entered to selectively activate write column predecode line PDWCL. In response to activation of the write column predecode signal line, a corresponding main write activation line MWRL is activated. In response to activation of the main write activation line, a corresponding sub write activation line SWRL is activated if no masking operation is designated, and the sub write activation line SWRL rises to H level. If the masking operation is designated, the sub write activation line is not activated to remain at L level even if the main write activation line is activated.

In the precharge operation, mask data line MDL is set to H level. In the non-masking operation where no masking operation is designated, the potential of the mask data line is kept at H level. If the masking operation is designated, the potential of a corresponding mask data line MDL is driven to L level, one input of AND gate 1032 is set to L level to issue an instruction for inactivating sub write activation line SWRL.

It is supposed to herein that global write data line pair GWDL transmits H level as write data. For the global write data line pair, the precharge level is L level as described above and L level is maintained in the masking operation. In the no-masking operation, the potential of GWDL is set at H level for transmitting a write data signal.

Potential corresponding to H level of GWDL can be made lower than a bit line amplitude Vcc since the global write data line and the bit line are not directly connected in the structure of the write control circuit. The global write data line is thus driven with a small amplitude to achieve an effect of reduction in power consumption and noises.

Data on global write data line GWDL is reflected in the pair of bit lines BL and /BL by write control circuit 1120 via the sense amplifier circuit. In this case, the data writing operation causes the potential of bit line BL to have H (Vcc) level and causes the potential of /BL to have L level.

The internal clock signal falls at time t2. At this timing, write column predecode signal line PDWCL and the mask data line MDL are reset.

Figure 14:
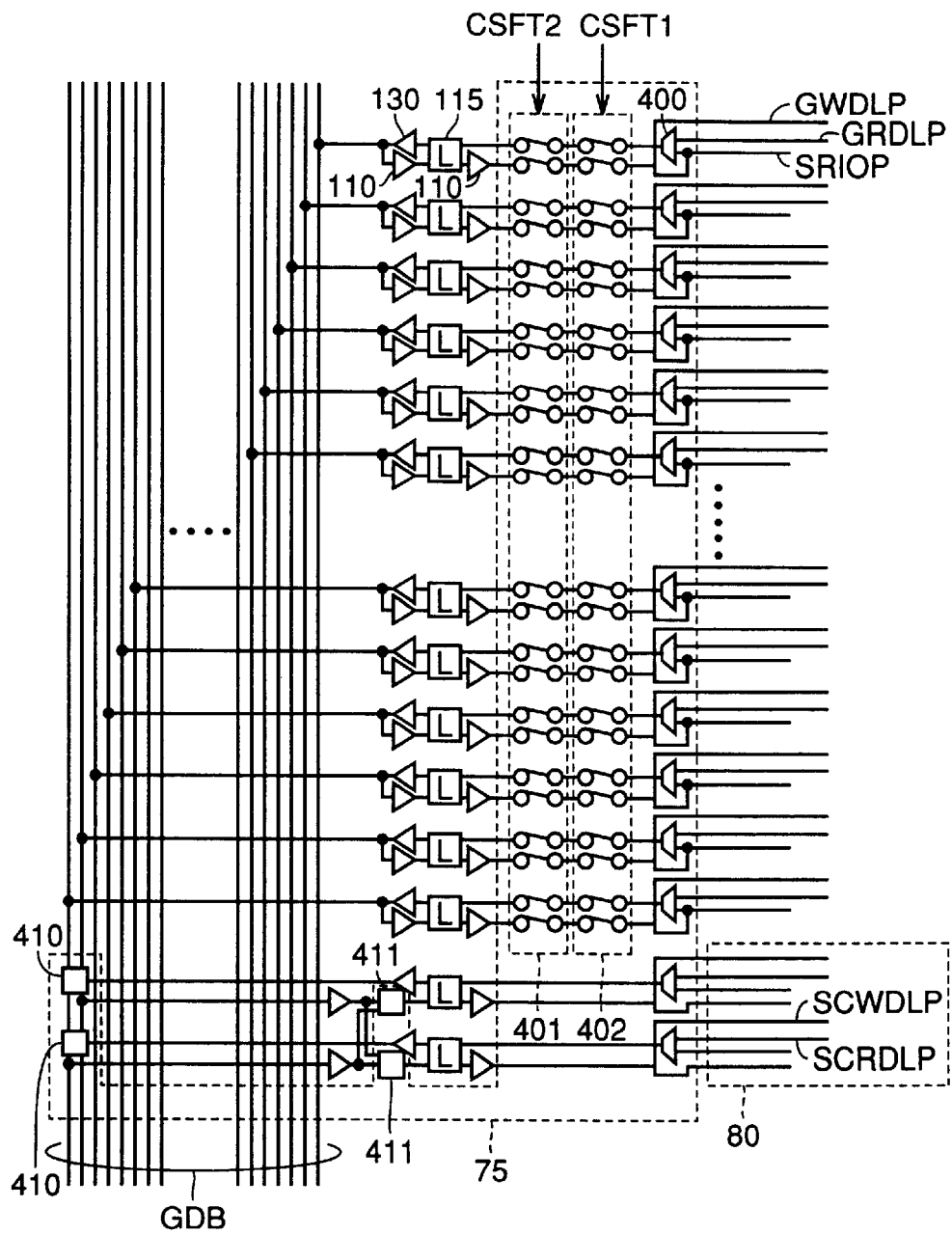
FIG. 14 is a schematic block diagram illustrating a structure of a data line shift circuit.

FIG. 14 is a schematic block diagram illustrating a structure of data line shift circuit 75.

In FIG. 14, one data line GRDLP represents the pair of global read data lines GRDL and /GRDL described with reference to FIG. 10. Similarly, one data line GWDLP represents the pair of global write data lines. Further, one data line SRIOP represents the pair of spare row read data lines SRIO and /SRIO, and data lines of SCWDLP and SCRDLP respectively represent the pair of spare column write data lines and the pair of spare column read data lines. Two pairs of spare read data lines and two pairs of spare write data lines are provided to the redundant column circuit, respectively referred to as SCRDLP0, SCRDLP1 and SCWDLP0, SCWDLP1.

A row-related redundancy repair operation is first described. In the data reading operation, a multiplexer 400 in data line shift circuit 75 connects one of global read data line pair GRDLP and spare row I/O line pair SRIOP to an output node of the multiplexer based on the result of determination made by the row redundancy judgement circuit.

Depending on whether or not the row redundancy repair is to be made, multiplexer allows data on either one of normal read data line pair GRDLP and spare row read data line pair SRIOP to be output. The output data is latched by a data latch circuit 115 via a second shift circuit and a first shift circuit, amplified thereafter by read amplifier 120 and transmitted to global data bus GDB. Such successive operations allow a proper data to be transmitted to the global data bus via the data line shift circuit according to whether or not the row redundancy repair is executed.

In the data writing operation, data on global data bus GDB is transmitted to both of the global write data line pair GWDLP and SRIOP via the first shift circuit 401 and the second shift circuit 402 by a write driver 110 and data latch circuit 115. Sub YS line SYSL selects connection between GWDLP and the sense amplifier in the normal memory cell array, and connection between SRIOP and the sense amplifier circuit in the row redundant circuit is controlled by activation of spare row YS line SRYSL. Only one of spare row YS line and sub YS line is activated according to whether or row redundancy repair is executed and activation of both lines never occurs. Therefore, write data is properly stored in the normal memory cell array or the row redundant circuit according to whether or not the row redundancy repair is necessary.

A column-related redundancy repair operation is next described. Data on the data line in the spare column region is transmitted to global data bus GDB as done in the normal memory cell array via multiplexer 400, data latch circuit 115, write driver 110 and read amplifier 120. SCRDLP0 and SCWDLP0, and SCRDLP1 and SCWDLP1 can selectively be connected to two of global data bus lines GDB.

Specifically, data on two global data buses GDB connected to connection switching circuits 410 and 411 can be transmitted to any of SCWDLP0 and SCWDLP1 in the writing operation. Read data transmitted by SCRDLP0 and SCRDLP1 in the reading operation can be transmitted to any pair of global data buses connected to connection switching circuit 411. The first and second shift circuits each have shift setting operations respectively applied to the read data line and the write data line separately. Therefore, reading and writing operations can simultaneously be performed for a plurality of bank groups different from each other in the same operation cycle.

A shifting operation for the data lines when there is actually a defective memory cell is described below.

Figure 15:
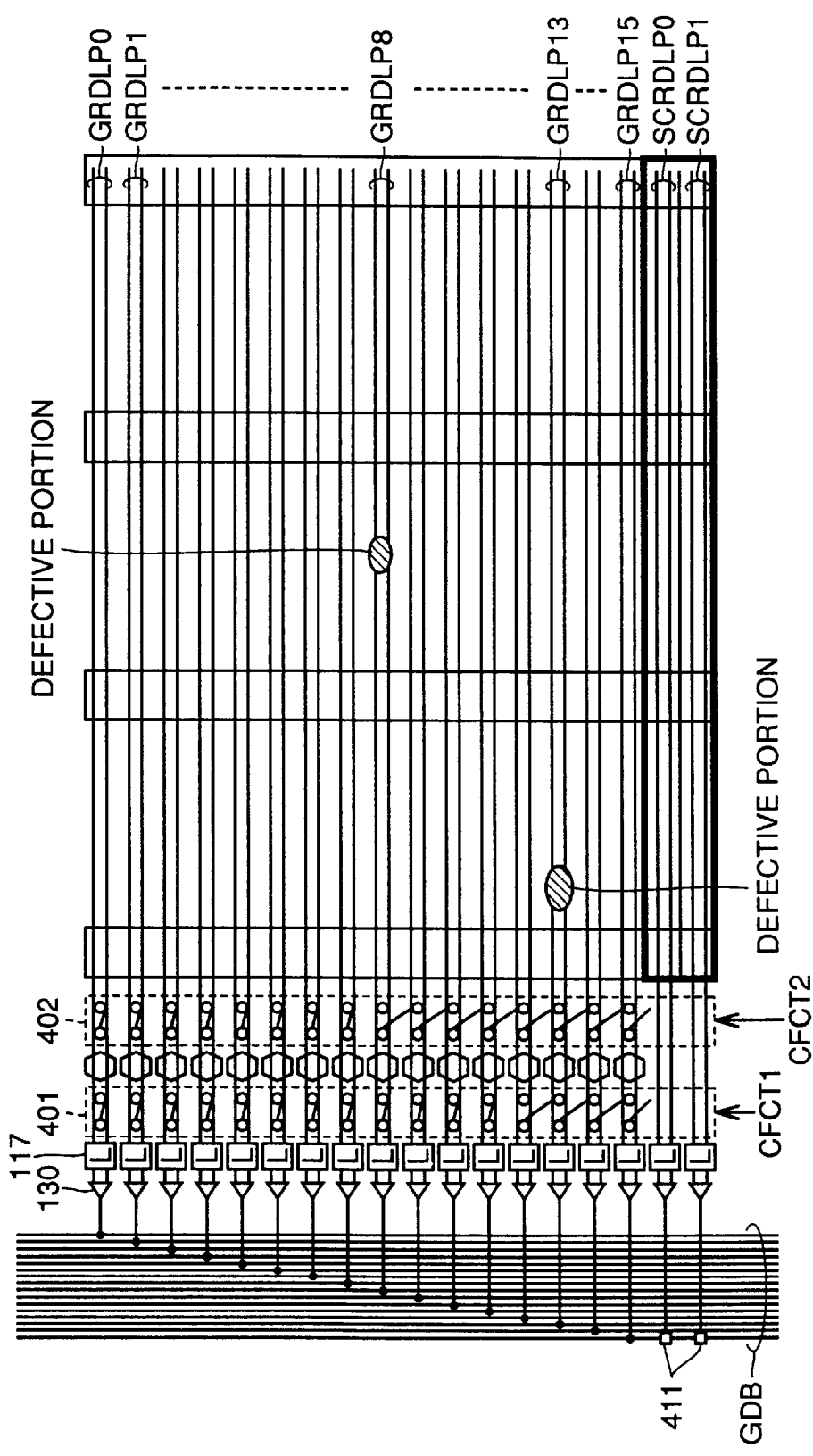
FIG. 15 illustrates a shift operation for column redundancy repair in a reading operation.

FIG. 15 illustrates the shifting operation for the column redundancy repair in the reading operation.

Referring to FIG. 15, the first and second shift circuits 401 and 402 normally connect the normal read data line pair to the global data bus without shifting the normal read data line pair. However, if there is a defective memory cell as represented by a circle painted out with black in the drawing, the normal read data line pair corresponding to the defective portion is disconnected from the global data bus. Specifically, since GRDLP8 has a defective portion, the second shift circuit shifts GRDLP9 and following normal read data line pairs one by one in order to connect GRDLP9 to the global data bus which is originally associated with GRDLP8.

Further, since GRDLP13 also has a defective portion, the normal read data line pairs are shifted in order to disconnect the corresponding normal read data line pair from the global data bus. This shifting operation is performed by the first shift circuit. Specifically, the first shift circuit shifts GRDLP 14 and 15 one by one to connect them to global data buses respectively on the upper side relative to global data buses that should be connected thereto originally.

The operations of the first and second shift circuits allow data on GRDLP1–GRDLP7 to be read onto the global data buses that are originally associated with them. However, data on GRDLP8 is not read onto the global data bus.

Data on GRDLP9–12 are read onto global data bus pairs shifted one by one relative to the global data bus pairs that are originally associated with them. Data on GRDLP13 is not read onto the global data bus pair. GRDLP 14 and 15 are shifted by two relative to global data buses that are originally associated with them respectively, and thus GRDLP 14 and 15 are connected to global data buses originally associated with GRDLP 12 and 13.

Such a shifting operation prevents data on a normal read data line pair corresponding to a defective portion from being read onto a global data bus. The defective portion is repaired by the column redundant circuit, and the corresponding data is read onto spare column read data line pairs SCRDLP0 and SCRDLP1. Data lines in the column redundant circuit region and the global data buses are connected by connection switching circuit 411 without using the shift circuit.

Data stored in the column redundant circuit is read onto the global data bus where no data is read due to shifting of the normal read data lines. The column-related redundancy repair is thus achieved by these successive operations.

The shifting manner by the first and second shift circuits is designated by a data line shift control signal CFCT1 and CFCT2 supplied from the column redundancy judgement circuit. Control signal CFCT1 and CFTCT2 are externally supplied with a defective address (column) in advance and stored in the defective address programming circuit when the column redundancy repair is programmed.

The shifting manner can be set arbitrarily for each defective column address. Redundancy repair of any defect is accomplished based on a data line instead of a column address of a memory cell. Therefore, the column-related redundancy repair operation is possible in the configuration where a number of input/output data lines are arranged.

In FIGS. 14 and 15, two pairs of data I/O lines are provided in the spare redundant circuit and two stages of shift circuits are provided. However, the present invention is not limited to such a structure. Specifically, a greater number of pairs of data lines may be arranged in the column redundant circuit and the number of stages of shift circuits can accordingly be increased in order to repair a greater number of defects.

A specific structure of a data line shift circuit for controlling the shifting operation for data lines in the column redundancy repair is next described. The first shift circuit 401 and the second shift circuit 402 shown in FIG. 14 have the same structure and they are hereinafter referred to as shift circuit for the purpose of description.

Figure 16:
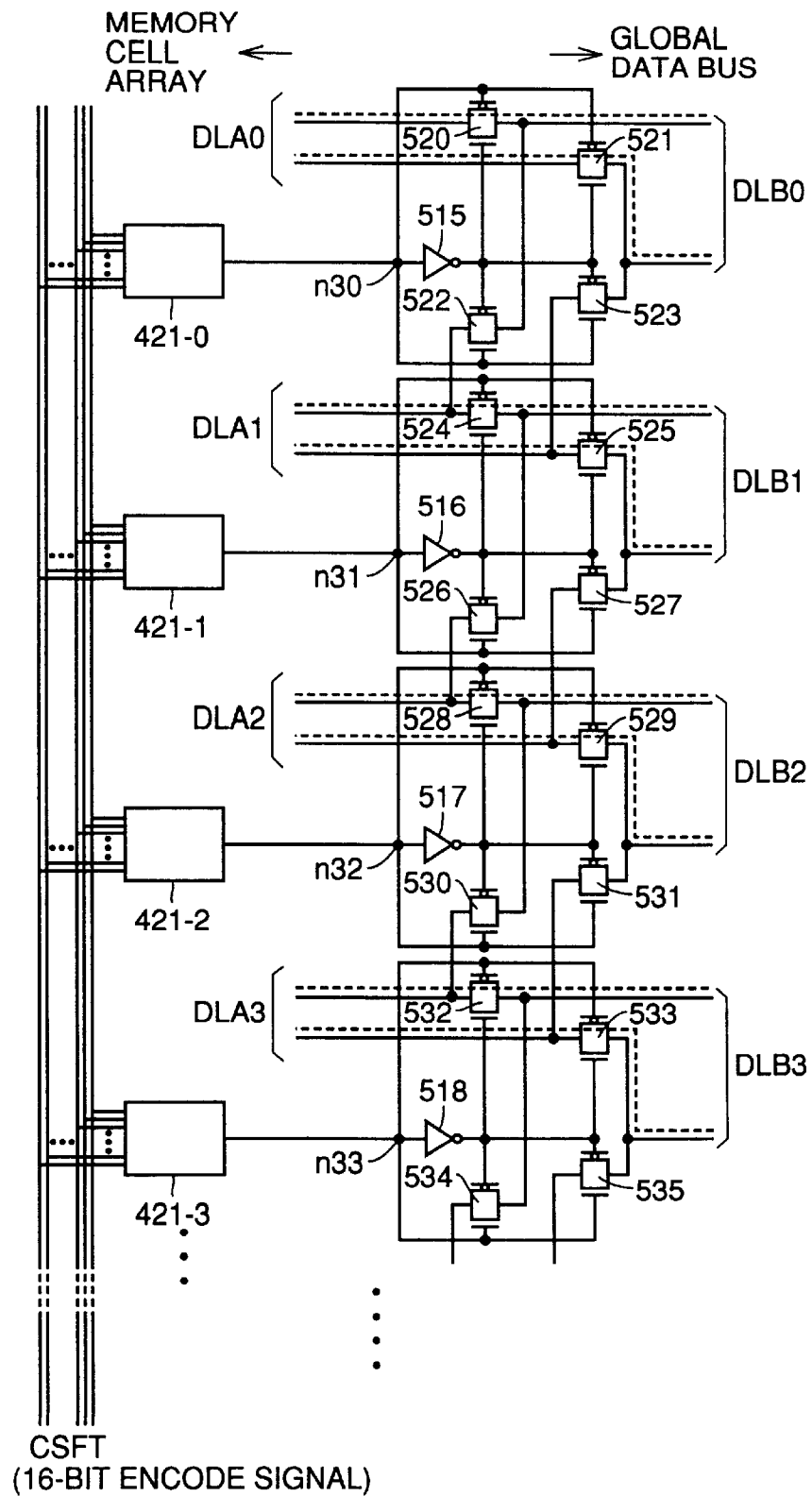
FIG. 16 is a circuit diagram specifically illustrating a structure of a shift circuit.

FIG. 16 is a circuit structure illustrating a specific structure of the shift circuit.

In FIG. 16, it is supposed that shift control is applied between four complementary data line pairs DLA0–DLA3 associated with the memory cell array and four complementary data line pairs DLB0–DLB3 associated with the global data bus for convenience of description. Shift control signal CSFT for designating a shift position is supplied as a 16-bit encode signal and accordingly total 256 types of shift positions can be set.

Referring to FIG. 16, transfer gates 520 and 521 are placed between data line pairs DLA0 and DLB0. Transfer gates 520 and 521 are turned on/off according to the potential of a node n30. The potential of node n30 is determined depending on the output of a shift position decode circuit 421-0. In a normal state, the output of each shift position decode circuit has H level. In the case of connection between data line pairs DLA0 and DLB0, for example, transfer gates 520 and 521 are turned on while transfer gates 522 and 523 are turned off so that data on data line pair DLA0 is transmitted to data line pair DLB0. Similarly, in the case of other data line pairs, a data line pair DLAi of the i-th memory cell array is connected to a data line pair DLBi of the i-th global data bus.

When the shift position is set by signal CSFT, outputs of the shift position decode circuits located downstream relative to the set shift position are caused to have L level.

For example, if a defect occurs in a region corresponding to data line pair DLA2 in the memory cell array and accordingly data line pair DLA2 cannot be used, data line pair DLA2 is disconnected from the global data bus and data line pairs should be shifted successively.

In this case, the potential of nodes n32, n33, . . . is at L level, so that outputs of a shift position decode circuit 421-2 and following shift position decode circuits 421-3 . . . change to L level.

Potential of nodes n30 and n31 is kept at H level. Therefore, data on data line pairs DLA0 and DLA1 are respectively transmitted to associated data line pairs DLB0 and DLB1. However, the potential of node n32 is at L level to turn off transfer gates 528 and 529 and turn on transfer gates 530 and 531 instead. As a result, instead of DLA2, DLA3 is connected to data line pair DLB2. Similarly, transfer gates 532 and 533 are turned off and transfer gates 534 and 535 are turned on for data line pair DLA3. Therefore, DLA3 and following data line pairs are respectively shifted one by one to the upper side to be connected to data line DLB2 and following data line pairs.

Data line pair DLA2 associated with the defective memory cell is connected to no data line pair associated with the global data bus.

A specific structure of the shift position decode circuit is next described.

Figure 17:
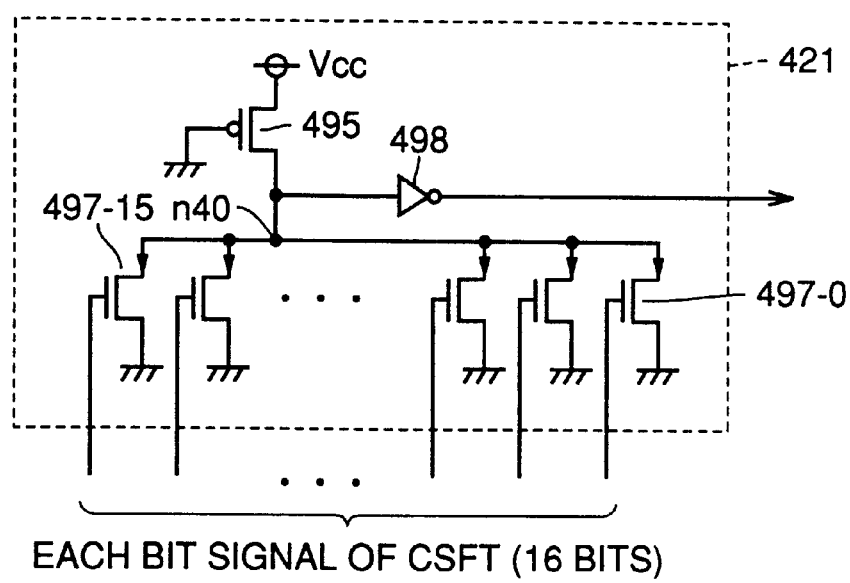
FIG. 17 is a circuit diagram illustrating specifically a structure of a decode circuit.

FIG. 17 is a circuit diagram illustrating the specific structure of shift position decode circuit 421.

Referring to FIG. 17, decode circuit 421 includes a P channel MOS transistor 495 connected between supply potential Vcc and an intermediate node n40, and sixteen transistors 497-0 to 497-15 connected in parallel between intermediate node n40 and ground potential GND. The gates of transistors 497-0 to 497-15 receive corresponding bit signals of shift set control signal CSFT.

Transistor 495 is used for supplying a constant current from supply potential Vcc to intermediate node n40. A predetermined current supplied by transistor 495 is set at different values depending on each decode circuit, and the predetermined value is used as a reference value for comparison of amount.

The current drive ability of transistors 497-0 to 497-15 is determined such that the K-th (K: 0–15) transistor has the current chive ability of $2^K$·it (it: drive current of transistor 497-0).

The total current flowing from n40 toward ground potential is determined according to the decode value of 16-bit set signal CSFT. The potential of n40 is determined by comparing the predetermined current value supplied from transistor 495 to node n40 with current flowing from node n40 toward ground potential and determining which is greater. An output of an inverter 498 obtained by inverting that state, that is, an output signal of decode circuit 421 has supply potential Vcc level or ground potential GND level depending on the designated shift position.

Figure 18:
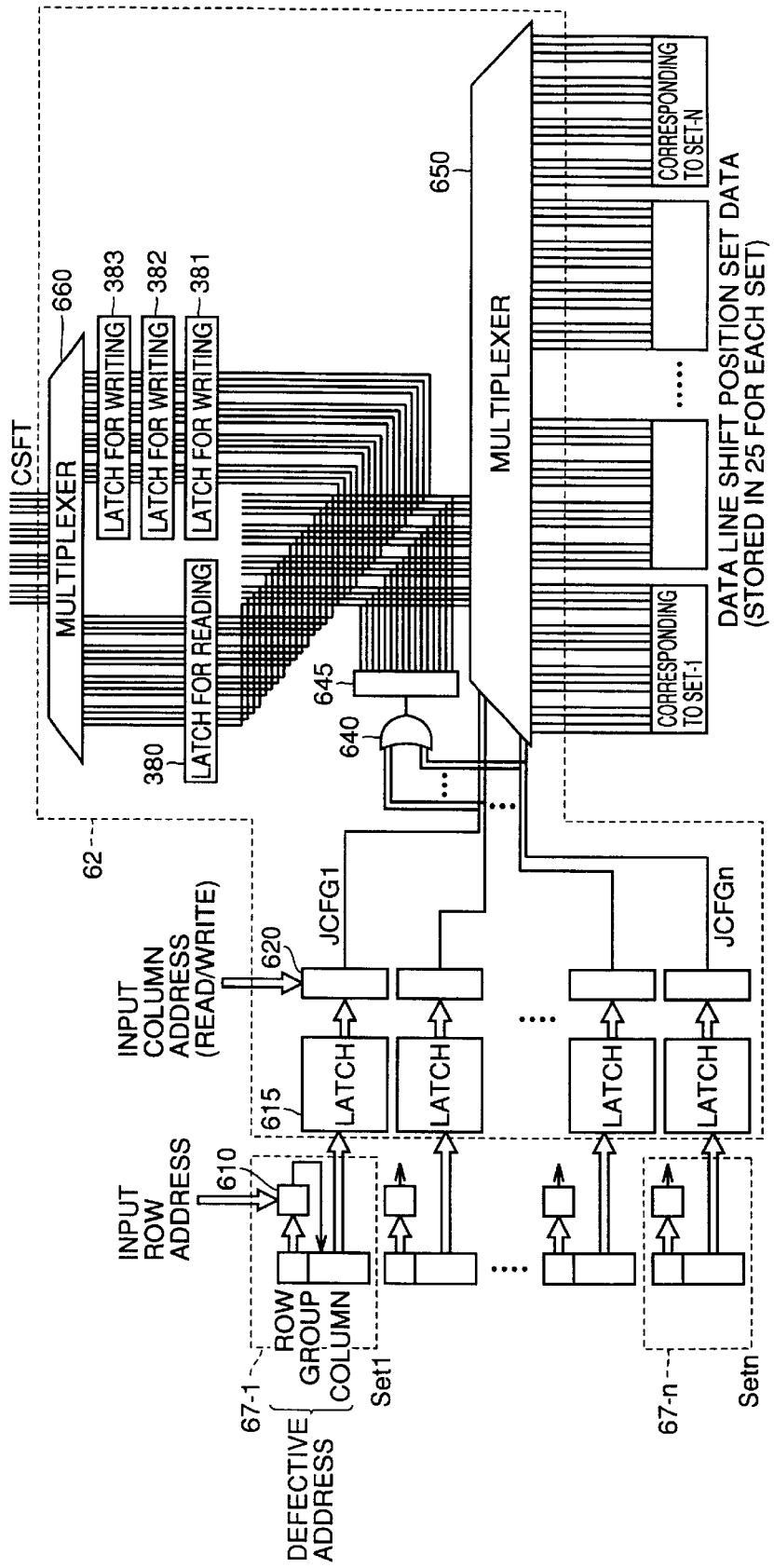
FIG. 18 is a schematic block diagram illustrating a structure of a column redundancy control circuit generating a shift control signal.

FIG. 18 is a block diagram illustrating in detail for describing generation of shift control signal CSFT for designating shift positions in the column redundancy control circuit. Referring to FIG. 18, a column address related to a defective memory cell (defective column address), a row address group related thereto, and information indicating a position to which a data line is shifted correspondingly to a defective column address are stored in a non-volatile manner in column redundancy judgement sets 67-1, . . . 67-n (n: a predetermined natural number) included in redundancy address programming circuit 25. In semiconductor integrated circuit device 1000, rows of normal memory cells are divided into L row groups, and the column redundancy judgement sets are associated with the row groups.

Column redundancy judgement set 67-1 is activated when a row group associated with an input row address signal and a row group of a defective memory cell match with each other, and outputs a defective column address and information on the shift position of an associated data line to column redundancy control circuit 62. The column redundancy judgement set is associated with the row group and thus only the redundancy column judgment set associated with the row group is activated depending on the input row address signal to accomplish redundancy judgement. As a result, power consumption for the redundancy judgement operation can be reduced.

Column redundancy judgment set 67-1 includes a matching compare circuit 610 for comparing a row group associated with an input row address signal and a row group of a defective memory cell. Depending on the output of matching compare circuit 610, the defective column address stored in the column redundancy judgement set is transmitted to a latch circuit 615 placed in column redundancy control circuit 62.

Column redundancy control circuit 62 includes latch circuit 615 receiving and latching a defective column address transmitted from an activated column redundancy judgement set, and a matching compare circuit 620 for comparing the defective column address latched by latch circuit 615 and an input column address (representing read/write).

If the input column address signal matches with the defective column address, a corresponding one of column redundancy judgment flags JCFG1–JCFGn is activated.

Column redundancy control circuit 62 further includes a logic gate 640 receiving column redundancy judgment flags JCFG1–JCFGn and outputting a result of an OR operation, and a multiplexer 650 receiving column redundancy judgement flags JCFG1–JCFGn, and selecting and outputting the data line shift position setting data stored in the column redundancy judgement set corresponding to an activated column redundancy judgement flag. The data line shift position setting data is preliminary stored in redundancy address programming circuit 25 in a non-volatile manner associated with respective defective column addresses.

If the input column address signal matches with the defective column address, in response to the output of logic gate 640, a precharge circuit 645 cancels precharge of an output node of multiplexer 650. A decode signal of shift position of a data line corresponding to the defective address to which an access is made by multiplexer 650 is output.

The decode signal supplied from multiplexer 650 is temporarily stored in a latch circuit for writing 381 and a latch circuit for reading 380.

If an access operation is done in the direct enter mode, during the period in which the address is judged, distinguishment between reading operation and writing operation is impossible. Therefore, such latch circuits are required. In the reading operation, read latch circuit 380 shifts a decode signal by one clock cycle. In this mode, write latch circuit 381 shifts an input of a write command according to write latency and thereafter outputs the decode signal for shift redundancy decoding in the writing operation.

In the clock synchronous enter mode where the address signal and the command signal are supplied at the same timing, latch circuits 380 and 381 directly output data without delaying the data by one clock cycle by the shift operation.

A multiplexer 660 receives outputs of read latch circuit 380 and a write latch circuit 383, and transmits shift control signal CSFT from a corresponding latch circuit to a shift circuit depending on whether the operation designated for the bank is the reading operation or the writing operation. As a result, even if the timing margin to completion of shift circuit setting is different depending on the reading operation and the writing operation, an appropriate operation can be applied.

Figure 19:
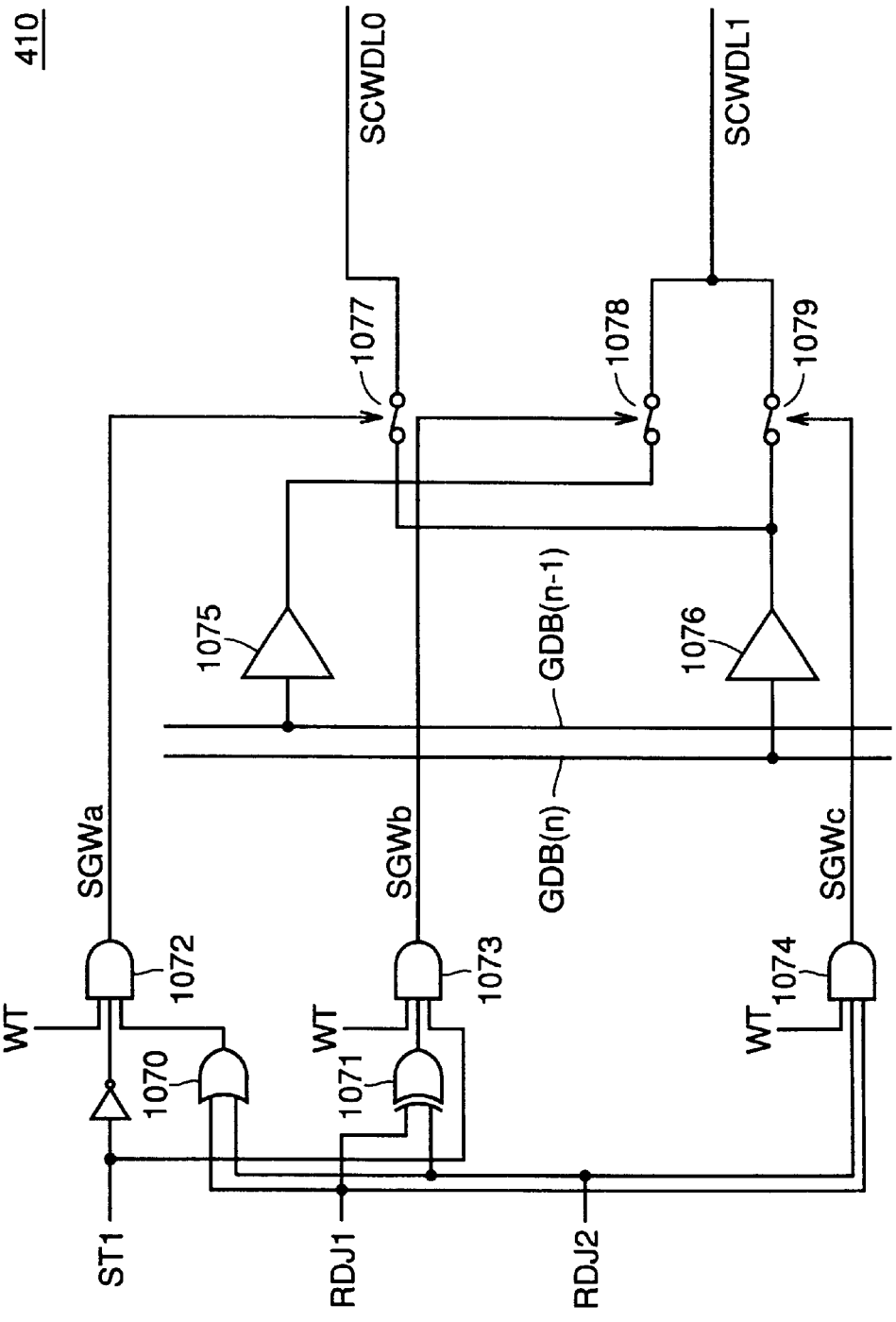
FIG. 19 is a circuit diagram illustrating a structure of a data line connection switching circuit 410.

FIG. 19 is a circuit diagram illustrating a structure of data line connection switching circuit 410.

Data line connection switching circuit 410 is used for selectively connecting global data buses GDB (n–i) and GDB (n) disconnected from global write data line pairs in the normal memory cell region by the shifting operation with sub column write data lines SCWDL0 and SCWDL1 for making column redundancy repair based on shift redundancy.

Referring to FIG. 19, data line connection switching circuit 410 receives a flag ST1 indicating if sub column write data line SCWDL0 is available or not, RDJ1 showing the result of judgement on whether the first shift circuit is employed for the column redundancy repair, and RDJ2 showing the result of judgement on whether or not the second shift circuit is employed for the column redundancy repair.

Flag ST1 is activated (H level) when the existence of any defect is found in a region corresponding to sub column write data line SCWDL0 by a test of the redundant circuit, or when redundancy repair is executed once using SCWDL0 but SCWDL0 thereafter becomes unavailable.

Signals RDJ1 and RDJ2 are activated (H level) when a corresponding shift circuit is used for column redundancy repair.

Data line connection switching circuit 410 includes a logic gate 1070 receiving redundancy judgement results RDJ1 and RDJ2 and outputting the result of OR operation, a logic gate 1071 outputting the OR of RDJ1 and RDJ2, an AND gate 1072 receiving an output of logic gate 1070, an inverse signal of flag ST1, and a write control signal WT as three inputs, an AND gate 1073 receiving an output of logic gate 1071, write control signal WT and flag ST1 as three inputs, and an AND gate 1074 receiving write control signal WT, and redundancy judgement results RDJ1 and RDJ2 as three inputs.

Logic gate 1072 outputs flag SGWa. Flag SGWa is a signal which is activated when at least one of sub column write data lines SCWDL0 and SCWDL1 should be used and SCWDL0 is unavailable and then the writing operation is designated.

Logic gate 1073 generates flag SGWb. Flag SGWb is activated when the writing operation is designated and both of sub column write data lines SCWDL0 and SCWDL1 should be employed.

Logic gate 1974 generates flag SGWc. Flag SGWc is activated when any one of sub column write data lines SCWDL0 and SCWDL1 should be used and SCWDL0 is unavailable and then the writing operation is designated.

Data line connection switching circuit 410 further includes a buffer 1075 for transmitting data on global data line GDB (n–1), and a switch 1078 connected between buffer 1075 and sub column write data line SGWDL1 and turned on in response to activation of flag SGWb.

The data line connection switching circuit further includes a buffer 1076 for transmitting data on global data bus GDB (n), a switch 1077 connected between buffer 1076 and SCWDL0 and turned on in response to activation of flag SGWa, and a switch 1079 connected between buffer 1076 and SCWDL1 and turned on in response to activation of flag SGWc.

In such a structure as described above, according to the result of judgement by the column redundancy control circuit, if there arises a necessity to use at least one sub column data write line, data on global data bus GDB (n) is usually transmitted to SCWDL0. However, if SCWDL0 is unavailable, data on GDB (n) is transmitted to SCWDL1.

According to the result of judgement by the column redundancy control circuit, if both of SCWDL0 and SCWDL1 should be used, it is possible to connect global data bus GDB (n–i) with SCWDL1.

Figure 20:
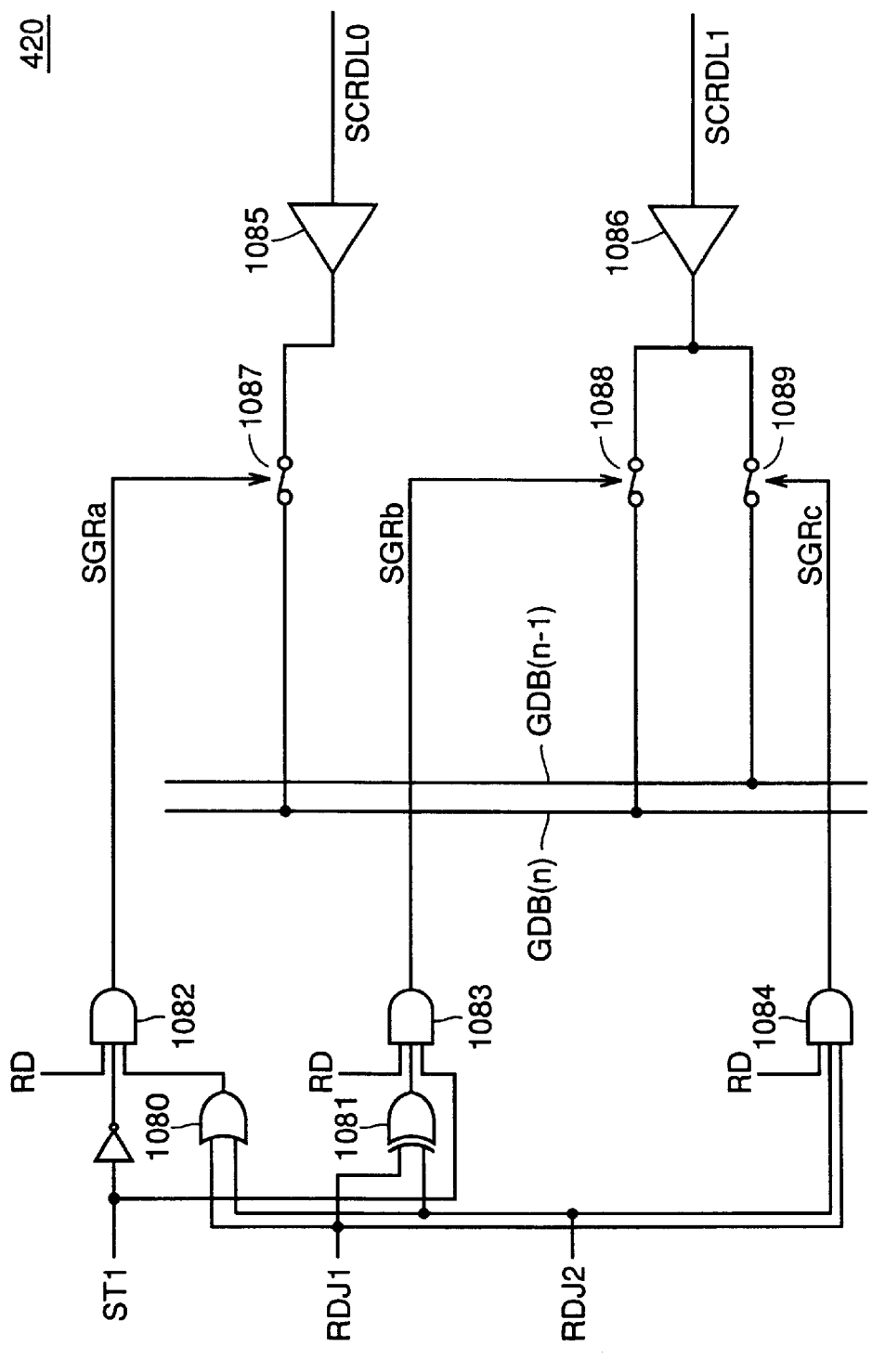
FIG. 20 is a circuit diagram illustrating a structure of a data line connection switching circuit 420.

FIG. 20 is a circuit diagram illustrating a structure of a data line connection switching circuit 420. Data line connection switching circuit 420 is used for switching connection between the sub column data read line and the global data bus when use of the sub column data read line is required in the data reading operation as a result of the judgement by the column redundancy control circuit.

Flag ST1, column redundancy judgement results RDJ1 and RDJ2 are also supplied to data line connection switching circuit 420. The contents of flag ST1 and column redundancy judgement results RDJ1 and RDJ2 are similar to those described in conjunction with data line connection switching circuit 410. Flag ST1 is set according to whether or not any defect occurs at sub column read line SCRDL0. Data line connection switching circuit 420 includes logic gates 1080–1084. Logic gate 1082 generates flag SGRa, logic gate 1083 generates flag SGRb, and logic gate 1084 generates flag SGRc. SGRa–SGRc are respectively associated with flags SGWa–SGWc in data line connection switching circuit 410.

Data line connection switching circuit 420 further includes a buffer 1085 for transmitting data on sub column read data line SCRDL0, a switch 1087 connected between buffer 1085 and global data bus GDB (n), and turned on in response to activation of flag SGWa, a buffer 1086 for transmitting data on SCRDL1, a switch 1088 connected between buffer 1086 and global data bus GDB (n) and turned on in response to activation of flag SGWb, and a switch 1089 connected between buffer 108G and global data bus SGRb and turned on in response to activation of SGRc.

In such a structure, if the column redundancy control circuit determines that at least one of sub column read data lines SCRDL0 and SCRDL1 should be used for making column redundancy repair, global data bus GDB (n) has a higher priority to be connected with SCRDL0 if SCRDL0 is available.

Further, the column redundancy repair requires both of SCRDL0 and SCRDL2, switch 1089 is turned on to allow data read onto SCRDL1 to be transmitted to global data bus GDB (n–i).

Description of Operation Cycle in Each Access Mode

An operation of entering an access signal and an internal circuit operation of semiconductor integrated circuit device 1000 is next described by comparing the clock synchronous enter mode and the direct enter mode described with reference to FIGS. 4 and 5.

Figure 21:
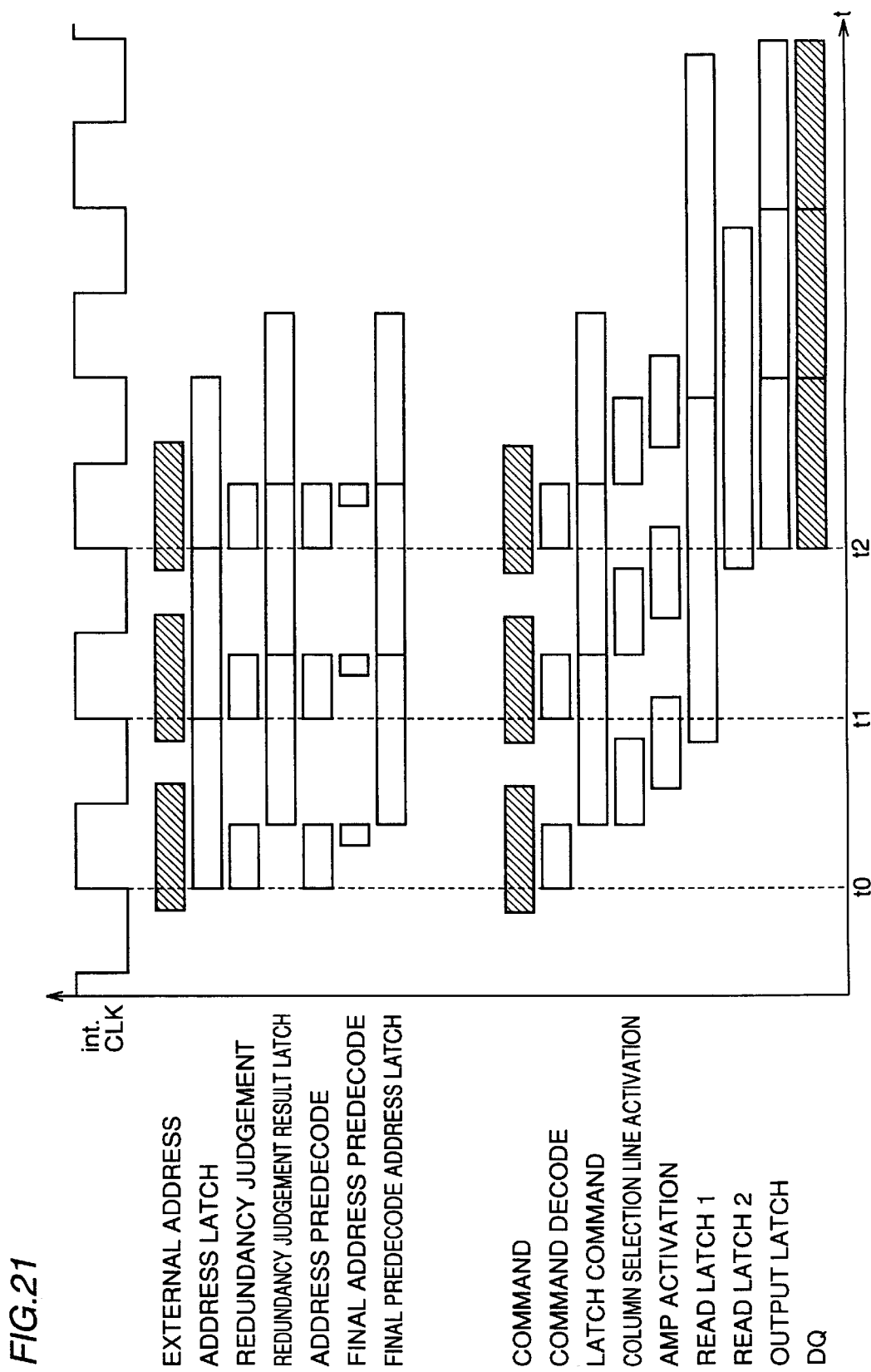
FIG. 21 is a timing chart illustrating a reading operation cycle when an access mode is the clock synchronous enter mode.

FIG. 21 is a timing chart illustrating a reading operation cycle when the access mode is the clock synchronous enter mode.

Referring to FIG. 21, prior to time t0 which is the time at which clock signal CLK rises, an external address signal and a command signal reach input/output port 10. However, the signals are entered in the DRAM synchronously with rising of the clock signal.

At time t0, the external address signal and the command signal are entered via the register circuit, and the external address signal is latched by the address latch circuit and transmitted to the redundancy control circuit for redundancy judgement. In parallel with the redundancy judgement, the address signal is predecoded by the predecode circuit according to the external address. A final address predecode signal in which the result of the redundancy judgment is reflected and to which an actual access is made is thus generated. Similarly, the command signal is supplied to the command decode circuit and a designated command is decoded.

At the timing at which the redundancy judgement is completed in the redundancy control circuit, the redundancy judgement result is latched and the final predecode address in which the redundancy judgement result is reflected is latched.

The command decode circuit instructs the DRAM to perform the reading operation. The internal command signal is latched and held as the latch command. The reading operation instruction by the latch command is issued for a memory cell corresponding to the final predecode address. A column selection line corresponding to the final predecode address is activated, the amplifier is activated, the read data is latched, and the read data is thus output to the input/output port at the rise time of the clock signal at time t2.

In the clock synchronous enter mode, it takes two clocks to actually transmit the output data to the input/output port in response to the command signal designating the reading operation transmitted from the logic circuit portion.

Figure 22:
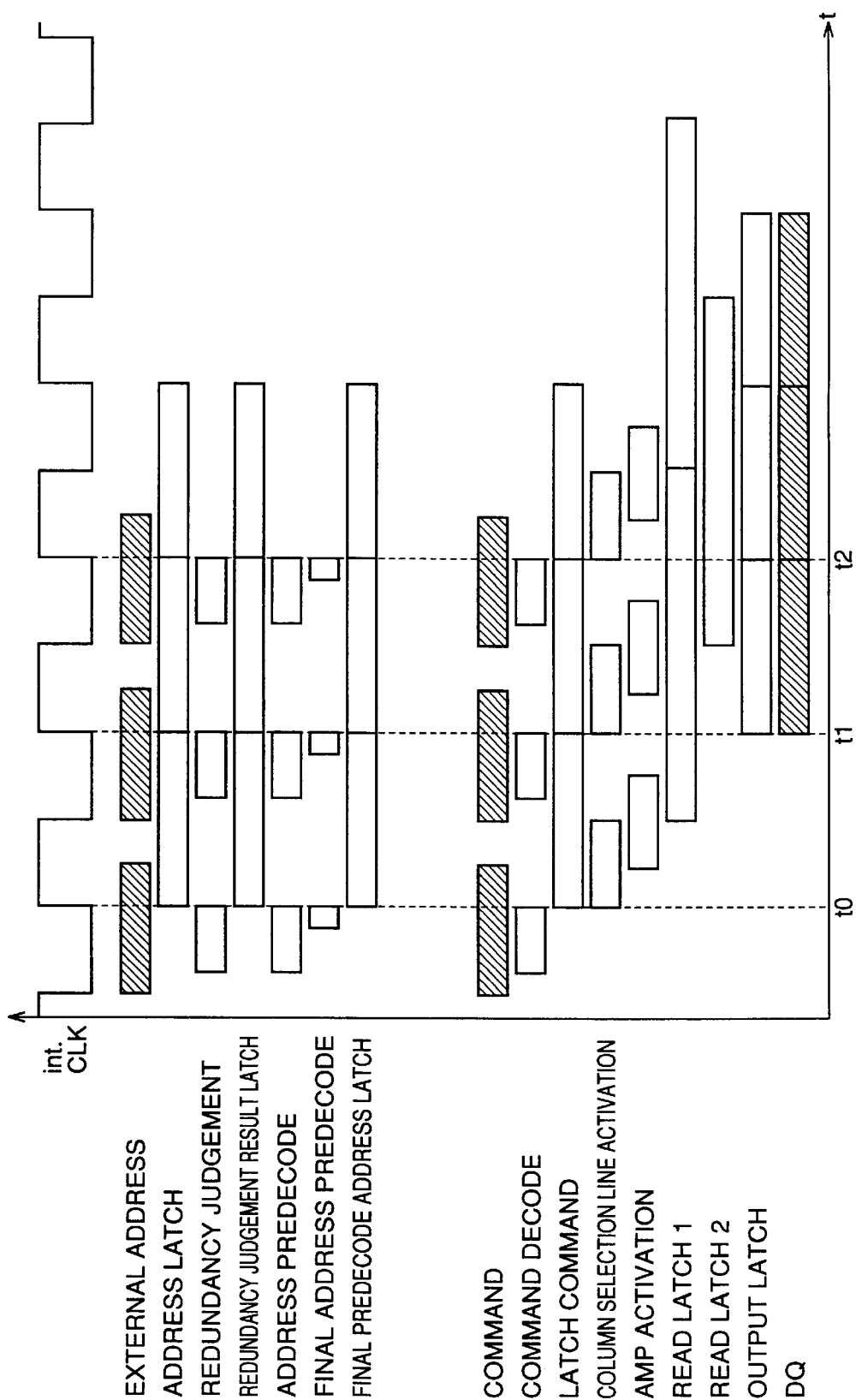
FIG. 22 is a timing chart illustrating a reading operation cycle when the access mode is the direct enter mode.

FIG. 22 is a timing chart illustrating a reading operation cycle when the access mode is the direct enter mode.

Referring to FIG. 22, in the direct enter mode, an external address signal and a command signal transmitted to the input/output port prior to rising of the clock signal at time t0 are directly entered into the DRAM at the same timing as described with reference to FIG. 5 without passed through the register circuit.

Therefore, at time t0 at which the clock signal actually rises, redundancy judgment by the redundancy control circuit, the address predecode by the predecode circuit, and the command decode by the command decode circuit have already been completed. At time t0, in synchronization with the clock signal, the latch address, the redundancy judgement result, the final predecode address and the latch command are latched.

In the direct enter mode, it is possible to start activation of a column selection line at time t0, and accordingly activation of the amplifier, reading and latching of the read data can successively be executed.

The timing at which the output data is supplied to the input/output port is thus the time t1 which is the next rise time of the clock signal. Specifically, in the direct enter mode, after the command signal is supplied by the logic circuit portion, the time required to output the read data to any external unit is one clock.

According to the comparison between the clock synchronous enter mode and the direct enter mode, the direct enter mode achieves a higher speed operation.

Figure 23:
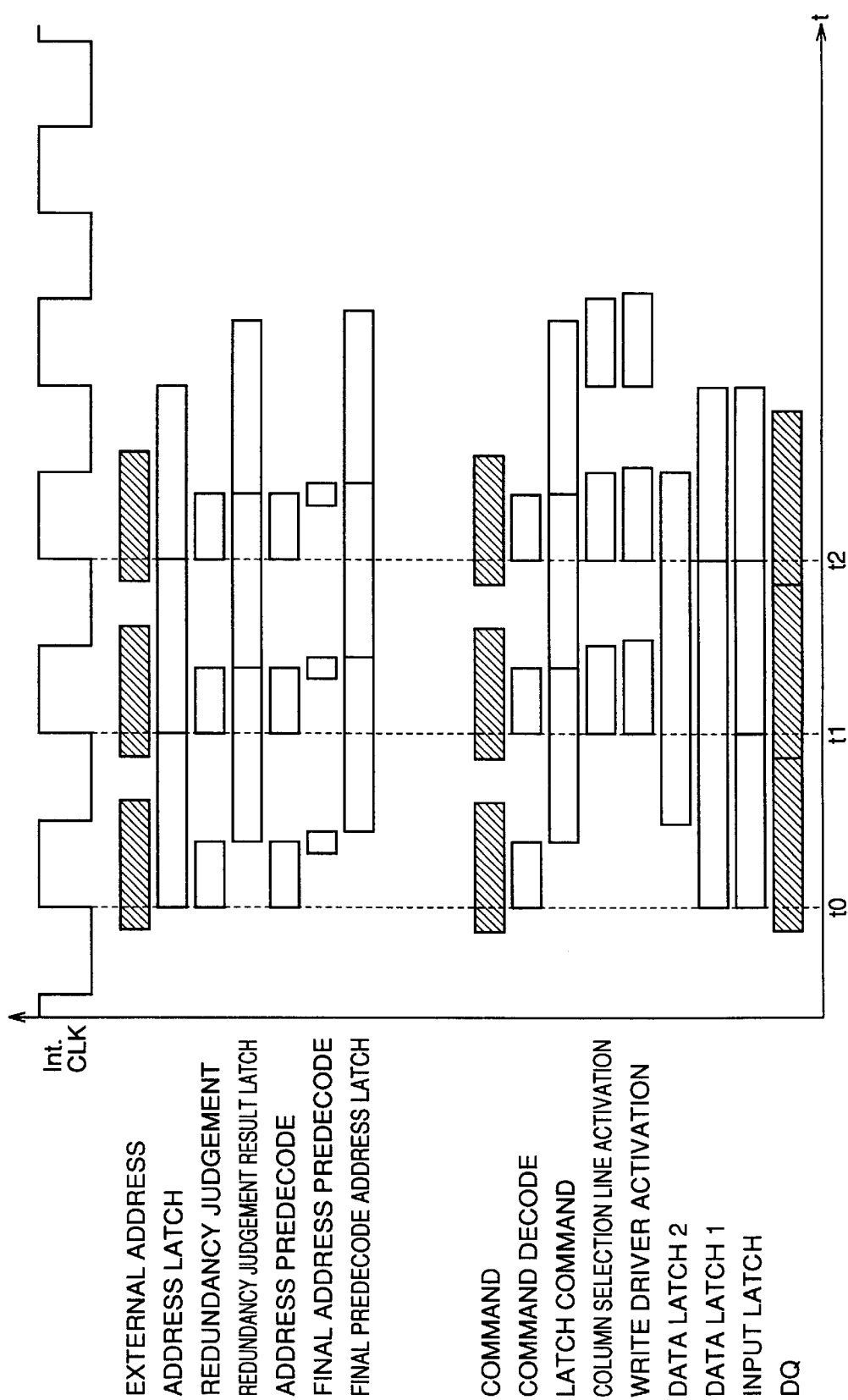
FIG. 23 is a timing chart illustrating a writing operation cycle when the access mode is the clock synchronous enter mode.

FIG. 23 is a timing chart illustrating a writing operation cycle when the access mode is the clock synchronous enter mode.

Referring to FIG. 23, in the clock synchronous enter mode, at the time t0 which is the rise time of the clock signal, an external address signal and a command signal supplied by the logic circuit portion are entered in the DRAM portion as described with reference to FIG. 21.

At time t0, redundancy judgment by the redundancy control circuit, predecode of the address by the predecode circuit and the like are started in the DRAM. When the redundancy judgement and the address predecode are completed, the result of redundancy judgement as well as a final address predecode signal in which the redundancy judgement result is reflected are obtained and the final predecode address signal is latched. The command decode circuit decodes the state in which the writing operation is designated and the resultant one is latched as the latch command.

An activation command of the column selection line cannot be generated in actual until the address is defined. Therefore, it is required to wait until time t1 of the next clock signal activation for starting the actual writing operation.

In other words, if the command signal is supplied by the logic circuit portion for designating the writing operation at time t0, the actual writing operation is started at time t1 by activation of the column selection line in the clock synchronous enter mode.

Figure 24:
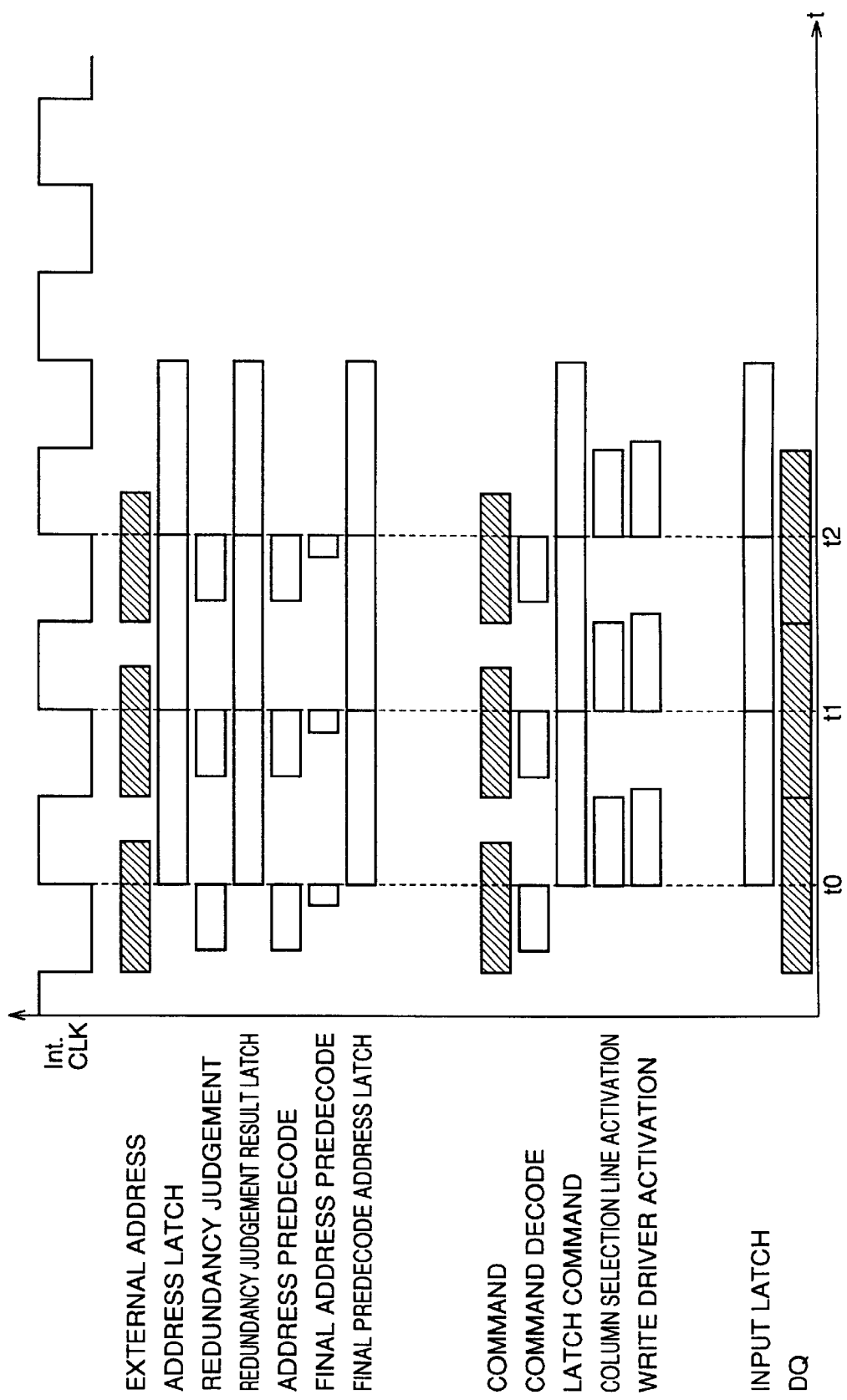
FIG. 24 is a timing chart illustrating a writing operation cycle when the access mode the is the direct enter mode.

FIG. 24 is a timing chart illustrating a writing operation cycle when the access mode is the direct enter mode.

Referring to FIG. 24, in the direct enter mode, preceding time to which is the activation timing of the clock signal, an external address signal, a command signal and a write data signal are entered as described with reference to FIG. 22. At time to which is the rise time of the clock signal, the redundancy judgement, address predecode, and command decode operations are completed and a final predecode address in which the redundancy judgement is reflected has already been generated.

From time t0, an activation command for a column selection line can be generated by using the final predecode address to start the writing operation in response to activation of the write driver.

In the direct enter mode, the writing operation can be started at the activation timing of the clock signal to enhance the speed of the writing operation since the address signal and the command signal are entered prior to the rising of clock signal.

An ROWA (row ACT) operation cycle and a PC (precharge) cycle corresponding to activation of a row-related operation are described.

Figure 25:
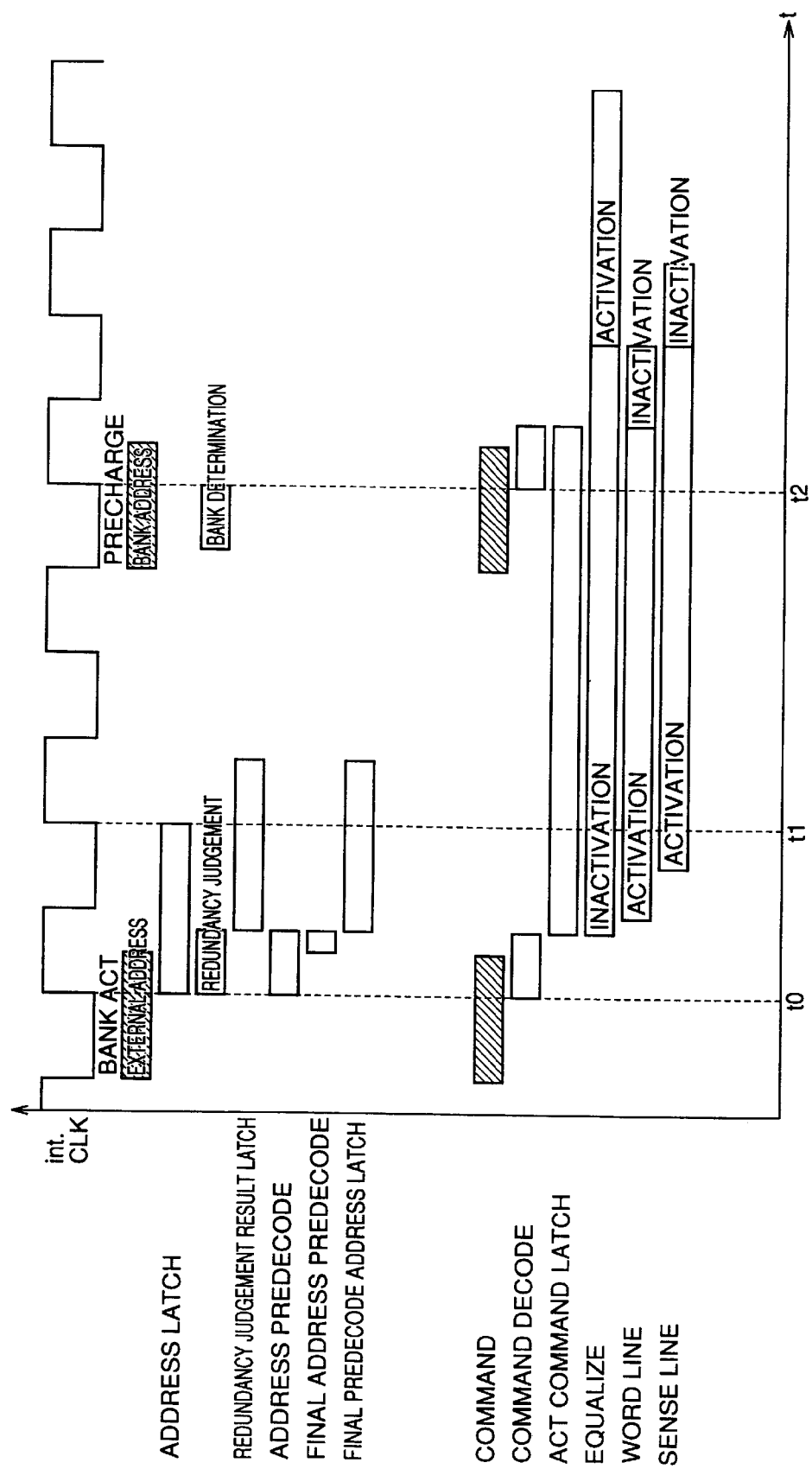
FIG. 25 is a timing chart illustrating a row ACT operation cycle and a precharge operation cycle in the clock synchronous enter mode.

FIG. 25 is a timing chart illustrating a row ACT cycle and a precharge cycle when the access mode is the clock synchronous enter mode.

Referring to FIG. 25, in the clock synchronous enter mode, an external address signal and a command signal supplied from the logic circuit portion are entered at the time t0 and transmitted to the predecode and the command decode circuits.

According to a supplied row address, address predecode and redundancy judgement are carried out, the redundancy judgement result is latched, and the final address in which the redundancy judgement result is reflected is predecoded and the result is latched. The actual command can now be executed by predecode of the final address, and accordingly the ROWA operation is started in response to the latch command.

In the row ACT operation, an equalize operation is first inactivated in order to activate a word line. After the equalize operation is inactivated, the word line is activated and a sense line is activated for amplifying read data. Row-related activation operations are thus carried out.

At time t2, the logic circuit portion gives an instruction for effecting a precharge operation, and a bank address for executing the precharge operation is transmitted. At time t2, in synchronization with rising of the clock signal, the bank address and the command signal are entered. Based on the entered address, the command decode is carried out. When the command decode is completed, inactivation of the word line is started for starting the precharge operation. When inactivation of the word line is completed, the sense line is inactivated to execute the precharge operation.

Figure 26:
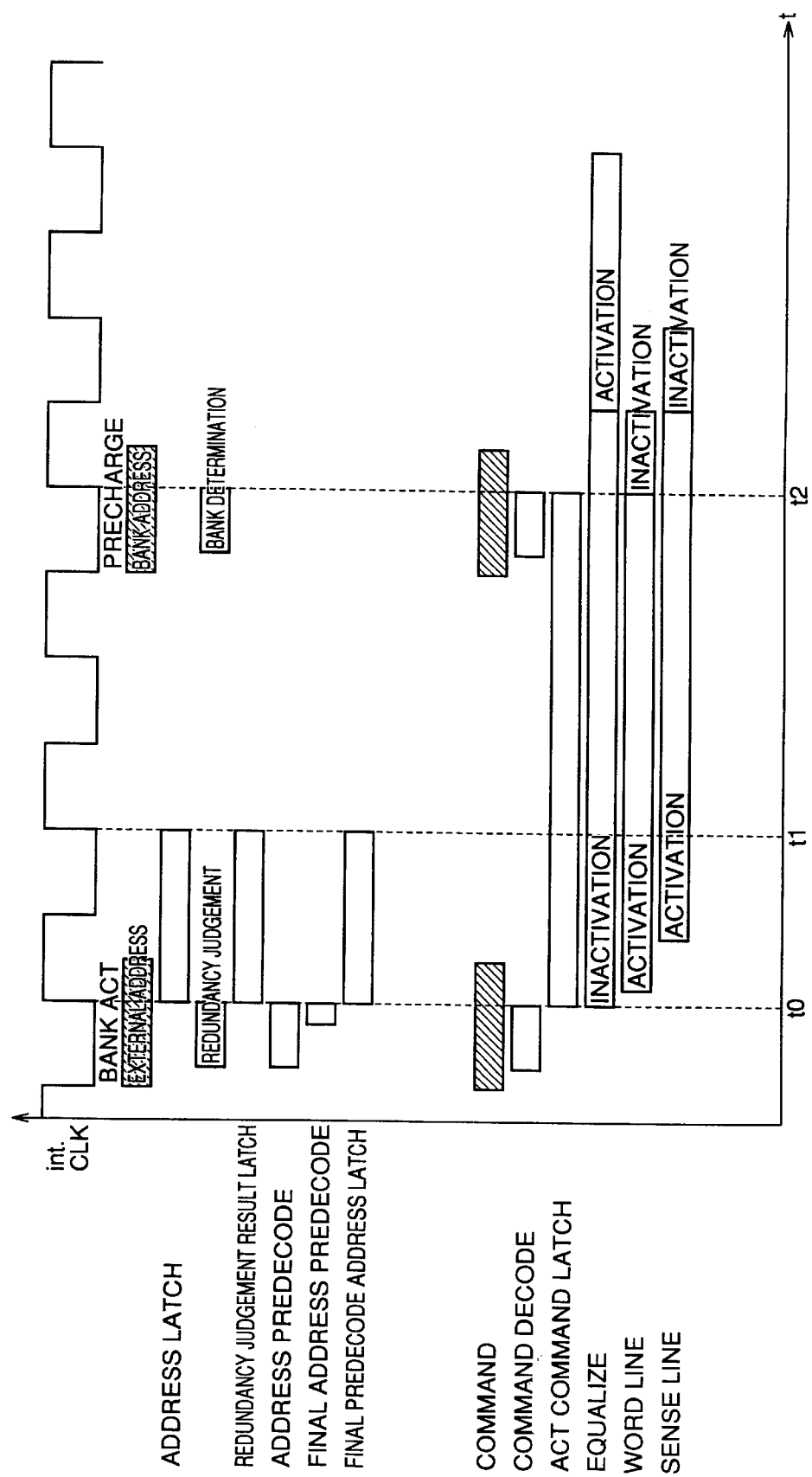
FIG. 26 is a circuit diagram illustrating the row ACT operation cycle and the precharge operation cycle in the direct enter mode.

FIG. 26 is a timing chart illustrating cycles of the row ACT operation and the precharge operation when the access mode is the direct enter mode.

In FIG. 26, compared with FIG. 25, the address signal and the command signal are externally supplied without passed through the register circuit in the direct enter mode. Therefore, at time t0 which is the rise time of the clock signal, redundancy judgement, address predecode and command decode have already been completed. At time t0, the final predecode signal has already been generated and latch is started. Accordingly, inactivation of the equalize operation is started at time t0 to start the row ACT operation.

When an instruction on the precharge operation is given, at time t2 which is the rise time of the clock signal, command decode and determination of a bank to be precharged have already been completed in the direct enter mode, so that inactivation of word line and execution of the precharge operation can be started at time t2.

In the direct enter mode, the start timing of the row ACT operation and the precharge operation can be made earlier to improve the operation speed of the entire memory.

Further, when the access mode is the direct enter mode, the reading and writing operations and the auto precharge operation can be performed within the same cycle by starting the reading and writing operation earlier after the external address signal and the command signal are entered.

Figure 27:
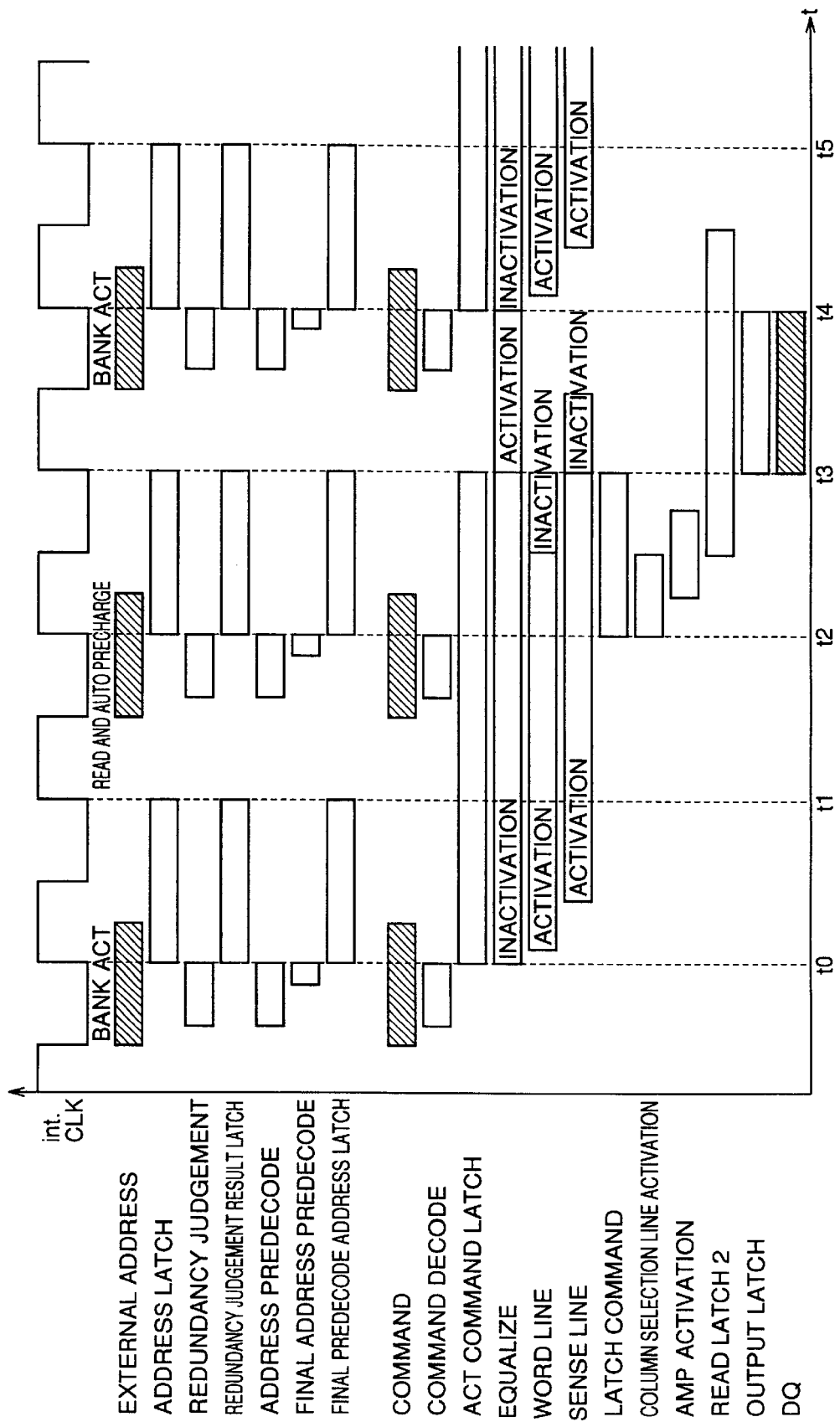
FIG. 27 is a timing chart illustrating a reading and auto precharge operation cycle which is possible when the direct enter mode is employed.

FIG. 27 is a timing chart illustrating a reading and auto precharge cycle in the direct enter mode.

Referring to FIG. 27, at time t2 which is the rise time of the clock signal, an instruction on the reading and auto precharge operation is issued by the logic circuit portion using a command signal, and the external address signal is simultaneously supplied.

As already described with reference to FIG. 22, in the direct enter mode, the reading operation can be started by activating the column selection line at time t2, and the read data can be output one clock later. Therefore, the reading operation started at time t2 is completed before time t3 which is the next rise time of the clock signal and the read data is latched.

After this timing, the word line can be inactivated to start the auto precharge operation. Accordingly, the reading operation and the auto precharge operation can be carried out simultaneously in one cycle to improve the speed of the DRAM. In this case, the reading operation and the auto precharge operation are not required to perform in different cycles respectively.

Figure 28:
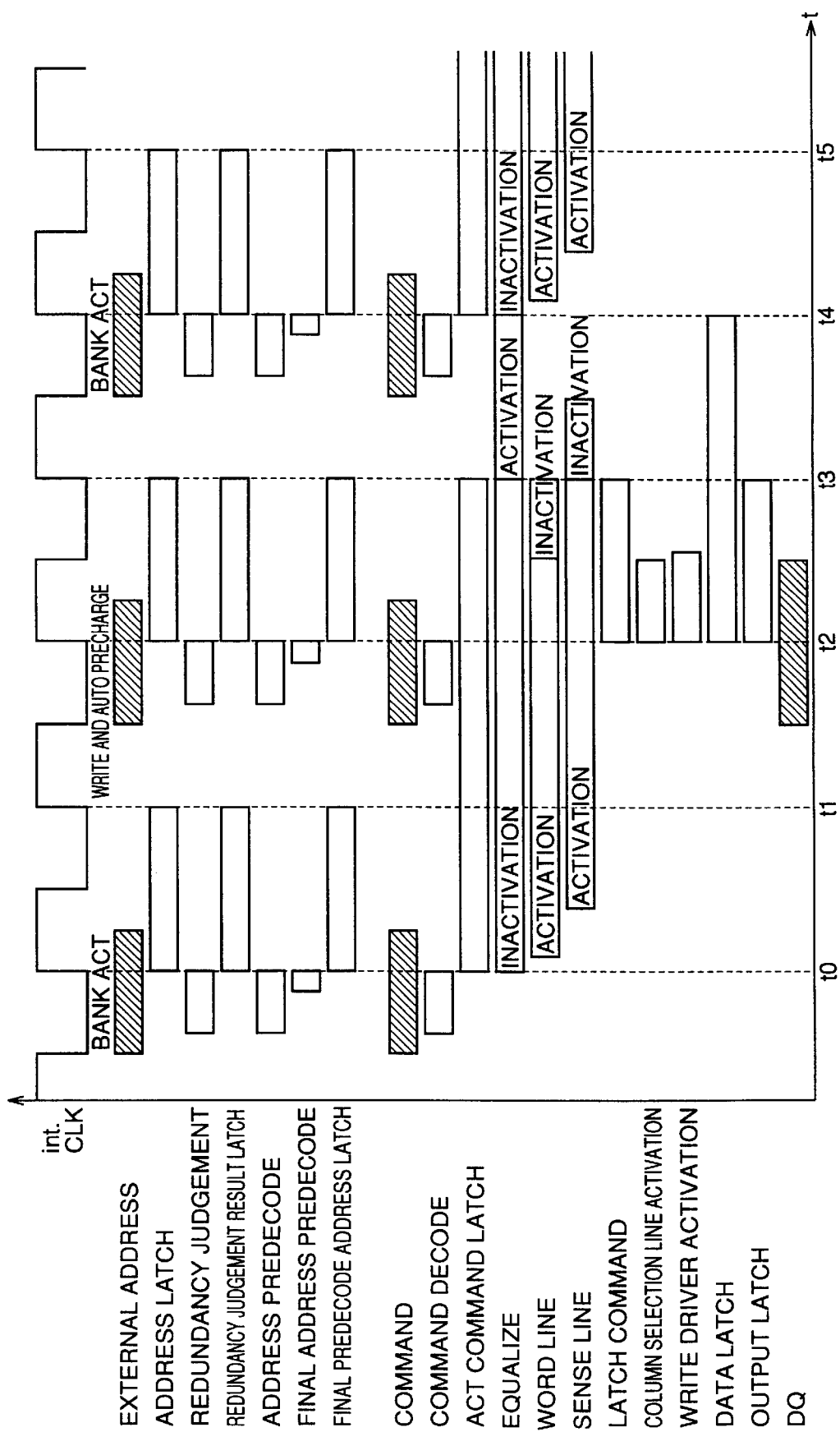
FIG. 28 is a timing chart illustrating a writing and auto precharge operation cycle which is possible when the direct enter mode is employed.

FIG. 28 is a timing chart illustrating a writing and auto precharge cycle in the direct enter mode.

Referring to FIG. 28, in response to activation of the clock signal at time t2, the logic circuit portion gives an instruction on the writing and auto precharge operation. In response to this, a command signal, an external address signal and a write data signal are externally supplied.

In the direct enter mode, activation of the column selection line can be started at time t2 which is the rise time of the clock signal to start the writing operation as described with reference to FIG. 24.

Accordingly, before time t3 which is the next activation timing of the clock signal, the writing operation is completed and inactivation of a word line is possible. Therefore, the auto precharge operation can simultaneously be executed in the same cycle. The writing operation and the auto precharge operation can be carried out in one cycle and thus the operation speed of the DRAM can be enhanced.

Figure 29:
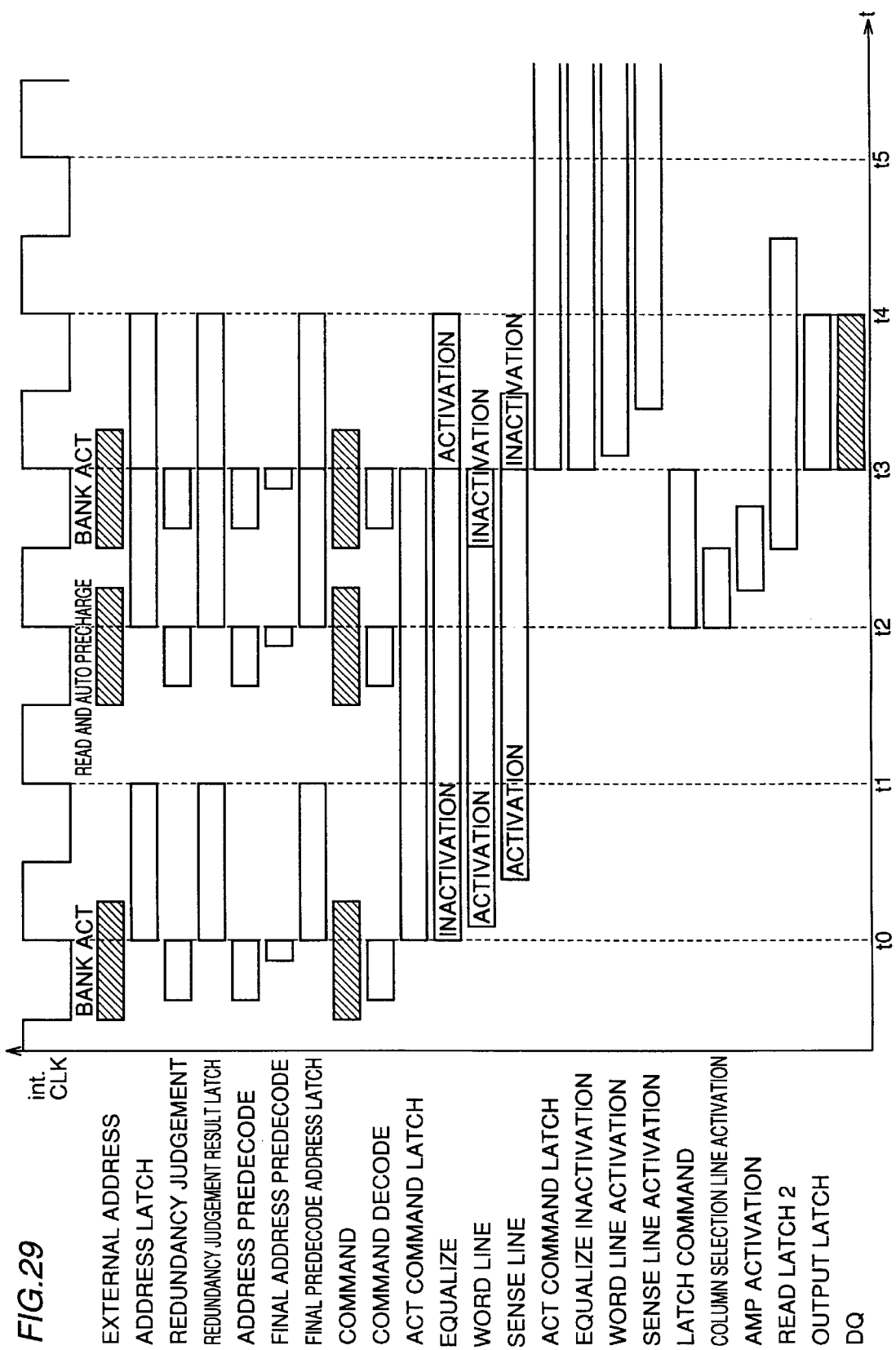
FIG. 29 is a timing chart illustrating an operation carried out, after the reading and auto precharge cycle operation is carried out in one bank in the direct enter mode, for activating another bank.

FIG. 29 is a timing chart illustrating ACT operation performed for another bank which is performed after the read and auto precharge cycle in the direct enter mode.

Referring to FIG. 29, at time t2, the logic circuit portion gives an instruction on the reading and auto precharge operation. In the same clock cycle, the reading operation is performed and the read data from a memory cell is stored in the latch circuit (read latch 2). Before time t3, inactivation of a word line is possible and the auto precharge operation can be started in the same cycle as described with reference to FIG. 27.

As shown in FIG. 29, the direct enter mode is advantageously employed to give an instruction on the ACT operation for another bank at time t3 which is the activation timing of the clock signal following the timing at which an instruction on the reading and auto precharge operation is issued. Specifically, in the operation according to the direct enter mode, the predecode circuit and the circuit for latching the predecode signal that are shared by the banks are not required to latch a decode signal, at the next rising time of the clock signal, that is the signal of one clock before.

In the direct enter mode, it is possible to give an instruction on activation, that is, the bank ACT operation for another bank in the cycle following instruction on the reading and auto precharge operation. The operation speed of the entire DRAM can further be improved.

Second Embodiment

The second embodiment is hereinafter described associated with a structure of an interface of an access signal when a test circuit is placed in the logic circuit portion of the semiconductor memory device described in conjunction with the first embodiment.

Figure 30:
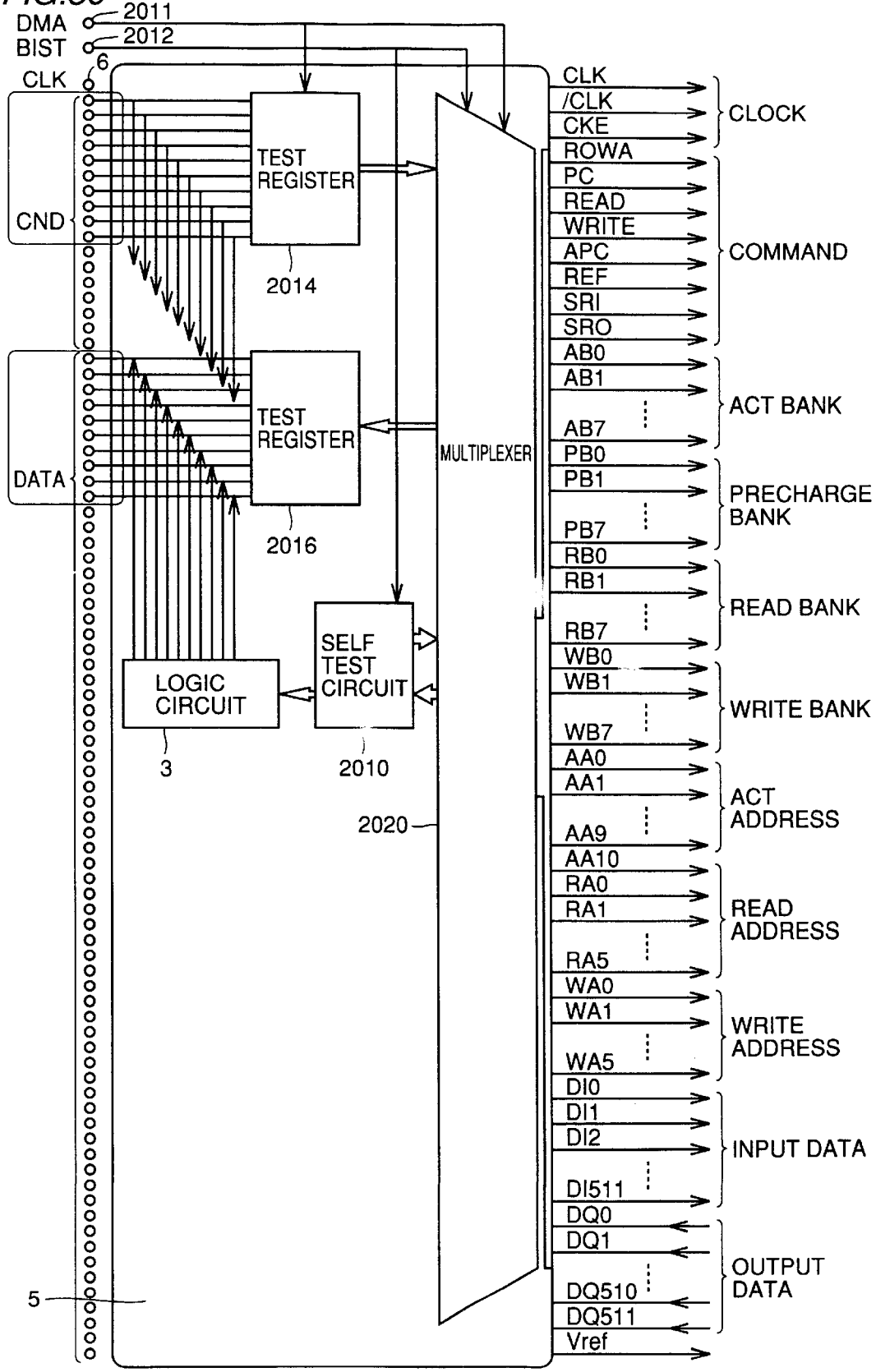
FIG. 30 is a schematic block diagram illustrating an entire structure of a semiconductor integrated circuit device 2000 in the second embodiment of the invention.

FIG. 30 is a schematic block diagram illustrating an entire structure of a semiconductor integrated circuit device 2000 in the second embodiment of the invention.

Referring to FIG. 30, different from semiconductor integrated circuit device 1000, semiconductor integrated circuit device 2000 includes, in a logic circuit portion, input terminals 2011 and 2012 receiving control signals DMA and BIST, respectively, a self test circuit 2010 for automatically performing a test in response to control signal BIST, a multiplexer 2020 for switching data between self test circuit 2010 and an input/output port 10, and test registers 2014 and 2016 for processing a command data signal and a data signal synchronously when the test is performed in relation to the multiplexer.

Control signal DMA is used for performing a test by a direct memory access (hereinafter referred to as DMA test), that is, an access externally made directly to the DRAM portion. Signal BIST is activated when a test is performed by making an access to the DRAM from the logic circuit portion by the self test circuit provided preliminary to the logic circuit portion (hereinafter referred to as self test).

Test registers 2014 and 2016 are used in the DMA test. When signal DMA is activated, the command signal and the data signal supplied from external input/output terminals for the test are transmitted between multiplexer 2020 and themselves.

Self test circuit 2010 automatically generates a command signal and a data signal based on contents of a predetermined test which is preliminary programmed in response to activation of signal BIST. When the self test is performed, these signals allow an access to be made to the DRAMl portion through multiplexer 2020.

Multiplexer 2020 is used for switching an access route from the logic circuit to the DRAM portion in the normal operation, an access route in the DMA test, and a route for maling an access from the self test circuit to the DRAM in the self test mode depending on the mode.

Figure 31:
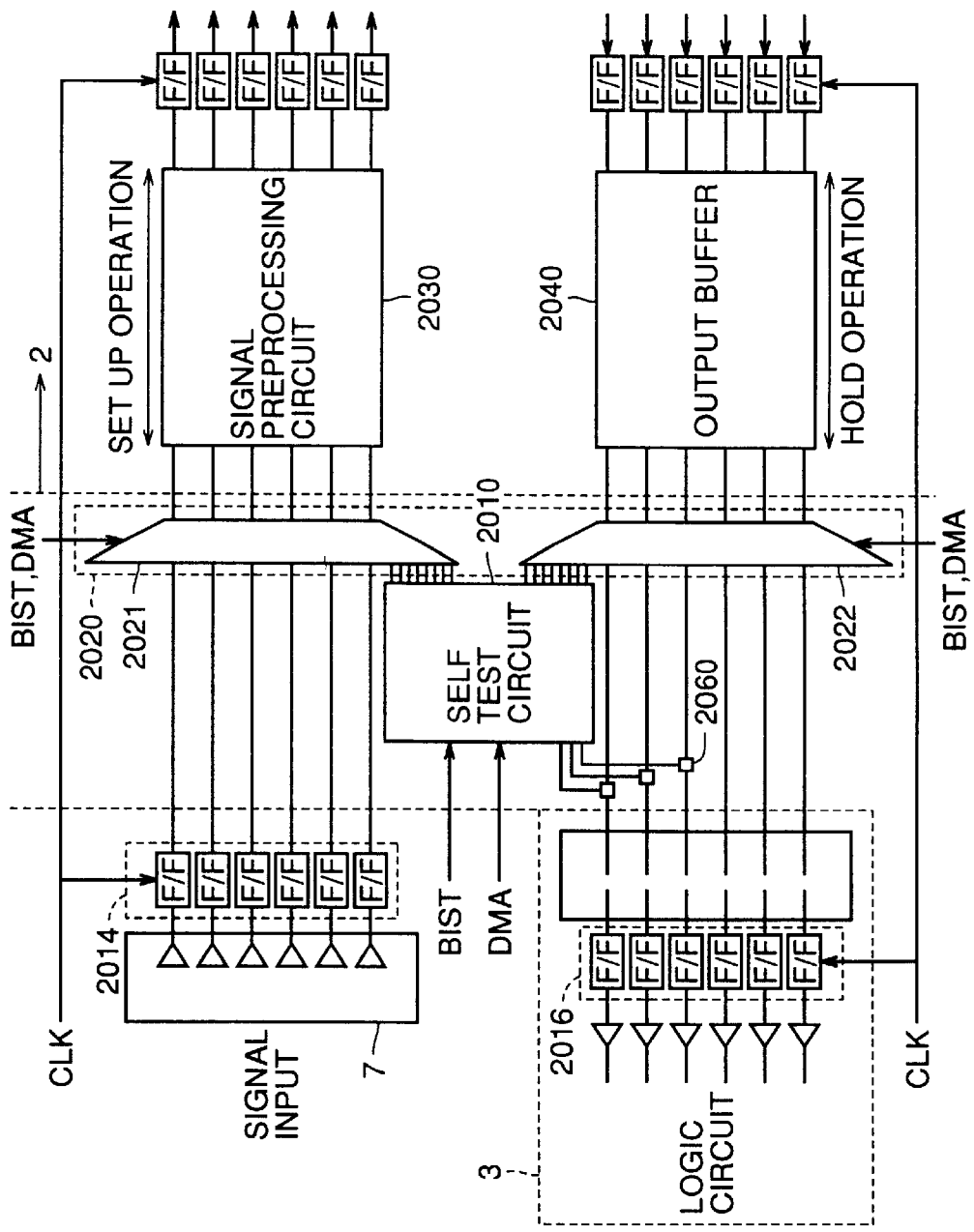
FIG. 31 is a block diagram illustrating an interface structure between a self test circuit and a DRAM portion.

FIG. 31 is a block diagram illustrating an interface structure between the self test circuit and the DRAM portion.

Referring to FIG. 31, multiplexer 2020 includes a multiplexer 2021 for selecting switching of an access to the DRAM portion, and a demultiplexer 2022 for distributing data transmitted from the DRAM portion depending on the mode.

To multiplexer 2021, test register circuit 2014 which latches the command signal when a test is performed by the DMA test, and self test circuit 2010 are connected. A command signal corresponding to the self test and a data signal to the memory are transmitted from self test circuit 2010. Multiplexer 2021 receives control signals BIST and DMA indicating the mode of the test operation, selects one of outputs of test register circuit 2014 and self test circuit 2010 in response to those signals, and transmits the selected one to a signal preprocessing circuit 2030 in the DRAM portion. Signal preprocessing circuit 2030 generally refers to a circuit which executes operations relating to redundancy judgement control, address predecode, and set up before activation of the clock signal in the DRAM portion.

The command signal and the data signal transmitted to signal preprocessing circuit 2030 are actually supplied to the DRAM portion by the register circuit in synchronization with the clock signal, and a predetermined test operation is performed based on the command signal and the data signal supplied from the test circuit.

Data obtained from the DRAM portion as a result of the test operation is transmitted through the register circuit to an output buffer 2040. The output data is held in output buffer 2040. Demultiplexer 2022 which switches the output according to control signals BIST and DMA determines whether the output is transmitted through self test circuit 2010 to the logic circuit 3 or directly transmitted to the logic circuit 3.

Data transmitted to self test circuit 2010 is inspected by self test circuit 2010 and its result is supplied to the logic circuit 3. A connection switching circuit 2060 is used for selecting whether output data of output buffer 2040 is directly supplied to the logic circuit or the output of self test circuit 2010 is transmitted to the logic circuit.

Specifically, when the self test is performed, the command signal corresponding to a predetermined test operation and the output data of the DRAM portion according to the data signal are not directly supplied to the logic circuit. Alternatively, the result obtained by inspecting whether a predetermined output data is obtained or not by the self test circuit is transmitted to a logic circuit 3. When the DMA test is performed, output data of the DRAM portion is transmitted to the external input/output terminal via a test register 2016 placed within the logic circuit portion.

In such a structure, when a test operation is performed for the DRAM portion, it is possible to arbitrarily perform a test by the direct memory access in which an access is directly made to the DRAM portion for performing the test and the self test operation in which the self test circuit provided to the logic circuit portion performs a test through a normal logic circuit.

Third Embodiment

Figure 32:
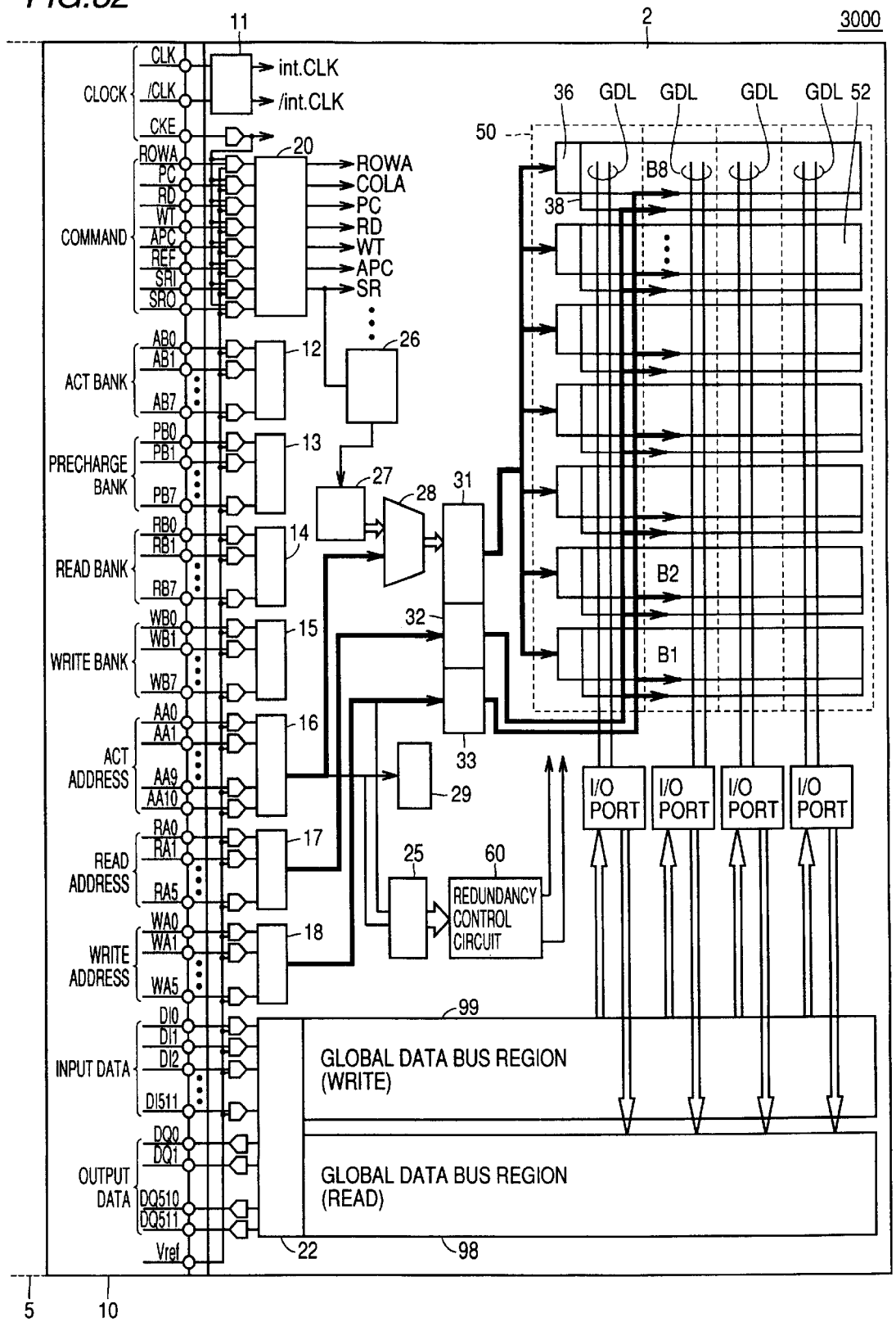
FIG. 32 is a schematic block diagram illustrating an entire structure of a semiconductor integrated circuit device 3000 in the third embodiment of the invention.

FIG. 32 is a schematic block diagram illustrating an entire structure of a semiconductor integrated circuit device 3000 in the third embodiment of the invention.

Semiconductor integrated circuit device 3000 in the third embodiment and semiconductor integrated circuit device 1000 in the first embodiment are different from each other in a manner of arrangement of global data lines GDL in a memory cell array 50 and a manner of connection between those lines and global data buses.

Referring to FIG. 32, in semiconductor integrated circuit device 3000, each bank 52 in memory cell array 50 is divided into four regions in the column direction. In respective four regions, global data lines GDL are provided commonly to all banks. Global data lines GDL are connected to global data bus regions via I/O ports 130.

In semiconductor integrated circuit device 3000, a dynamic change of shift positions is required in a redundancy repair operation for a column.

Figure 33:
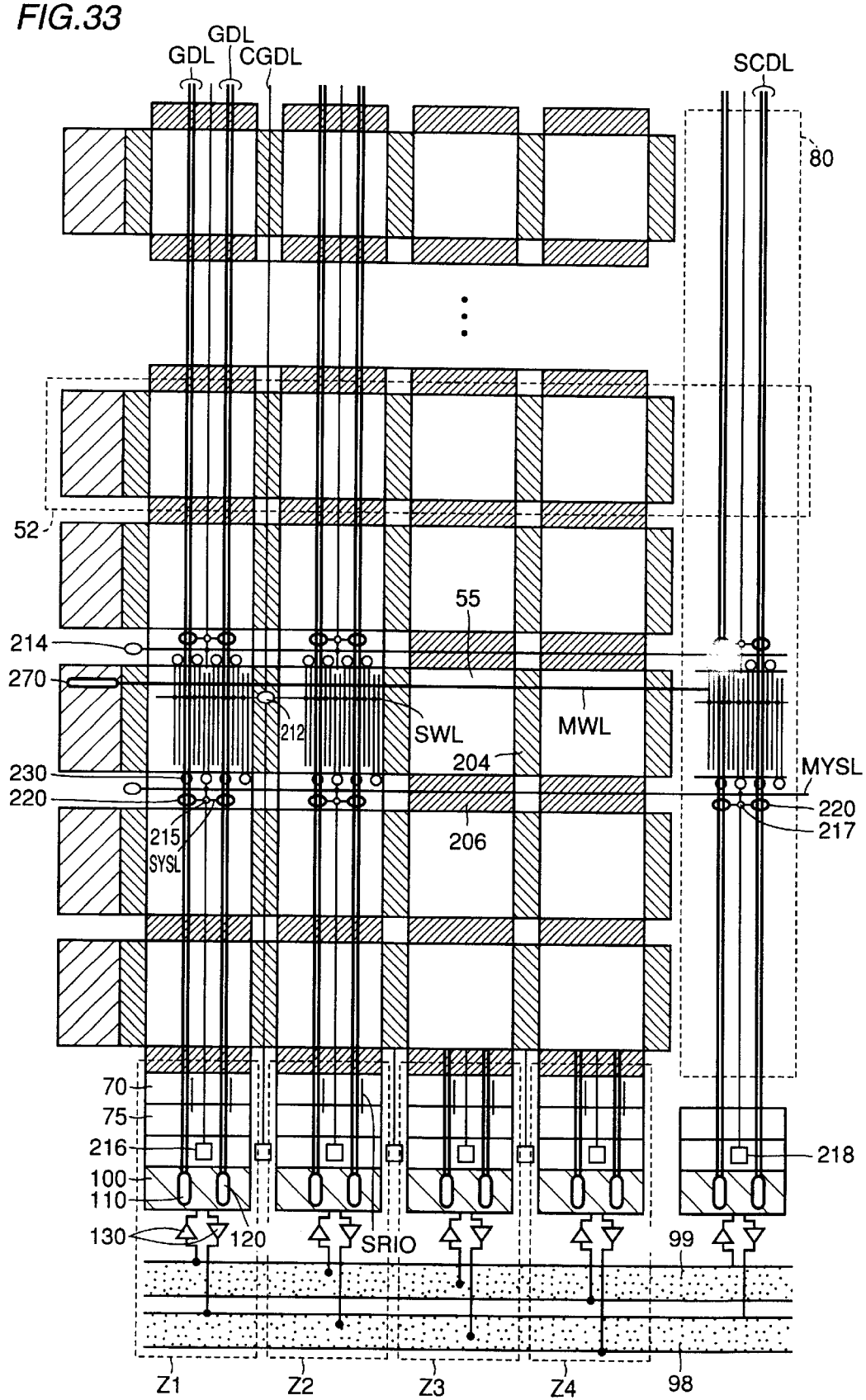
FIG. 33 is a block diagram illustrating a manner in which connection is made between data lines of a memory cell array in semiconductor integrated circuit device 3000.

FIG. 33 illustrates a manner in which data lines are connected in memory cell array 50 of semiconductor integrated circuit device 3000.

Referring to FIG. 33, connection of main word lines, sub word lines and data lines associated with column selecting operation in each bank is similar to that described with reference to FIG. 8, and description thereof is not repeated here.

The structure shown in FIG. 33 is different from that in FIG. 8 in that global data line GDL is independently arranged per eight memory cell blocks (hereinafter referred to as a block group formed of eight memory cell blocks) adjacent to each other in the column direction in semiconductor integrated circuit device 3000. Specifically, if total n global data buses are arranged, n global data lines GDL are provided in each block group, and n global data lines GDL and n global data buses are associated with each other in each of the regions Zl-Z4.

A redundant column circuit 80 is used for redundancy column repair by shift setting of data lines as the first embodiment. In the third embodiment, data line shift setting by a data line shift setting circuit 75 is different depending on the block group having a memory cell block to be accessed, even if the access is made to the same bank. Therefore, the data line shift setting for repair based on the redundant column should be changed dynamically even if it is done in the same bank. The same spare column can be shared by different banks by making it possible to change dynamically the data line shift setting for each memory cell block.

Figure 34:
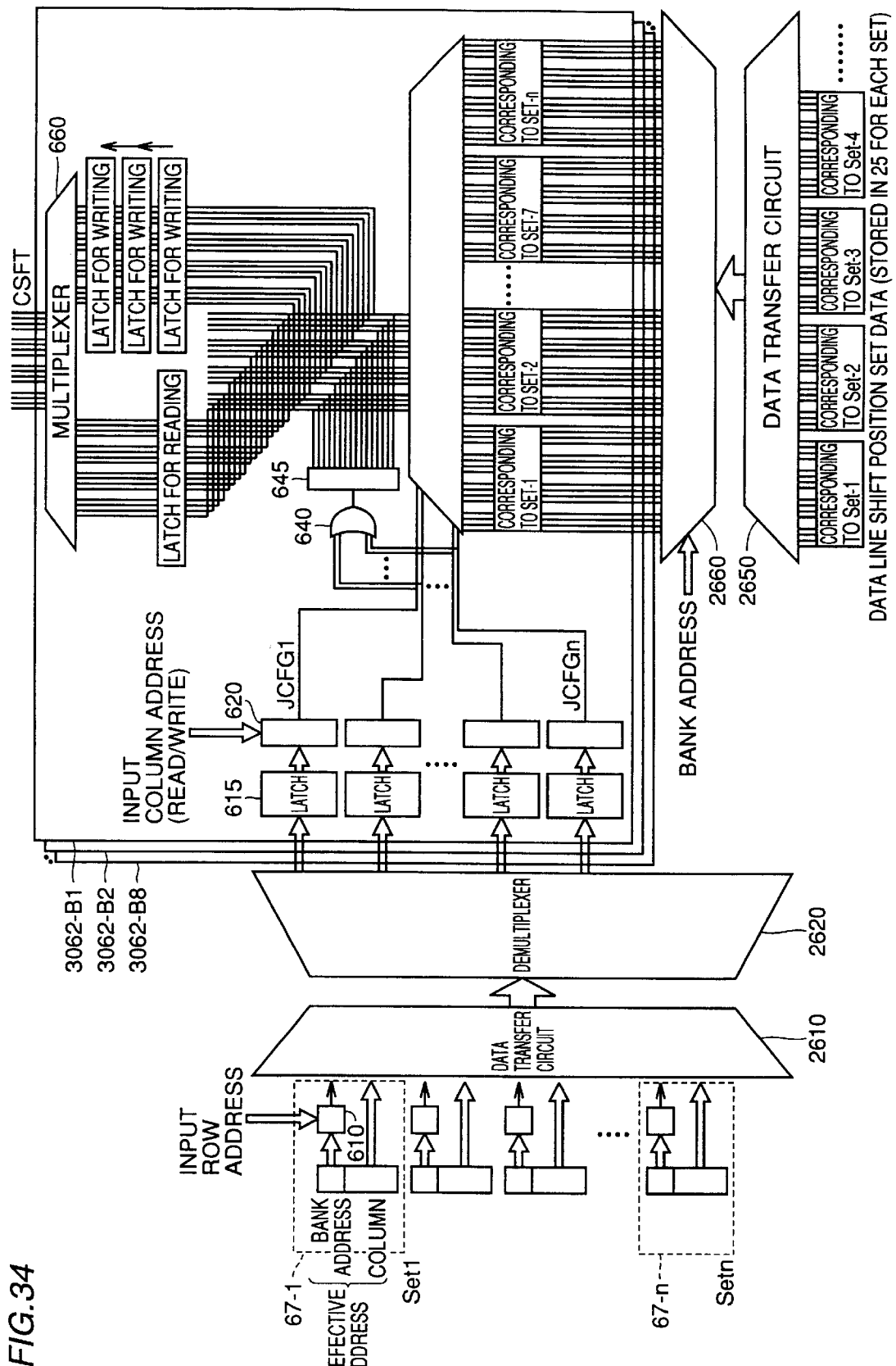
FIG. 34 is a circuit diagram illustrating a structure of a column redundancy judgement circuit in semiconductor integrated circuit device 3000.

FIG. 34 is a circuit diagram illustrating a structure of a redundancy control circuit for dynamically setting the data line shifting in the redundant column-based repair operation.

Referring to FIG. 34, the basic structure of a column redundancy control circuit 62 is similar to that in FIG. 18. In the third embodiment, units 3062-B1 to 3062-B8 are respectively provided for generating shift position setting signals CSFT for data lines associated with respective banks in order to dynamically change the data line shift setting in each bank.

Column redundancy judgement sets 67-1 to 67-n included in an address redundancy programming circuit 25 store respectively column addresses and bank addresses corresponding to any defective memory cells occurred therein.

In response to reading of an address signal, an input bank address is first compared with a bank address corresponding to a defective column address stored in a corresponding column redundancy judgement set in a matching compare circuit 610. If the bank addresses match with each other, the corresponding defective column address stored in the column redundancy judgement set is transferred to a data transfer circuit 2610.

A similar operation is performed by each column redundancy judgement set. The defective column address supplied to the data transfer circuit is transmitted to a demultiplexer 2620. Demultiplexer 2620 distributes the defective column address to a shift setting control signal generation unit 3062 of a corresponding bank in response to the bank in response to the bank signal.

The shift position setting data stored for each column redundancy judgement set in address redundancy programming circuit 25 is supplied to a data transfer circuit 2650. Data transfer circuit 2650 carries out an operation similar to that of data transfer circuit 2610 described above, and only the data line shift position setting data corresponding to a defective column having the bank address which matches with the input bank address is transmitted to a demultiplexer 2660.

Demultiplexer 2660 receives an input bank address to transmit data line shift position setting data to a shift setting signal generation unit corresponding to the bank similarly to demultiplexer 2620. The operation in data line shift setting signal generation units 3062-B1 to 3062-B8 was described in conjunction with FIG. 18, and description thereof is not repeated here.

In such a circuit structure, in each bank, the data line shift position setting signal can be reflected in shift control signal CFCT supplied from the column dynamically redundancy judgement circuit for each redundant column address to dynamically change shift setting of the first and second shift circuits. Accordingly, the structure is advantageous compared with the conventional scheme according to which an instruction on the shift operation is directly controlled by any non-volatile information such as electric fuse. Specifically, even if a part of memory cell blocks included in the same bank is connected individually to the global data bus, the column redundant circuit can be shared by the same bank and thus an efficient column redundancy repair is possible.

Fourth Embodiment

In the fourth embodiment, a timing at which an address signal is externally entered is designated as an address mode in a DRAM having a structure of a memory cell array similar to that of the third embodiment.

Figure 35:
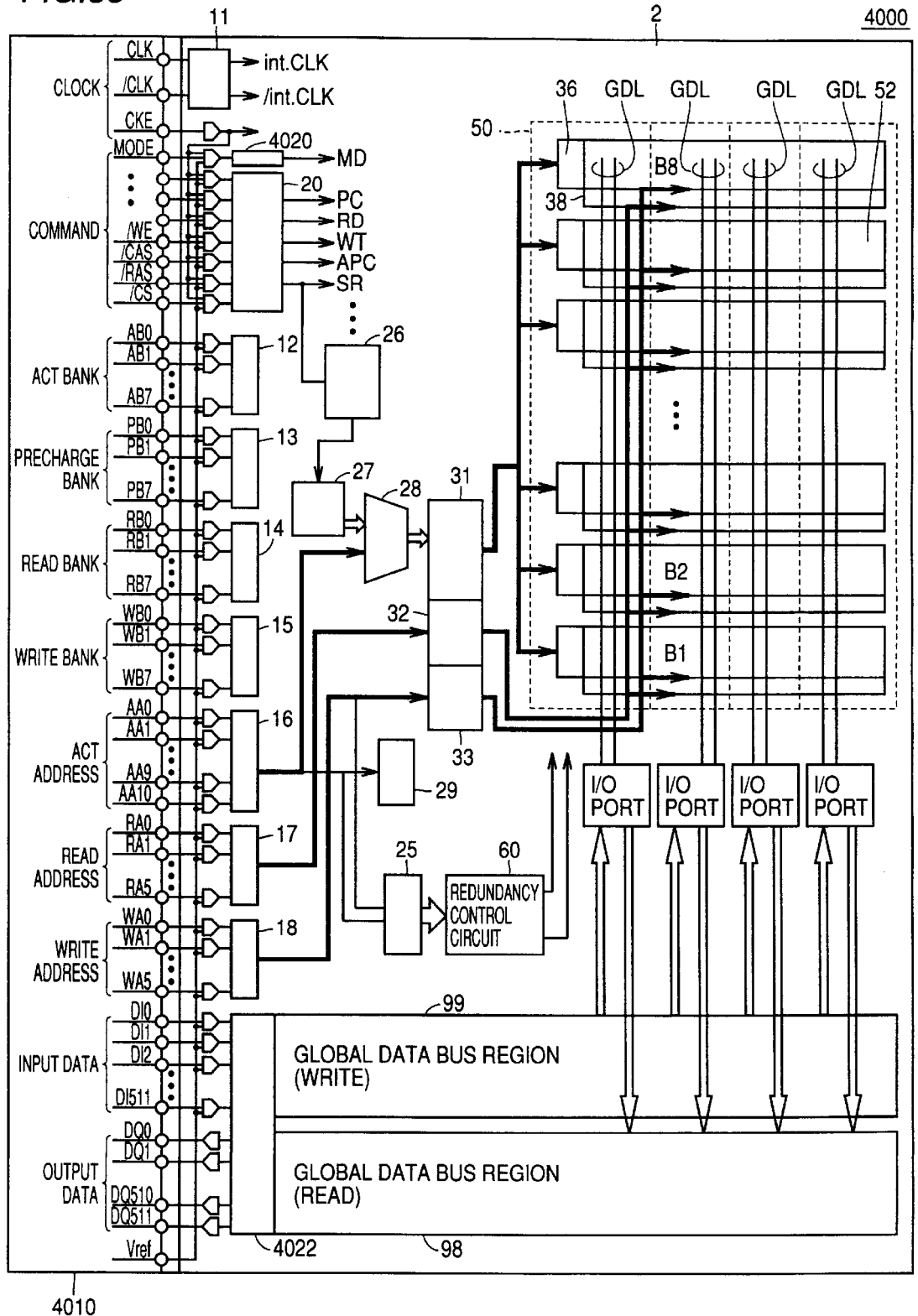
FIG. 35 is a circuit diagram illustrating an entire structure of a semiconductor memory device 4000 in the fourth embodiment of the invention.

FIG. 35 is a schematic block diagram illustrating an entire structure of a semiconductor memory device 4000 in the fourth embodiment of the invention.

The structure of semiconductor memory device 4000 shown in FIG. 35 is different from the structure of DRAM portion 2 of semiconductor integrated circuit device 3000 in the third embodiment in that each signal is externally supplied directly to an input/output port 4010, and a signal MODE for designating an address mode is input as one of external commands. Signal MODE for designating the address mode is supplied to a mode decode circuit 4020 and an address mode signal MD is generated.

The address mode includes a normal address mode according to which an address signal is entered simultaneously with a command signal at a clock signal activation timing if the command signal is activated, as a normal DRAM, and an address pre-entrance mode according to which address signal is entered each time the clock signal is activated regardless of activation of the command signal.

In the normal address mode, the command signal and the address signal are entered at the same clock timing. In the address pre-entrance mode, the address signal is entered in the semiconductor memory device substantially one clock earlier than input of the command signal.

Semiconductor memory device 4000 further includes a data conversion circuit 4022 performing a serial to parallel conversion and a parallel to serial conversion for data in order to achieve a double data rate operation which improves the data processing performance by converting data signals that are input and output to and from any external unit as serial data to parallel data and processing them collectively, instead of data buffer circuit 22 in semiconductor integrated circuit device 3000.

Figure 36:
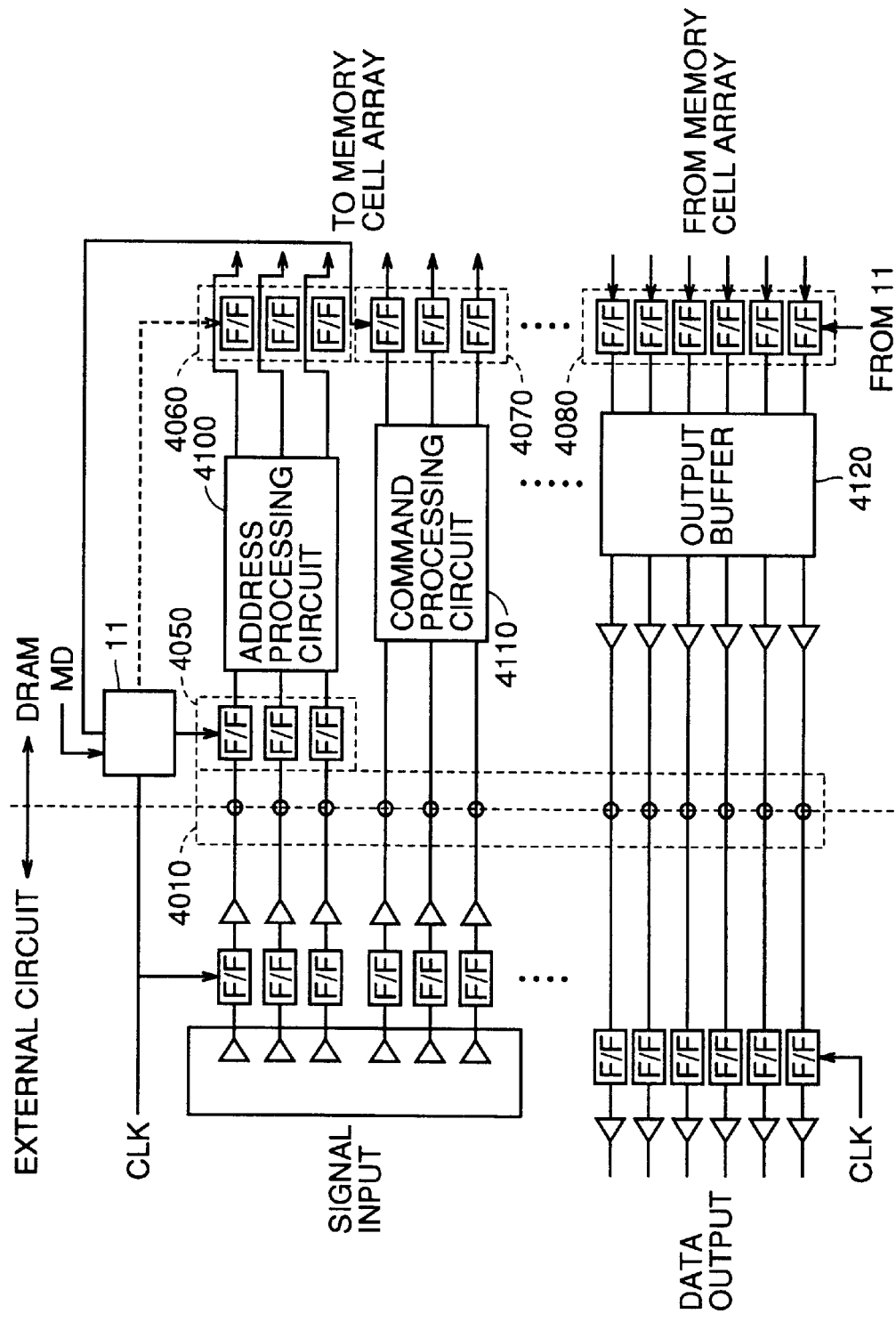
FIG. 36 is a block diagram illustrating input of an externally supplied access signal in a normal address mode.

FIG. 36 is a block diagram illustrating an operation of an interface portion in the normal address mode.

Referring to FIG. 36, a command signal and a data signal are externally supplied to input/output port 4010 synchronously with the clock signal. Semiconductor memory device 4000 includes an address processing circuit 4100 and a command processing circuit 4110 in the interface portion. Address processing circuit 4100 generally refers to circuits receiving externally supplied address signals and predecoding them. Similarly, command processing circuit 4110 generally refers to circuits receiving externally supplied command signals, and decoding and latching them.

The address signal supplied to input/output port 4010 is transmitted to address processing circuit 4110 through a register circuit 4050 which operates synchronously with the clock signal. No register circuit is placed between input/output port 4010 and command processing circuit 4110. Outputs of address processing circuit 4100 and command processing circuit 4110 are respectively transmitted to the memory cell array (row selection circuit 36 and column selection circuit 38) through register circuits 4060 and 4070. An internal clock signal generation circuit 11 within semiconductor memory device 4000 receives an external clock signal used for externally supplying signals to generate an internal clock signal Int.CLK which is synchronous with the external clock signal.

For the interface portion, internal clock signal generation circuit 11 transmits an internal clock signal to each register circuit. Address mode signal MD supplied to internal clock signal generation circuit 11 is produced b a mode decode circuit 4020 that is at H level in the normal address mode.

Internal clock signal generation circuit 11 supplies the internal clock signal or stops supply of the internal clock signal to register circuit 4060 located between address processing circuit 4100 and the memory cell array (row selection circuit 36 and column selection circuit 38) according to the state of mode signal MD.

In the normal operation mode, the address signal and the command signal are supplied to input/output port 4010 at the same timing. Therefore, the number of stages of register circuits required for transmitting the address signal and the command signal to the memory cell array (row selection circuit 36 and column selection circuit 38) should be made equal. It is not necessary to pass output data of address processing circuit 4100 through register circuit 4060 in the normal address mode.

In this case, the output of address processing circuit 4100 is not synchronized with the clock signal to be transmitted directly to the memory cell array by stopping supply of the internal clock signal from internal clock signal generation circuit 11 to register circuit 4060.

Output data transmitted from the memory cell array is passed to the data conversion circuit through a data register circuit 4080 and converted from parallel data to serial data. Accordingly, the output data is generated at input/output port 4010.

Figure 37:
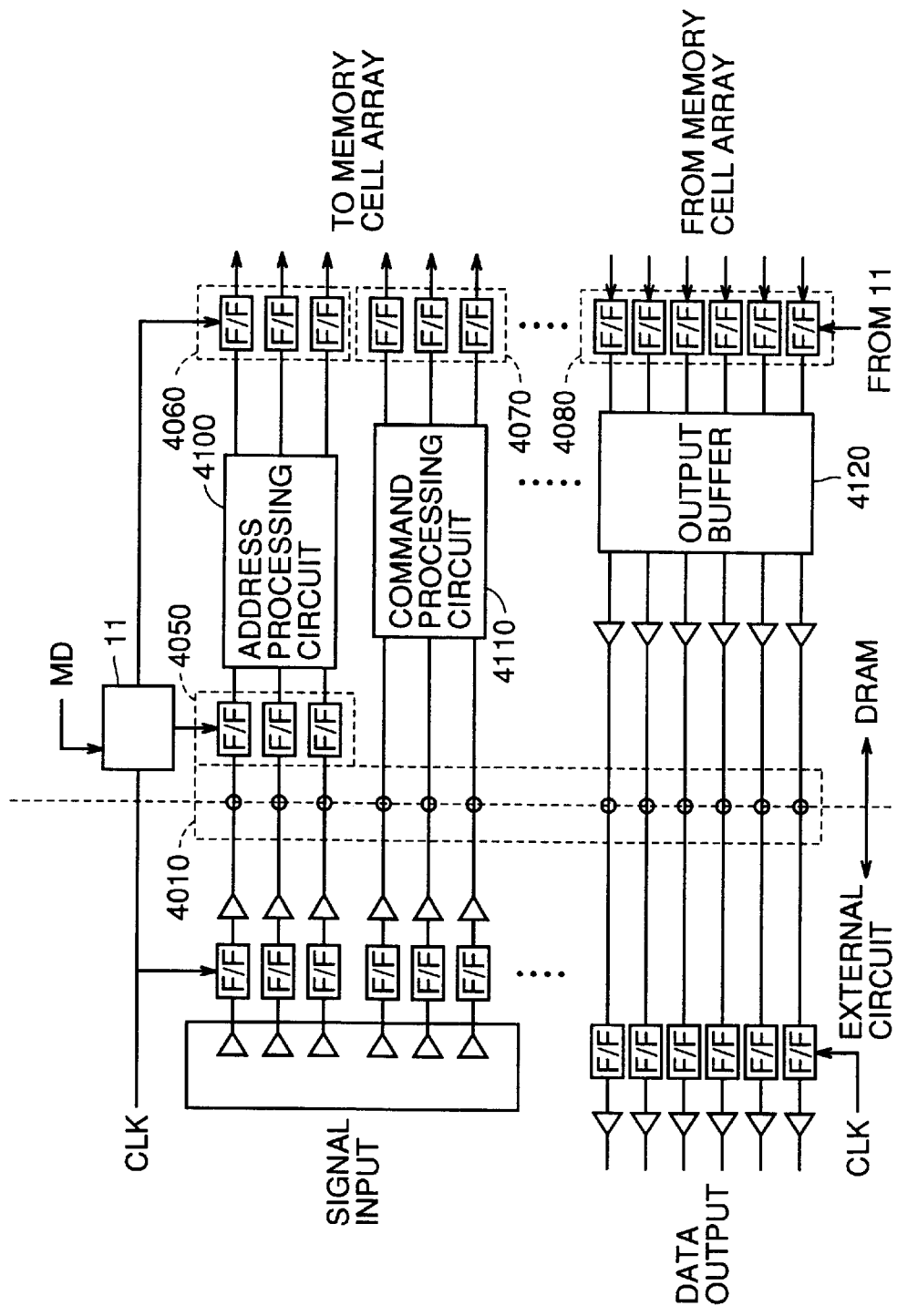
FIG. 37 is a block diagram illustrating entering of an externally supplied access signal in an address pre-entrance mode.

FIG. 37 is a block diagram illustrating an operation of the interface portion in the address pre-entrance mode.

A difference between the structures shown in FIGS. 37 and 36 is that in the address pre-entrance mode shown in the former, according to the change of mode set signal MD, internal clock signal generation circuit 11 supplies the internal clock signal to register circuit 4060, and an output of address processing circuit 4100 is held for one clock and then transmitted to the memory cell array.

In the address pre-entrance mode, regardless of generation of the command signal, the address signal is entered at each clock activation timing and thus the address signal is supplied to input/output port 4010 substantially earlier than the command signal by one clock cycle.

It is then required to hold the output of the address processing circuit for one clock cycle by register circuit 4060 in order to transmit, when a command signal is actually supplied, a corresponding command signal and an address signal in synchronization with each other to the memory cell array (row selection circuit 36 and column selection circuit 38).

The address signal and the command signal can thus be synchronized with each other in the interface portion in any address mode by supplying the internal clock signal or stopping supply of the internal clock signal to register circuit 4060 depending on address mode signal MD.

Regarding output of data, the output interface structure is the same in the normal address mode and the address pre-entrance mode, and description does not repeated here.

Figure 38:
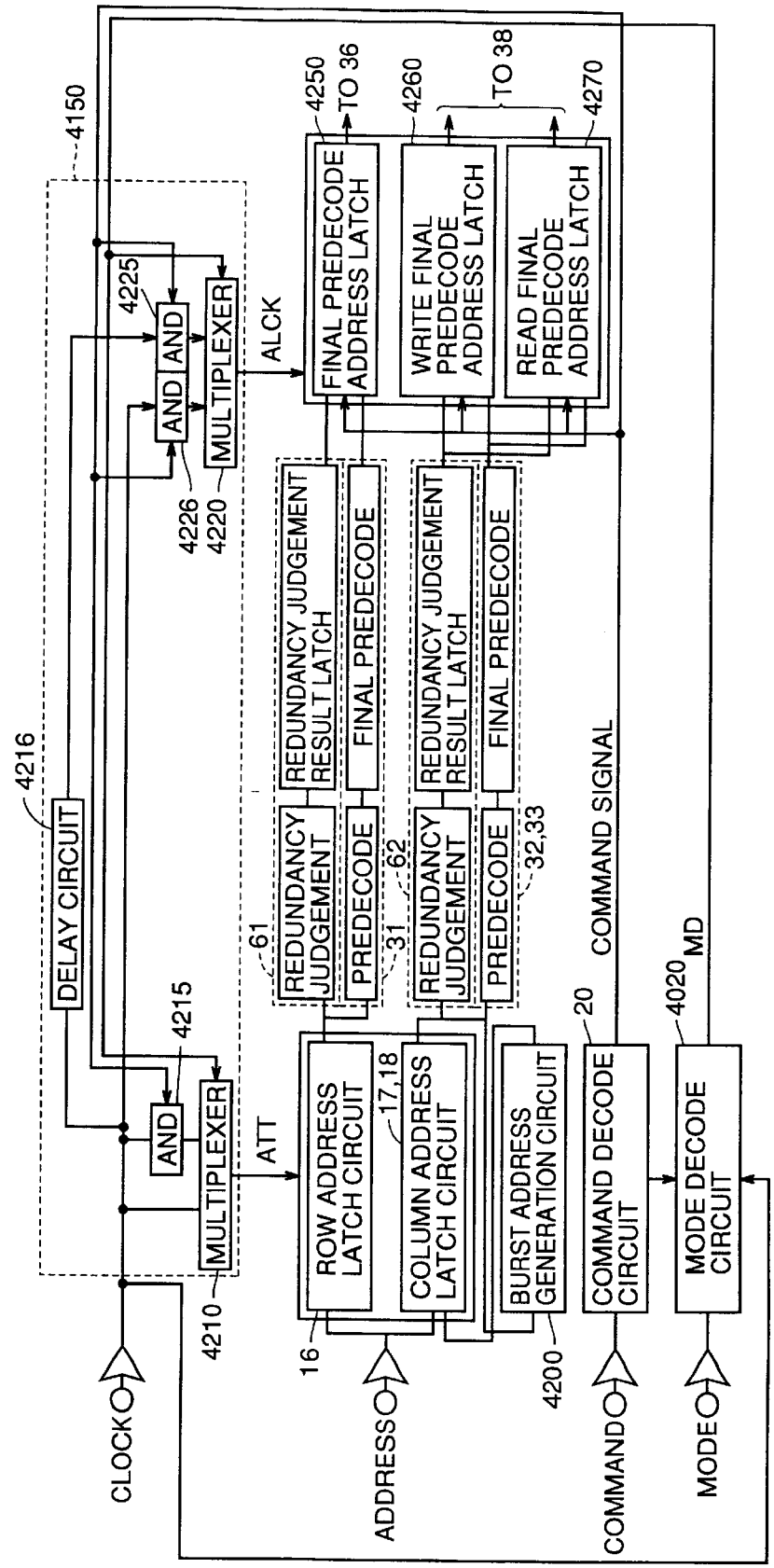
FIG. 38 is a block diagram illustrating switching of an address processing timing according to switching of an address mode.

FIG. 38 is a block diagram illustrating switching of the address processing timing according to switching of the address mode.

Referring to FIG. 38, semiconductor memory device 4000 includes mode decode circuit 4020 to which an address mode designation signal MODE is entered synchronously with the clock signal to generate a mode set signal MD, a command decode circuit 20 decoding the command signal supplied from the input/output port and generating a command signal, and a trigger signal generation circuit 4150 generating an address enter trigger ATT corresponding to the address mode and a predecode address latch clock ALCK indicating the timing at which the predecode addresses is latched.

Trigger signal generation circuit 4150 includes a multiplexer 4210 generating address enter trigger signal ATT, and an AND circuit 4215 having two inputs of the clock signal and the command signal. Multiplexer 4210 receives an output of AND circuit 4215 and the clock signal and outputs any one of them as address enter trigger signal ATT according to mode signal MD.

In the normal address mode, the output of AND circuit 4215 is used as address enter trigger signal ATT. Accordingly, a row address latch circuit 16 and column address latch circuits 17 and 18 receive the address signal when both of the clock signal and the command signal are activated. In the address pre-entrance mode, the clock signal is directly supplied as address enter trigger signal ATT. Each address latch circuit receives the address signal at each clock signal activation timing and latches it.

The address signal latched by row address latch circuit 16 is transmitted to a row redundancy control circuit 61 and a row predecode circuit 31. In respective circuits, redundancy judgement, latching of redundancy judgement result, predecoding of the address signal, latching of a final predecode signal in which the redundancy judgement result is reflected are carried out.

The address signal latched by column address latch circuits 17 and 18 is transmitted to a burst address generation circuit 4200. Burst address generation circuit 4200 generates a burst address by successively counting up the address based on the latched column address. The generated burst address by burst address generation circuit 4200 is transmitted to column redundancy control circuit 62, a write column predecode circuit 32, and a read column predecode circuit 33. In column redundancy control circuit 62, redundancy judgement and latching of redundancy judgement result are carried out according to the column address. In the predecode circuit, the column address signal is predecoded and a final predecode signal in which the redundancy judgement result is reflected is latched.

The result of redundancy judgment by column redundancy control circuit 62 and the output of row predecode circuit 31 are transmitted to a final predecode address latch circuit 4250. Similarly, redundancy judgement result which is the output of column redundancy control circuit 61 as well as a final predecode signal which is outputs of column decode circuits 32 and 33 are transmitted to a write final predecode address latch circuit 4260 and a read final predecode address latch circuit 4270.

Final predecode address latch circuit 4250, write final predecode address latch circuit 4260 and read final predecode address latch circuit 4270 are operated in synchronization with address latch clock signal ALCK generated by trigger signal generation circuit 4150.

Address latch clock signal ALCK is generated as an output of multiplexer 4220. Multiplexer 4220 receives an output of an AND circuit receiving the clock signal and the command signal as two inputs and an output of an AND circuit 4225 receiving a clock signal passing through a delay circuit 4216 and the command signal as two inputs, and outputs any one of them as address latch clock signal ALCK according to the mode set signal MD.

The select operation of multiplexer 4220 allows a delay clock delayed by delay circuit 4216 to be output as ALCK in the normal address mode. In the address pre-entrance mode, the normal clock signal is output as the address latch clock signal if the command signal is activated.

Final predecode address latch circuit 4250 receives an input signal in response to address latch clock signal ALCK, latches a final predecode address in which the redundancy judgement result is reflected and transmits it to a row selection circuit 36.

Write final predecode address latch circuit 4260 receives an input in response to address latch clock signal ALCK if a writing operation is designated by the command signal, and latches a final predecode address corresponding to a write column in which the redundancy judgment result is reflected.

Similarly, read final predecode address latch circuit 4270 receives an input signal synchronously with the address latch clock signal ALCK if the reading operation is designated by the command signal, and latches the final predecode address related to the read column in which the redundancy judgement result is reflected. The outputs of write final predecode address latch circuit and the read final predecode address latch circuit are transmitted to column selection circuit 38.

In such a structure, it is possible to perform a predetermined operation based on an address in which the redundancy judgement result is reflected by executing predecode and redundancy judgement corresponding to the address enter timing in both of the normal address mode and the address pre-entrance mode.

Figure 39:
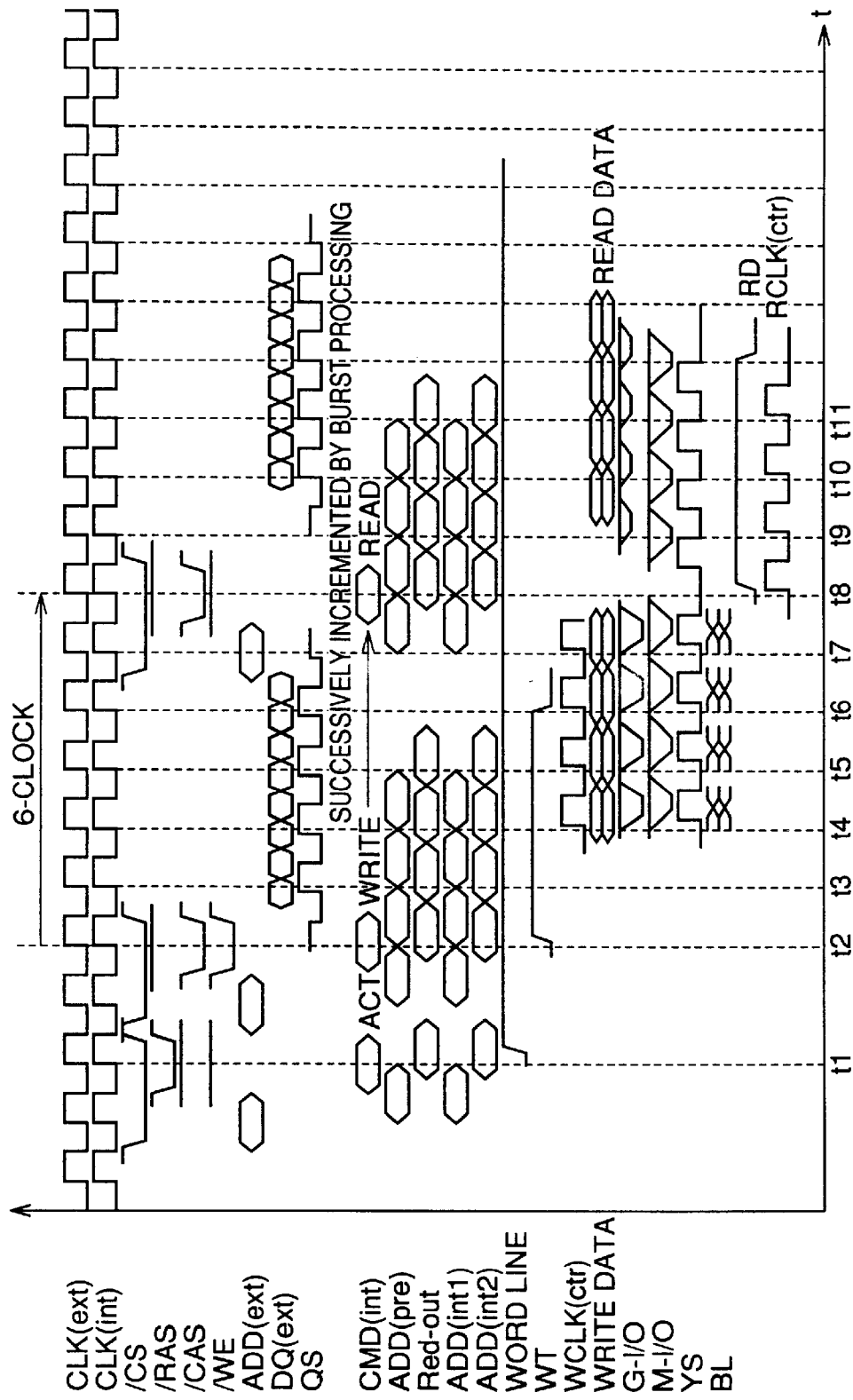
FIG. 39 is a timing chart illustrating an entire operation of semiconductor memory device 4000.

FIG. 39 is a timing chart illustrating an entire operation of semiconductor memory device 4000 in the address pre-entrance mode.

Referring to FIG. 39, at the clock activation timing of time t1, external address signal ADD (pre) is entered. Based on the input external address signal, internal address signal ATD (int1) is generated. Based on address ATD (int1), redundancy repair judgement is made to generate redundancy judgement result Red-OUT, and final address ATD (int2) in which the redundancy judgement result is reflected is generated. Successive operations from the enter of the external address signal to the generation of the final address signal are executed in response to each rising of the clock signal in the address pre-entrance mode regardless of activation of the command signal.

At time t1, row address strobe signal /RAS is also activated. A row-related operation is thus activated to raise a word line. The write latency of semiconductor memory device 4000 is set to 2 clock cycle. In order to activate the writing operation at time t2 with two clock cycles passed from time t1, write enable signal /WE is activated and simultaneously column address strobe signal /CS is activated.

The writing operation is thus designated by internal command signal CMD (int). Next at time t3, write data DQ (ext) is supplied to the input/output port.

In the fourth embodiment, semiconductor memory device 4000 is an SDRAM of the double data rate type and internally has the data conversion circuit. Therefore, it is possible to simultaneously process two data signals in one clock timing by converting serially input/output data from/to any external unit to parallel data internally.

In semiconductor memory device 4000, the column selecting operation is based on the burst operation, and a column signal for selecting a memory cell column to which data is written is incremented by the burst processing successively and thus generated internally. Based on the generated burst address, write data is processed in one clock cycle two bits by two bits in parallel with each other, and written via global data line GDL and bit line BL.

In the example shown in FIG. 39, the burst length is eight. The actual writing operation is started at time t4 by such operation. The write latency is defined as two clock cycles in semiconductor memory device 4000.

At the clock activation timing of time t8, an instruction on the reading operation is externally issued and the reading operation is designated by internal command signal CMD (int). Accordingly, internal control signal RD is activated. The burst processing is similarly carried out in the reading operation, the data read in parallel are converted by the data conversion circuit to serial data and supplied to any external unit via the input/output port.

The address signal is externally entered, redundancy judgement is made, and the final address signal is output at the timing which is exactly the same as that of the writing operation.

A difference in timing of each operation cycle between the normal address mode and the address pre-entrance mode is next described.

Figure 40:
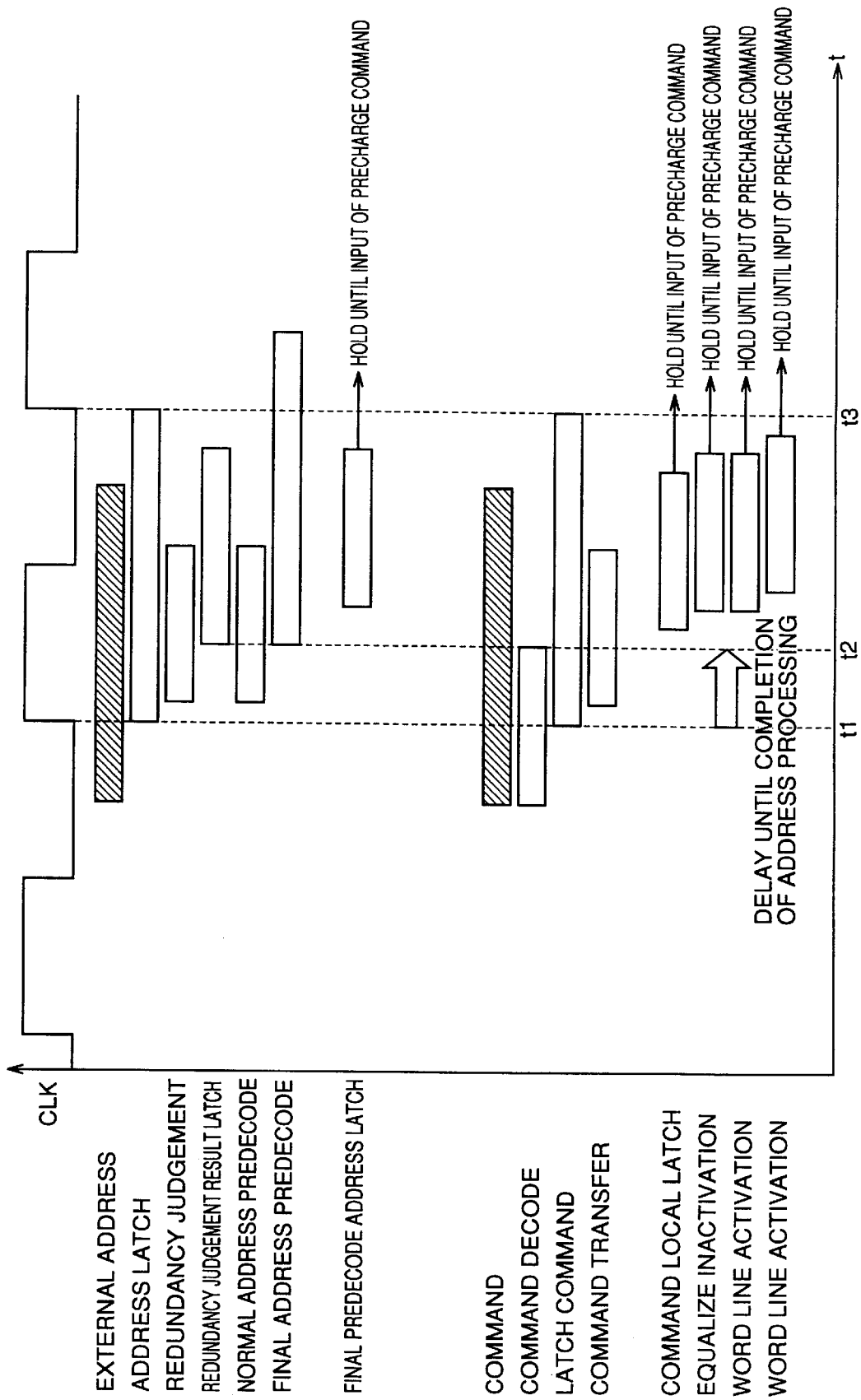
FIG. 40 is a timing chart illustrating a row address processing in the normal address mode.

FIG. 40 is a timing chart illustrating a column address process of a reading operation cycle in the normal address mode.

Referring to FIG. 40, in the normal address mode, at the time t1 at which the clock signal is activated, the external address signal and the command signal are simultaneously entered. The entered address signal is latched and redundancy judgement and predecode are executed, and redundancy judgement result and a final address predecode signal in which the redundancy judgement result is reflected are generated at time t2. The command signal is transmitted to the command decode circuit earlier than the activation timing of the clock signal. Therefore, at time t1, the command decoding operation is completed and the designated command is latched. However, the command cannot be started until the address processing is completed, and accordingly execution of the command is delayed by the delay circuit. In the normal address mode, the reading operation is actually started with any delay time for completion of the address processing due to inactivation of the equalize operation, activation of a word line and the like.

Figure 41:
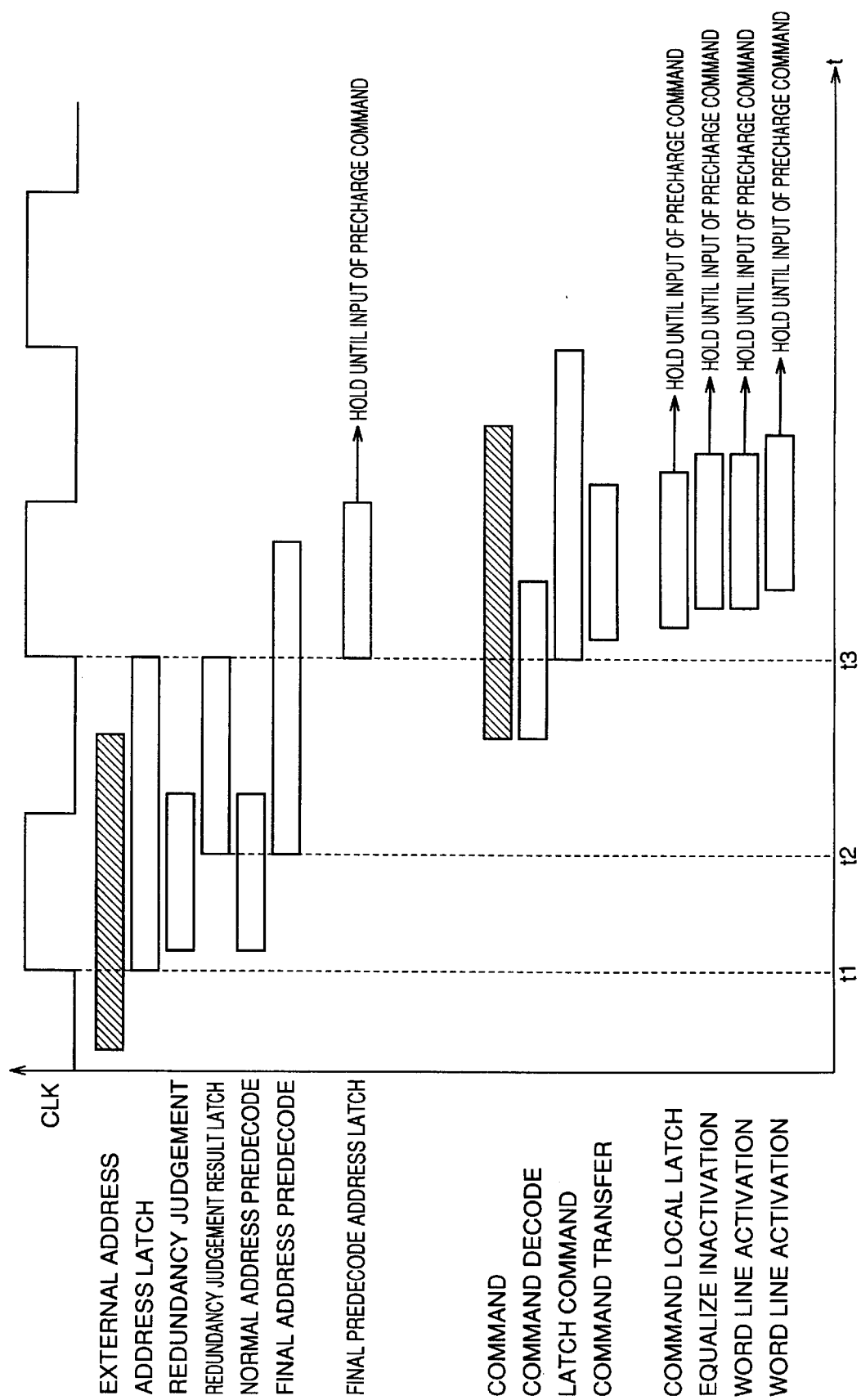
FIG. 41 is a timing chart illustrating a row address processing in the address pre-entrance mode.

FIG. 41 is a timing chart illustrating a reading operation cycle in the address pre-entrance mode.

Referring to FIG. 41, in the address pre-entrance mode, at time t1 one clock timing earlier than clock activation timing t3 at which the command signal is entered, an external address signal is entered and latched.

Accordingly, redundancy judgment and the predecode operation of the final address can be started. Therefore, redundancy judgement result and the final address predecode signal can be obtained prior to time t3. The result is latched and an internal command is generated by the command decode circuit at time t3. The command is latched and simultaneously the actual command operation such as inactivation of the equalize operation and activation of the word line can be started.

In the address pre-entrance mode, the higher speed operation is possible since the command operation can be started earlier by the time required for the address processing in the normal address mode.

Figure 42:
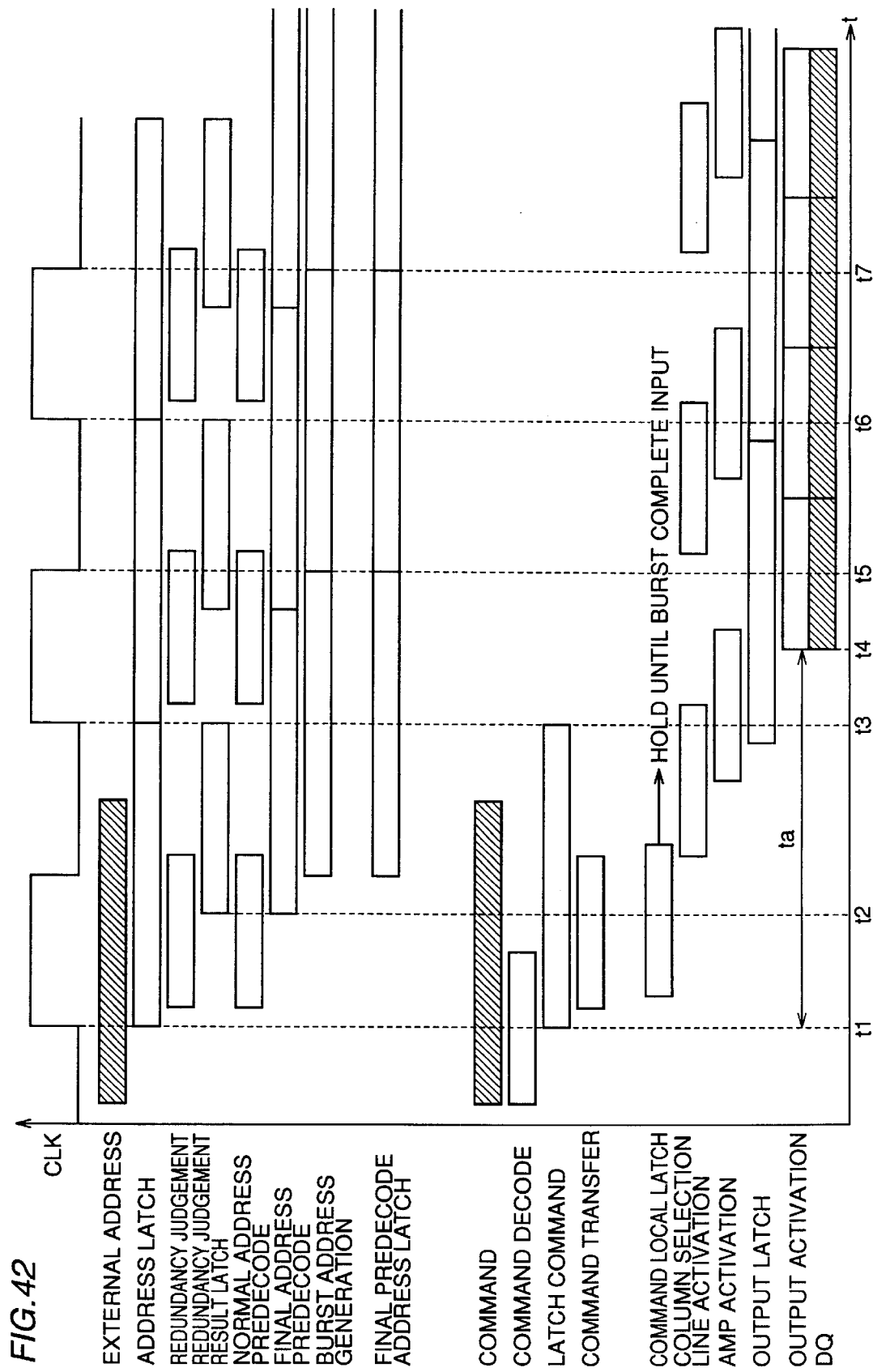
FIG. 42 is a timing chart illustrating a column address processing in a reading operation in the normal address mode.

FIG. 42 is a timing chart illustrating column address processing related to the reading operation in the normal address mode.

Referring to FIG. 42, an external address and a command signal are entered and latched at time t1. Based on the latched address signal, redundancy judgement and predecoding of the address are performed. At time t2, redundancy judgement result and a final address predecode signal in which the redundancy judgement result is reflected are obtained. In response to generation of the final address predecode signal, a column selection line and an amplifier are activated, a read signal is output to the memory cell and latched therein. At time t4, the read data is supplied to any external unit from the input/output port.

After time t5, burst addresses are successively generated by using the final address predecode signal which is generated based on the external address signal entered at time t1, and the reading operation is carried out based on the burst address generation. Specifically, at each block activation timing, the burst address is newly generated. Read data can successively be obtained by successively activating a column selection line and activating an amplifier corresponding to each burst address.

The time required to input a command signal and output read data is "ta" in the normal address mode.

Figure 43:
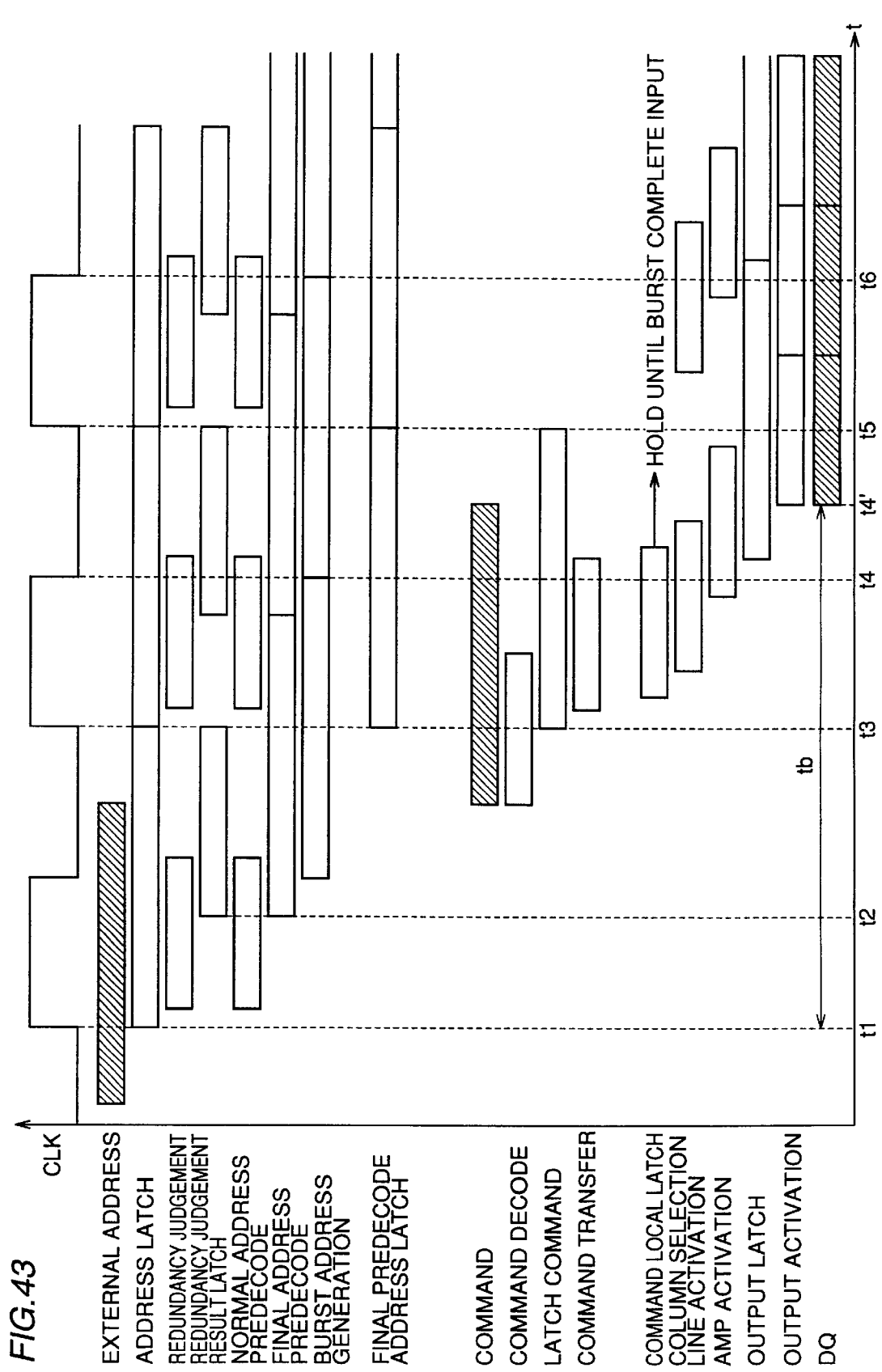
FIG. 43 is a timing chart illustrating a column address processing in a reading operation in the address pre-entrance mode.

FIG. 43 is a timing chart illustrating column address processing in the reading operation in the address pre-entrance mode.

Referring to FIG. 43, in the address pre-entrance mode, regardless of activation of the command signal, an external address signal is entered at each clock signal rise time. Therefore, even at time t1 at which the command signal is not activated, the external address signal is entered and latched. Redundancy judgement and address predecode are carried out based on the latched address, and a final address predecode signal in which the redundancy judgement result is reflected has already been obtained at time t2.

At time t3 corresponding to the clock signal rise timing, the command signal has already been activated so that the command signal is entered in the command decode circuit and used as a latch command to designate a reading operation. The reading operation is thus commanded and a column selection line corresponding to the generated final address is activated and thus data is read. The read data is activated by the amplifier and transmitted to an output latch, and transmitted to the input/output port at time t4'.

The time required to generate a command and actually read data is "tb" in the address pre-entrance mode, and accordingly the time can be reduced by one clock cycle compared with data read time "ta" described with reference to FIG. 40.

Figure 44:
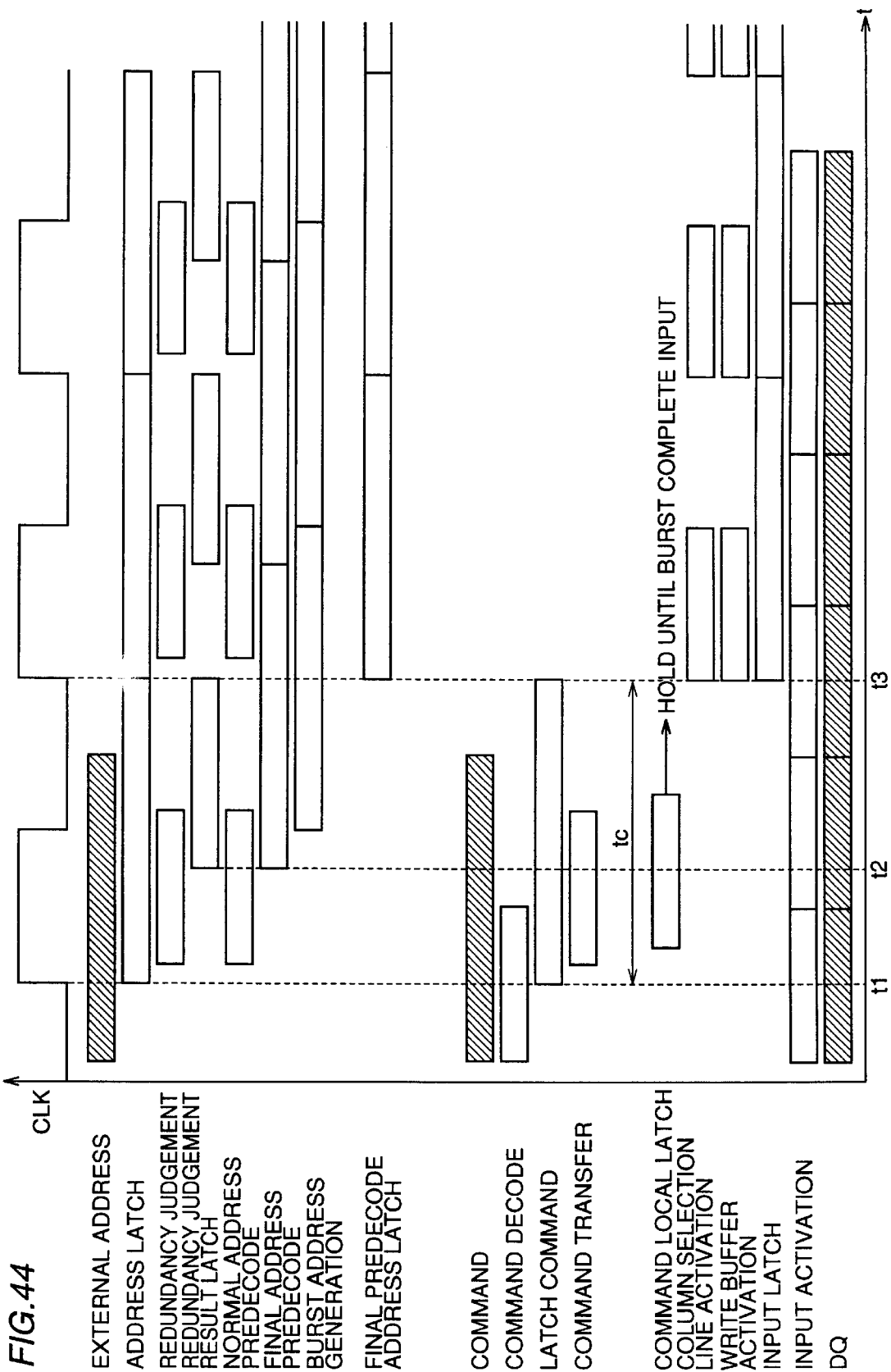
FIG. 44 is a timing chart illustrating a column address processing in a writing operation in the normal address mode.

FIG. 44 is a timing chart illustrating column address processing in the writing operation in the normal address mode.

Referring to FIG. 44, at time t1 corresponding to the clock activation timing, an external address signal and a command signal are entered. At time t2, redundancy judgement result is latched based on the entered external address signal, and a final address predecode signal is generated and latched. In the normal address mode, the write command decoded at time t1 is latched until time t3. At time t3, an actual writing operation such as activation of a column selection line corresponding to the final address predecode signal is started.

Specifically, the time required to enter the command signal and start the actual writing operation is "tc."

The write command latched at the time t1 is held until burst completion input in a command local latch. Burst addresses are successively activated based on an address corresponding to the final address predecode signal generated at time t2. The writing operation starting at t3 is performed according to the burst addresses.

FIG. 45 is a timing chart illustrating column address processing in the writing operation in the address pre-entrance mode.

Referring to FIG. 45, in the address pre-entrance mode, prior to activation of a command signal, an external address signal is entered at time t1 corresponding to the clock activation timing. Based on this, redundancy judgement result is latched and a final address predecode signal is generated at time t2 earlier than time t3 at which the command signal is entered.

The time required to externally supply the command signal and start the actual writing operation is "td." The operation speed can thus be enhanced by decreasing the time required from input of the command signal to start of the writing operation, compared with the normal address mode illustrated in FIG. 44.

In the address pre-entrance mode, regardless of activation of the command signal, the address signal is entered at each clock signal activation timing. The address signal is thus input before input of the command signal substantially one clock cycle earlier. Redundancy judgement can be made and the final address in which the redundancy judgement result is reflected can be achieved in advance. The operation speed can thus be enhanced since the timing at which the reading and writing operations are started can be made earlier compared with the normal address mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:

a logic circuit generating a clock signal, an address signal and a command signal to transmit and receive a data signal; and a memory circuit in response to activation of said command signal to perform reading and writing operations for said data signal according to said address signal, said memory circuit including:

a) a memory cell array having a plurality of normal memory cells arranged in rows and columns;

b) a redundant circuit for replacing a normal memory cell having a defect;

c) an address decode circuit in response to activation of said clock signal generating an address decode signal for selectively activating one of rows and one of columns of said normal memory cells corresponding to said address signal;

d) a redundancy control circuit in response to activation of said clock signal making a redundancy-based judgement for issuing an instruction to perform a redundancy-based repair operation if said address signal is associated with an address of said normal memory cell having the defect;

e) a redundant decode circuit in response to result of said redundancy-based judgement for performing said redundancy-based repair operation; and f) an address latch circuit latching, in response to preceding activation of said clock signal before said command signal is activated, said address signal transmitted from said logic circuit, and transmitting said address signal to said address decode circuit and said redundancy control circuit.

2. The semiconductor integrated circuit device according to claim 1, wherein said memory cell array is divided into a plurality of memory cell blocks arranged in a first number of rows and a second number of columns, said address signal includes a row address signal for selecting one of rows of said normal memory cells and a column address signal for selecting one of columns of said normal memory cells, said redundant circuit has a plurality of spare column circuits each provided in common to said memory cell blocks equal in number to said second number and adjacent to each other in a row direction, each of said spare column circuits has spare memory cells arranged in rows and columns, said memory circuit further includes:

a third number of global data buses for transmitting said data signal to said logic circuit; and a plurality of data I/O lines for transmitting said data signal, said plurality of data I/O lines include normal data I/O lines equal in number to said third number. said normal data lines arranged commonly to said memory cell blocks equal in number to said first number and adjacent to each other in a column direction, each of said normal data I/O lines being provided to a fourth number of columns of said normal memory cells, said data I/O lines further have a plurality of spare column data I/O lines provided commonly to spare column circuits and provided to said spare memory cell columns equal in number to said fourth number, and said memory circuit further includes a data line connection circuit connecting said data I/O lines equal in number to said third number selected from said plurality of data I/O lines with said third number of global data buses respectively under control by said redundancy control circuit.

3. The semiconductor integrated circuit device according to claim 2, wherein said normal data I/O lines include:

normal read data lines for transmitting stored data in said reading operation; normal write data lines for transmitting stored data in said writing operation, and each of said spare column data I/O lines includes:

spare column read data line for transmitting stored data in said reading operation; and spare column write data lines for transmitting stored data in said writing operation.

4. The semiconductor integrated circuit device according to claim 2, wherein said memory cell array is divided into banks equal in number to said first number, in which said reading operation and said writing operation can independently be performed, and each of said banks includes said memory cell blocks equal in number to said second number and adjacent to each other in the row direction.

5. The semiconductor integrated circuit device according to claim 1, wherein said logic circuit includes:

a self test circuit generating said command signal and said address signal for performing a predetermined test operation if a first test mode is selected in which an access from said logic circuit causes a test operation, a plurality of external test terminals receiving said command signal and said address signal if a second test mode is selected in which an access externally made directly to said memory circuit causes a test operation, a test mode signal input terminal receiving a test mode control signal designating any one of said first test mode and said second test mode in a test operation, and a signal switching circuit for transmitting any one set of said address signal and said command signal to said memory circuit according to said test mode control signal.

6. A semiconductor memory device operating synchronously with a clock signal to transmit and receive a data signal in response to an address signal and a command signal, comprising:

an input terminal receiving said clock signal, said address signal, said command signal, and an address mode signal designating a timing at which the address signal is entered;

a mode decode circuit in response to said address mode signal to determine said timing at which the address signal is entered as either one of a first address mode and a second address mode;

an address latch circuit receiving and latching said address signal from said input terminal at a timing at which said clock signal is activated if said first address mode is designated, and receiving and latching said address signal from said input terminal at the timing at which said clock signal is activated while said command signal is activated if said second address mode is designated;

a memory cell array having a plurality of normal memory cells arranged in rows and columns;

a redundant circuit having a plurality of spare memory cell rows and spare memory cell columns for replacing a normal memory cell having a defect;

a redundancy control circuit receiving said address signal transmitted from said address latch circuit to make a redundancy-based judgement for issuing an instruction to perform a redundancy-based repair operation if said address signal is associated with an address of said normal memory cell having the defect;

an address decode circuit in response to said address signal transmitted from said address latch circuit to generate an address decode signal for selectively activating one of rows of said normal memory cells and one of columns of said normal memory cells;

a redundant decode circuit in response to activation of said clock signal to selectively activate one of said spare memory cell rows and said spare memory cell columns if said redundancy-based repair operation is performed; and a drive circuit in response to activation of said clock signal to selectively activate one of rows and one of columns of said normal memory cells corresponding to said address decode signal.

7. The semiconductor memory device according to claim 6, wherein said mode decode circuit generates an address enter mode signal for designating either one of said first address mode and said second address mode, said semiconductor memory device further comprises a latch trigger generation circuit receiving said clock signal, said command signal and said address enter mode signal to generate an address enter trigger signal, said latch trigger generation circuit includes:

a clock switching circuit receiving said clock signal and said command signal to output said clock signal if said command signal is activated; and a multiplexer circuit in response to said address enter mode signal to output either one of said clock signal and an output of said clock switching circuit as said address enter trigger signal, and said address signal is entered from said input terminal to said address latch circuit in response to activation of said address enter trigger signal.

8. The semiconductor memory device according to claim 6, further comprising:

a command decode circuit receiving said command signal from said input terminal to generate an internal command signal;

an internal clock generation circuit receiving said clock signal from said input terminal to generate an internal clock signal;

a first register circuit transmitting said address signal from said input terminal to said address latch circuit synchronously with said internal clock signal; and a second register circuit transmitting said address decode signal from said address decode circuit to said drive circuit synchronously with said internal clock signal;

wherein said internal clock generation circuit stops supply of the internal clock signal to said second register circuit for directly connecting said address decode circuit with said drive circuit if said second address mode is designated.

9. The semiconductor memory device according to claim 8, further comprising:

a third register circuit transmitting said internal command signal from said command decode circuit to said drive circuit synchronously with said internal clock signal.

10. The semiconductor memory device according to claim 6, wherein:

if said first address mode is designated, then said address latch circuit is configured to receive and latch said address signal from said input terminal at said timing at which said clock signal is activated regardless of activation of said command signal.

11. A semiconductor memory device operating synchronously with a clock signal to read or write a data signal in response to a row address signal and a column address signal, comprising:

a) a memory cell array having normal memory cells arranged in rows and columns said memory cell array divided into a plurality of memory cell blocks arranged in a first number of rows and a second number of columns:

b) a redundant circuit having spare memory cell rows and spare memory cell columns for replacing a normal memory cell having a defect, said redundant circuit having a plurality of spare column circuits each provided to each row of said memory cell blocks and each of said spare column circuits having a plurality of spare memory cells arranged in rows and columns;

c) a third number of global data buses and a plurality of data I/O lines for transmitting said data signal, said plurality of data I/O lines having normal data I/O lines equal in number to said third number and provided to each memory cell block group formed of said memory cell blocks equal in number to said first number and adjacent to each other in a column direction each of said normal data I/O lines provided to a fourth number of columns of said normal memory cells, and said plurality of data I/O lines further having a plurality of spare column data I/O lines provided commonly to said spare column circuits and provided for columns equal in number to said fourth number of said spare memory cells;

d) a redundancy control circuit receiving said address signal to make a redundancy-based judgement for issuing an instruction to perform a redundancy-based repair operation if said address signal is associated with an address of said normal memory cell having the defect, and designating a manner in which said data I/O lines are connected in said redundancy-based repair operation, said data line switch signals including shift set signals and redundant column switch signals; and e) a data line connection circuit provided to each said memory cell block group for connecting said data I/O lines equal in number to said third number selected from said plurality of data I/O lines selectively with said third number of global data buses respectively under control by said redundancy control circuit, said data line connection circuit including:

a normal data line shift circuit in response to said shift set signals to connect (L−M) (M: integer of 0 to L) normal data I/O lines except for M normal data I/O lines corresponding to normal memory cells having said defects respectively with first to (L−M) th global data buses, and a spare column data line switching circuit in response to said redundant column switch signals to connect (L−M+1) th to L-th global data buses respectively with M of said spare column data I/O lines when M exceeds zero.

12. The semiconductor memory device according to claim 11, wherein the number of said spare column data I/O lines is N (N: natural number), said normal data line shift circuit includes N shift unit circuits connected in series for transmitting data from said normal data I/O lines to said global data buses, each of said shift unit circuits includes:

L input nodes;

first to L-th shift switches provided respectively associated with said input nodes; and L output nodes connected respectively with said input nodes via said shift switches, wherein the first to the L-th shift switches except for the i-th shift switch (i: natural number of 1 to L) connect the first to the L-th input nodes except for the i-th input node respectively with the first to the (L−1) th output nodes, and the i-th switch is in a disconnecting state when the i-th switch is designated to be skipped over by said shift set signals, the input nodes of the first shift unit circuit are connected respectively with said normal data I/O lines and the output nodes of the N-th shift unit circuit are respectively connected with said global data buses, said spare column data line switching circuit includes spare column connection units provided respectively to N spare column data I/O lines, and each of said spare column connection units selectively connects a corresponding one of said spare column data I/O lines with one of the (L−N+1) th to the L-th global data buses in response to said redundant column switch signals.

13. The semiconductor memory device according to claim 11, wherein said memory cell array is divided into banks equal in number to said first number in which the data signal can be read and written independently, and each of said banks includes said memory cell blocks equal in number to said second number and adjacent to each other in the row direction.

14. The semiconductor memory device according to claim 11, wherein rows of said normal memory cells are divided into a plurality of row groups, said redundancy control circuit includes a defective address programming circuit storing information on said normal memory cells having the defects in a non-volatile manner, said defective address programming circuit includes redundancy judgement sets each for storing a defective row address, a defective column address and the levels of said data line switch signals in the non-volatile manner, and each of said redundancy judgement sets is activated if said row address signal and said defective row address belong to the same row group and transmits said defective column address and said data line switch signals to said redundancy control circuit.

15. The semiconductor memory device according to claim 11, wherein said normal memory cells are divided into a plurality of banks, said redundancy control circuit includes a defective address programming circuit storing information on said normal memory cells having the defects in a non-volatile manner, said defective address programming circuit includes redundancy judgement sets each for storing a defective bank address, a defective column address and the levels of said data line switch signals in the non-volatile manner, and each of said redundancy judgement sets is activated if a bank corresponding to said row address signal and said defective bank address belong to the same bank and transmits said defective column address and the stored levels of said data line switch signals to said redundancy control circuit, said redundancy control circuit includes:

data line switch signal generation units provided to respective banks for generating said data line switch signals when redundancy-based column repair is performed; and a data distribution circuit for transferring said defective column address and said data line switch signals supplied from the activated redundancy judgement set to corresponding one of said data line switch signal generation units, each of said data line switch signal generation units includes:

a plurality of defective column address latch circuit each provided for said redundancy judgement set and latching said defective column address transmitted from the activated redundancy judgement set;

a plurality of column address comparison circuits each provided for said defective column address latch circuit and comparing said column address signal with said defective column address;

a first multiplexer circuit in response to result of comparison by said column address comparison circuit to selectively read one of said data line switch signals corresponding to a defective column address which matches with said column address signal from said data line switch signals transferred by said data distribution circuit;

a read data line switch signal latch circuit holding an output of said first multiplexer circuit for a first predetermined time;

a write data line switch signal latch circuit holding an output of said first multiplexer circuit for a second predetermined time; and a second multiplexer circuit outputting an output of said read data line switch signal latch circuit as said data line switch signals if a reading operation is designated, and outputting an output of said write data line switch signal latch circuit as said data line switch signals if a writing operation is designated.

* * * * *